United States Patent
Hagihara

(10) Patent No.: US 10,154,218 B2
(45) Date of Patent: Dec. 11, 2018

(54) ENCODING CIRCUIT, AD CONVERSION CIRCUIT, IMAGING DEVICE, AND IMAGING SYSTEM INCLUDING A DELAY CIRCUITS HAVING OPPOSITE POLARITY OUTPUT TERMINALS

(71) Applicant: OLYMPUS CORPORATION, Hachioji-shi, Tokyo (JP)

(72) Inventor: Yoshio Hagihara, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 0 days.

(21) Appl. No.: 15/455,270

(22) Filed: Mar. 10, 2017

(65) Prior Publication Data
US 2017/0187978 A1   Jun. 29, 2017

Related U.S. Application Data

(63) Continuation of application No. PCT/JP2014/075210, filed on Sep. 24, 2014.

(51) Int. Cl.
*H04N 5/376* (2011.01)
*H03M 1/56* (2006.01)
(Continued)

(52) U.S. Cl.
CPC ....... *H04N 5/3765* (2013.01); *H03K 5/15066* (2013.01); *H03M 1/20* (2013.01);
(Continued)

(58) Field of Classification Search
CPC ..... H04N 5/3765; H04N 5/3745; H03M 7/30; H03M 1/20; H03K 5/15066
See application file for complete search history.

(56) References Cited

U.S. PATENT DOCUMENTS

| 8,558,729 B2 * | 10/2013 | Tanaka | H04N 5/378 341/155 |
| 2011/0186713 A1 * | 8/2011 | Hagihara | H04N 5/3355 250/208.1 |

(Continued)

FOREIGN PATENT DOCUMENTS

| JP | 2011-55196 A | 3/2011 |
| JP | 2013-110683 A | 6/2013 |

(Continued)

OTHER PUBLICATIONS

Interntional Search Report dated Dec. 22, 2014, issued in counterpart International Application No. PCT/JP2014/075210. English Translation (2 pages).

*Primary Examiner* — Gevell Selby
(74) *Attorney, Agent, or Firm* — Westerman, Hattori, Daniels & Adrian, LLP

(57) ABSTRACT

An encoding circuit includes a clock generating unit having a delay circuit in which n (n is a power of 2) delay units are connected together a latch unit configured to latch the plurality of delayed signals; and an encoding unit configured to encode state of each of the plurality of delayed signals, wherein the encoding unit encodes the state of each of the plurality of delayed signals by performing: a first operation of determining a position at which logic states of two or more delayed signals in a signal group change from High to Low, a second operation of determining a position at which logic states of two or more delayed signals in the signal group change from Low to High, and a third operation of determining that logic states of two or more signals including at least one delayed signal in the signal group are predetermined states.

6 Claims, 42 Drawing Sheets

(51) Int. Cl.
  *H04N 5/378* (2011.01)
  *H03K 5/15* (2006.01)
  *H03M 1/20* (2006.01)
  *H03M 7/30* (2006.01)
  *H04N 5/374* (2011.01)
  *H04N 5/3745* (2011.01)
  *H03M 1/12* (2006.01)
  *H03M 1/50* (2006.01)

(52) U.S. Cl.
  CPC ............... *H03M 1/56* (2013.01); *H03M 7/30* (2013.01); *H04N 5/378* (2013.01); *H04N 5/3745* (2013.01); *H03M 1/123* (2013.01); *H03M 1/502* (2013.01)

(56) References Cited

U.S. PATENT DOCUMENTS

| | | | |
|---|---|---|---|
| 2013/0134296 A1 | 5/2013 | Hagihara | |
| 2013/0208160 A1* | 8/2013 | Tanaka | H04N 5/374 348/302 |
| 2013/0327925 A1* | 12/2013 | Hagihara | H04N 5/3355 250/208.1 |

FOREIGN PATENT DOCUMENTS

| | | |
|---|---|---|
| JP | 2014-64059 A | 4/2014 |
| WO | 2012/043225 A1 | 4/2012 |

* cited by examiner

ENCODING CIRCUIT, AD CONVERSION CIRCUIT, IMAGING DEVICE, AND IMAGING SYSTEM INCLUDING A DELAY CIRCUITS HAVING OPPOSITE POLARITY OUTPUT TERMINALS

This application is a continuation application based on a PCT International Application No. PCT/JP2014/075210 filed on Sep. 24, 2014, the content of which is incorporated herein by reference.

BACKGROUND OF THE INVENTION

Field of the Invention

The present invention relates to an encoding circuit, an analog-to-digital (AD) conversion circuit, an imaging device, and an imaging system.

Description of Related Art

A so-called column analog-to-digital conversion (ADC) type solid state imaging device having an AD conversion function embedded in a column unit has been developed and commercialized. As one of the AD conversion schemes for implementing the AD conversion function, a single slope (SS) type AD conversion scheme is known. In the SS type AD conversion scheme, a voltage of a reference signal called a ramp wave that changes stepwise is compared with the voltage of a signal to be subjected to AD conversion. Thereby, a time interval (time axis magnitude/pulse width) corresponding to the signal voltage is generated. The AD conversion is performed by measuring the time interval with a reference clock.

A time-to-digital converter (tdc) SS type AD conversion scheme in which the reference clock of the single slope type AD conversion scheme has phase information to further improve the accuracy of AD conversion has been proposed. For example, a configuration using the tdc SS type AD conversion scheme is disclosed in Japanese Unexamined Patent Application, First Publication No. 2011-55196 and Japanese Unexamined Patent Application, First Publication No. 2014-64059. In this scheme, a time interval is measured using a reference clock and a plurality of clocks (multiphase clocks) having different phases compared with the reference clock. If this scheme is used, for example, the resolution is increased by 1 bit if there are 2 pieces of phase information. Likewise, for example, the resolution is increased by 2 bits if there are 4 pieces of phase information. Likewise, for example, the resolution is increased by 4 bits if there are 16 pieces of phase information. It is possible to increase the resolution by increasing the phase information. The phase information does not linearly increase in accordance with the increase in the resolution, but increases exponentially. In the column ADC type solid state imaging device using the tdc SS type AD conversion scheme, a latch circuit for latching the phase information of the multiphase clock is embedded in the column unit.

FIG. 37 shows a configuration of an encoding circuit in a tdc SS type AD conversion circuit of a first conventional example. The encoding circuit 1010a shown in FIG. 37 includes a clock generating unit 1018a, a latch unit 1108a, a counting unit 1101, and an encoding unit 1106a.

The clock generating unit 1018a has a delay circuit 1100a in which a plurality of fully-differential delay circuits DE1 to DE8 are connected in a ring shape. The clock generating unit 1018a outputs a plurality of lower phase signals (lower phase signals CK1 to CK8 and lower phase signals xCK1 to xCK8) according to the output signals of the plurality of fully-differential delay circuits DE1 to DE8. The lower phase signals CK1 to CK8 and the lower phase signals xCK1 to xCK8 are clocks whose logic states change periodically. The lower phase signals xCK1 to xCK8 are signals obtained by inverting the lower phase signals CK1 to CK8. That is, the logic states of the lower phase signals xCK1 to xCK8 are opposite to the logic states of the lower phase signals CK1 to CK8.

The fully-differential delay circuits DE1 to DE8 have a first input terminal (+), a second input terminal (−), a first output terminal (+), a second output terminal (−), a first power supply terminal, and a second power supply terminal. The first input terminal (+) of the fully-differential delay circuit DE1 is connected to the first output terminal (+) of the fully-differential delay circuit DE8. The second input terminal (−) of the fully-differential delay circuit DE1 is connected to the second output terminal (−) of the fully-differential delay circuit DE8. The first input terminals (+) of the fully-differential delay circuits DE2 to DE8 are connected to the second output terminals (−) of the fully-differential delay circuits DE1 to DE7 of the previous stage, respectively. The second input terminals (−) of the fully-differential delay circuits DE2 to DE8 are connected to the first output terminals (+) of the fully-differential delay circuits DE1 to DE7 of the previous stage, respectively. Each of the fully-differential delay circuits DE1 to DE8 inverts the signal input to the first input terminal (+) and outputs the inverted signal from the second input terminal (−). Also, each of the fully-differential delay circuits DE1 to DE8 inverts the signal input to the second input terminal (−) and outputs the inverted signal from the first input terminal (+).

The signals output from the first output terminals (+) of the fully-differential delay circuits DE1 to DE8 are input to the latch unit 1108a as the lower phase signals CK1 to CK8. The signals output from the second output terminals (−) of the fully-differential delay circuits DE1 to DE8 are input to the latch unit 1108a as the lower phase signals xCK1 to xCK8. The fully-differential delay circuit DE1 further has a pulse input terminal. A start pulse StartP is input to the pulse input terminal of the fully-differential delay circuit DE1.

A power supply voltage VDD is applied to the first power supply terminals of the fully-differential delay circuits DE1 to DE8. A ground voltage GND is applied to the second power supply terminals of the fully-differential delay circuits DE1 to DE8. Each of the fully-differential delay circuits DE1 to DE8 applies a delay according to the difference between the voltages applied to the first power supply terminal and the second power supply terminal to the input signal. Each of the fully-differential delay circuits DE1 to DE8 generates output signals by delaying the input signals of the first input terminal (+) and the second input terminal (−). That is, each of the fully-differential delay circuits DE1 to DE8 generates a first output signal corresponding to a first input signal of the first input terminal (+) and a second output signal corresponding to a second input signal of the second input terminal (−). The second output signal is a signal obtained by inverting the first output signal.

The latch unit 1108a latches a plurality of lower phase signals (the lower phase signals CK1 to CK8 and the lower phase signals xCK1 to xCK8) output from the clock generating unit 1018a at the timing at which a control signal CO is input.

The counting unit 1101 performs a count operation on the basis of any one of the plurality of lower phase signals (the lower phase signals CK1 to CK8 and the lower phase signals xCK1 to xCK8). For example, the counting unit 1101 performs a count operation using the lower phase signal xCK8 output through the latch unit 1108a as a count clock.

For example, the counting unit 1101 performs a count operation at the falling edge of the lower phase signal xCK8.

The encoding unit 1106*a* encodes states of the plurality of lower phase signals (the lower phase signals CK1 to CK8 and the lower phase signals xCK1 to xCK8) latched by the latch unit 1108*a*. Thereby, the encoding unit 1106*a* obtains a binary number according to the states of the plurality of lower phase signals latched by the latch unit 1108*a*.

Next, the operation of the encoding circuit 1010*a* will be described. FIG. 38 shows the waveforms of the start pulse StartP, the lower phase signals CK1 to CK8, and the lower phase signals xCK1 to xCK8. In FIG. 38, the horizontal direction indicates time and the vertical direction indicates voltage.

When the logic state of the start pulse StartP changes from the L (Low) state to the H (High) state, the delay circuit 1100*a* starts the transition operation. In this transition operation, the logic states of the signals output from the fully-differential delay circuits DE1 to DE8 constituting the delay circuit 1100*a* sequentially change. The counting unit 1101 starts a count operation simultaneously when the delay circuit 1100*a* starts the transition operation. Simultaneously with the start of the transition operation by the delay circuit 1100*a*, a reference signal generating unit (not shown) starts the generation of a reference signal (ramp wave). The level of the reference signal generated by the reference signal generating unit monotonically increases or decreases with the passage of time.

An analog signal to be subjected to AD conversion and a reference signal are input to a comparing unit (not shown). At the same time, the lower phase signals CK1 to CK8 and the lower phase signals xCK1 to xCK8 are input to the latch unit 1108*a*. The lower phase signal xCK8 is input to the counting unit 1101 through the latch unit 1108*a*. The comparing unit performs a comparison process of comparing the analog signal to be subjected to AD conversion with the reference signal. The comparing unit completes the comparison process at the timing at which the reference signal satisfies a predetermined condition with respect to the analog signal, and outputs the control signal CO at that timing. Specifically, when the magnitude relation between the two signals input to the comparing unit is switched, the control signal CO is inverted.

At this time, the latch unit 1108*a* latches the logic states of the lower phase signals CK1 to CK8 and the lower phase signals xCK1 to xCK8. Further, the counting unit 1101 latches the count value (a higher count value). The lower phase signals CK1 to CK8 and the lower phase signals xCK1 to xCK8 latched by the latch unit 1108*a* are encoded by the encoding unit 1106*a* (binary conversion). Thereby, lower data of the digital data is obtained. A higher count value latched by the counting unit 1101 constitutes higher data of the digital data. By combining the lower data and the higher data, digital data corresponding to the level of the analog signal can be obtained.

For example, as shown in FIG. 38, the states of the plurality of lower phase signals (the lower phase signals CK1 to CK8 and the lower phase signals xCK1 to xCK8) latched by the latch unit 1108*a* (combinations of the logic states of the plurality of lower phase signals) are states 0 to 15. If the counting unit 1101 performs a count operation at the falling edge of the lower phase signal xCK8, the combinations of the logic states of the plurality of lower phase signals in periods obtained by dividing a period in which the counting unit 1101 performs one count operation (a period from the falling edge of the lower phase signal xCK8 to the next falling edge) into 16 equal parts correspond to states 0 to 15. States 0 to 15 correspond to encoded values 0 to 15 which are encoding results.

FIG. 39 shows a configuration of the encoding circuit 1010*b* in the tdc SS type AD conversion circuit of a second conventional example. The encoding circuit 1010*b* shown in FIG. 39 includes a clock generating unit 1018*b*, a latch unit 1108*b*, a counting unit 1101, and an encoding unit 1106*b*.

Differences of the configuration shown in FIG. 39 from the configuration shown in FIG. 37 will be described. The clock generating unit 1018*b* includes a delay circuit 1100*b* in which a plurality of fully-differential delay circuits DE1 to DE8 are connected in a ring shape. The clock generating unit 1018*b* outputs a plurality of lower phase signals (lower phase signals CK2, CK4, CK6, and CK8 and lower phase signals xCK2, xCK4, xCK6, and xCK8) according to output signals of the plurality of fully-differential delay circuits DE1 to DE8.

The lower phase signal generated by the clock generating unit 1018*b* is the same as the lower phase signal generated by the clock generating unit 1018*a* shown in FIG. 37. That is, the clock generating unit 1018*b* generates the lower phase signals CK1 to CK8 and the lower phase signals xCK1 to xCK8. The clock generating unit 1018*b* outputs only some of the plurality of generated lower phase signals (the lower phase signals CK1 to CK8 and the lower phase signals xCK1 to xCK8) for latching by the latch unit 1108*b*.

The latch unit 1108*b* latches the plurality of lower phase signals (the lower phase signals CK2, CK4, CK6, and CK8 and the lower phase signals xCK2, xCK4, xCK6, and xCK8) output from the clock generating unit 1018*b* at a timing at which the control signal CO is input.

The encoding unit 1106*b* encodes states of the plurality of lower phase signals (the lower phase signals CK2, CK4, CK6, CK8 and lower phase signals xCK2, xCK4, xCK6, and xCK8) latched by the latch unit 1108*b*. Thereby, the encoding unit 1106*b* obtains a binary number according to the states of the plurality of lower phase signals latched by the latch unit 1108*b*.

The configuration shown in FIG. 39 is substantially the same as that shown in FIG. 37 except for the above points.

The operation of the encoding circuit 1010*b* shown in FIG. 39 is substantially the same as the operation of the encoding circuit 1010*a* shown in FIG. 37, except for the difference in the lower phase signal latched by the latch unit 1108*b*. FIG. 40 shows the waveforms of the start pulse StartP, the lower phase signals CK1 to CK8, and the lower phase signals xCK1 to xCK8. In FIG. 40, the horizontal direction indicates time and the vertical direction indicates voltage.

For example, as shown in FIG. 40, the states of the plurality of lower phase signals (the lower phase signals CK2, CK4, CK6, and CK8 and the lower phase signals xCK2, xCK4, xCK6, and xCK8) latched by the latch unit 1108*b* (combinations of the logic states of the plurality of lower phase signals) are states 0 to 7. When the counting unit 1101 performs a count operation at the falling edge of the lower phase signal xCK8, the combinations of the logic states of the plurality of lower phase signals in periods obtained by dividing a period in which the counting unit 1101 performs one count operation (a period from the falling edge of the lower phase signal xCK8 to the next falling edge) into 8 equal parts correspond to states 0 to 7. States 0 to 7 correspond to encoded values 0 to 7 which are encoding results.

When the AD conversion circuits of the first conventional example and the second conventional example are applied to the column ADC type solid state imaging device, the column ADC type solid state imaging device is configured as follows. The delay circuit 1100a or the delay circuit 1100b is arranged outside a column unit corresponding to the column of pixels. The comparing unit, the latch unit 1108a or the latch unit 1108b, the encoding unit 1106a or the encoding unit 1106b, and the counting unit 1101 are arranged inside the column unit. A pixel signal output from the pixel is input to the comparing unit as an analog signal to be subjected to AD conversion. When the control signal CO from the comparing unit is inverted, the plurality of lower phase signals from the delay circuit 1100a or the delay circuit 1100b are latched by the latch unit 1108a or the latch unit 1108b. The states of the plurality of lower phase signals latched by the latch unit 1108a or the latch unit 1108b are encoded by the encoding unit 1106a or the encoding unit 1106b. The encoded value and the count value of the counting unit 1101 are output as digital data of the AD conversion result.

However, the following encoding error may occur in the conventional encoding circuit and the AD conversion circuit using the encoding circuit. A similar encoding error may occur in the imaging device using the conventional AD conversion circuit and the imaging system using the imaging device.

In the encoding of a plurality of lower phase signals latched by the latch unit 1108a or the latch unit 1108b, a process of detecting a thermometer code (a predetermined logic state) used in the flash type AD conversion circuit is preferable. Further, it is preferable to perform this process in time series while changing the lower phase signal to be compared. In the thermometer code detection process, it is detected that the logic states of the two lower phase signals are predetermined states, for example, "10." "0" corresponds to the L state of the signal. "1" corresponds to the H state of the signal.

A procedure of encoding by the encoding circuit 1010a shown in FIG. 37 will be described. FIG. 41 shows the waveforms of the start pulse StartP, the lower phase signals CK1 to CK8, and the lower phase signals xCK1 to xCK8 in the encoding circuit 1010a. In FIG. 41, the horizontal direction indicates time and the vertical direction indicates voltage.

In FIG. 41, the lower phase signals CK1 to CK8 and the lower phase signals xCK1 to xCK8 shown in FIG. 38 are arranged to constitute a group of signals falling (changing from the H state to the L state) sequentially at predetermined time intervals. Specifically, the lower phase signals are arranged in the order of the lower phase signals xCK1, CK2, xCK3, CK4, xCK8, CK6, xCK7, CK8, CK1, xCK2, CK3, xCK4, CK5, xCK6, CK7, and xCK8.

As shown in FIG. 41, when a predetermined time (corresponding to the delay time for one of the fully-differential delay circuits DE1 to DE8) has elapsed from the change of the lower phase signal xCK1 from the H state to the L state, the phase signal CK2 changes from the H state to the L state. The lower phase signal xCK3 changes from the H state to the L state when a predetermined time has elapsed from the change of the lower phase signal CK2 from the H state to the L state. Thereafter, likewise, the lower phase signals CK4, xCK8, CK6, xCK7, CK8, CK1, xCK2, CK3, xCK4, CK8, xCK6, CK7, and xCK8 sequentially change from the H state to the L state.

In the signal group (signal string) in which the plurality of lower phase signals latched by the latch unit 1108a are arranged in the above-described order, the logic states of two continuous lower phase signals are sequentially detected. If it is detected that the logic states of two continuous lower phase signals are predetermined states (a thermometer code), the states of a plurality of lower phase signals are determined according to a position at which the states are detected.

For example, the position at which the logic state changes from the H state to the L state in the signal group is detected. The fact that the logic state changes from the H state to the L state is equivalent to the fact that a previous lower phase signal in the order of the lower phase signals constituting the signal group is the L state and the subsequent lower phase signal is the H state.

For example, the logic states of two continuous lower phase signals are sequentially detected from the bottom to the top of the signal group shown in FIG. 41. For example, in the case of state 7, in the signal group, the logic state changes from the H state to the L state between the lower phase signal CK8 and the lower phase signal xCK7. For the other states 0 to 6 and 8 to 15, the logic state changes from the H state to the L state between the two lower phase signals according to each state. That is, it is possible to determine states of a plurality of lower phase signals by detecting a position at which the logic states of the plurality of lower phase signals arranged as shown in FIG. 41 change.

Specifically, encoding is performed by performing the following processing of steps (1) to (16) in time series.

(Step (1)) . . . Determination related to state 15

The logic states of the lower phase signal xCK8 and the lower phase signal CK7 are compared. When there is a thermometer code at this position, the state of each of the plurality of lower phase signals is determined to be state 15.

(Step (2)) . . . Determination related to state 14

The logic states of the lower phase signal CK7 and the lower phase signal xCK6 are compared. When there is a thermometer code at this position, the state of each of the plurality of lower phase signals is determined to be state 14.

(Step (3)) . . . Determination related to state 13

The logic states of the lower phase signal xCK6 and the lower phase signal CK5 are compared. When there is a thermometer code at this position, the state of each of the plurality of lower phase signals is determined to be state 13.

(Step (4)) . . . Determination related to state 12

The logic states of the lower phase signal CK5 and the lower phase signal xCK4 are compared. When there is a thermometer code at this position, the state of each of the plurality of lower phase signals is determined to be state 12.

(Step (5)) . . . Determination related to state 11

The logic states of the lower phase signal xCK4 and the lower phase signal CK3 are compared. When there is a thermometer code at this position, the state of each of the plurality of lower phase signals is determined to be state 11.

(Step (6)) . . . Determination related to state 10

The logic states of the lower phase signal CK3 and the lower phase signal xCK2 are compared. When there is a thermometer code at this position, the state of each of the plurality of lower phase signals is determined to be state 10.

(Step (7)) . . . Determination related to state 9

The logic states of the lower phase signal xCK2 and the lower phase signal CK1 are compared. When there is a thermometer code at this position, the state of each of the plurality of lower phase signals is determined to be state 9.

(Step (8)) . . . Determination related to state 8

The logic states of the lower phase signal CK1 and the lower phase signal CK8 are compared. When there is a thermometer code at this position, the state of each of the plurality of lower phase signals is determined to be state 8.

(Step (9)) . . . Determination related to state 7

The logic states of the lower phase signal CK8 and the lower phase signal xCK7 are compared. When there is a thermometer code at this position, the state of each of the plurality of lower phase signals is determined to be state 7.

(Step (10)) . . . Determination related to state 6

The logic states of the lower phase signal xCK7 and the lower phase signal CK6 are compared. When there is a thermometer code at this position, the state of each of the plurality of lower phase signals is determined to be state 6.

(Step (11)) . . . Determination related to state 5

The logic states of the lower phase signal CK6 and the lower phase signal xCK8 are compared. When there is a thermometer code at this position, the state of each of the plurality of lower phase signals is determined to be state 5.

(Step (12)) . . . Determination related to state 4

The logic states of the lower phase signal xCK5 and the lower phase signal CK4 are compared. When there is a thermometer code at this position, the state of each of the plurality of lower phase signals is determined to be state 4.

(Step (13)) . . . Determination related to state 3

The logic states of the lower phase signal CK4 and the lower phase signal xCK3 are compared. When there is a thermometer code at this position, the state of each of the plurality of lower phase signals is determined to be state 3.

(Step (14)) . . . Determination related to state 2

The logic states of the lower phase signal xCK3 and the lower phase signal CK2 are compared. When there is a thermometer code at this position, the state of each of the plurality of lower phase signals is determined to be state 2.

(Step (15)) . . . Determination related to state 1

The logic states of the lower phase signal CK2 and the lower phase signal xCK1 are compared. When there is a thermometer code at this position, the state of each of the plurality of lower phase signals is determined to be state 1.

(Step (16)) . . . Determination related to state 0

The logic states of the lower phase signal xCK1 and the lower phase signal xCK8 are compared. When there is a thermometer code at this position, the state of each of the plurality of lower phase signals is determined to be state 0.

In steps (1) to (15), if it is determined that the state of each of the plurality of lower phase signals is not any of states 1 to 15, the state of each of the plurality of lower phase signals is state 0. Thus, step (16) is not particularly necessary.

A procedure of encoding by the encoding circuit 1010b shown in FIG. 39 will be described. FIG. 42 shows the waveforms of the start pulse StartP, the lower phase signals CK2, CK4, CK6, and CK8 and the lower phase signals xCK2, xCK4, xCK6, and xCK8 in the encoding circuit 1010b. In FIG. 42, the horizontal direction indicates time and the vertical direction indicates voltage.

In FIG. 42, the lower phase signals CK2, CK4, CK6, and CK8 and the lower phase signals xCK2, xCK4, xCK6, xCK8 shown in FIG. 40 are arranged to constitute a group of signals sequentially falling (changing from the H state to the L state) at predetermined time intervals. Specifically, the lower phase signals are arranged in the order of the lower phase signals CK2, CK4, CK6, CK8, xCK2, xCK4, xCK6, and xCK8.

As shown in FIG. 42, the phase signal CK4 changes from the H state to the L state when a predetermined time (corresponding to a delay time for two of the fully-differential delay circuits DE1 to DE8) has elapsed from the change of the lower phase signal CK2 from the H state to the L state. The lower phase signal CK6 changes from the H state to the L state when a predetermined time has elapsed from the change of the lower phase signal CK4 from the H state to the L state. Thereafter, likewise, the lower phase signals CK8, xCK2, xCK4, xCK6, and xCK8 sequentially change from the H state to the L state.

In the signal group (signal string) in which the plurality of lower phase signals latched by the latch unit 1108b are arranged in the above-described order, the logic states of two continuous lower phase signals are sequentially detected. When it is detected that the logic states of two continuous lower phase signals are predetermined states (thermometer codes), the states of a plurality of lower phase signals are determined according to a position at which the states are detected. For example, a position at which the logic state changes from the H state to the L state in the signal group is detected.

For example, the logic states of two continuous lower phase signals are sequentially detected from the bottom to the top of the signal group shown in FIG. 42. For example, in state 3, in the signal group, the logic state changes from the H state to the L state between the lower phase signal CK8 and the lower phase signal CK6. Also in the other states 0 to 2 and 4 to 7, the logic state changes from the H state to the L state between the two lower phase signals according to each state. That is, it is possible to determine the states of a plurality of lower phase signals by detecting a position at which the logic state of each of the plurality of lower phase signals arranged as shown in FIG. 42 changes.

Specifically, encoding is performed by performing the following steps (1) to (8) in time series.

(Step (1)) . . . Determination related to state 7

The logic states of the lower phase signal xCK8 and the lower phase signal xCK6 are compared. When there is a thermometer code at this position, the state of each of the plurality of lower phase signals is determined to be state 7.

(Step (2)) . . . Determination related to state 6

The logic states of the lower phase signal xCK6 and the lower phase signal xCK4 are compared. When there is a thermometer code at this position, the state of each of the plurality of lower phase signals is determined to be state 6.

(Step (3)) . . . Determination related to state 5

The logic states of the lower phase signal xCK4 and the lower phase signal xCK2 are compared. When there is a thermometer code at this position, the state of each of the plurality of lower phase signals is determined to be state 5.

(Step (4)) . . . Determination related to state 4

The logic states of the lower phase signal xCK2 and the lower phase signal CK8 are compared. When there is a thermometer code at this position, the state of each of the plurality of lower phase signals is determined to be state 4.

(Step (5)) . . . Determination related to state 3

The logic states of the lower phase signal CK8 and the lower phase signal CK6 are compared. When there is a thermometer code at this position, the state of each of the plurality of lower phase signals is determined to be state 3.

(Step (6)) . . . Determination related to state 2

The logic states of the lower phase signal CK6 and the lower phase signal CK4 are compared. When there is a thermometer code at this position, the state of each of the plurality of lower phase signals is determined to be state 2.

(Step (7)) . . . Determination related to state 1

The logic states of the lower phase signal CK4 and the lower phase signal CK2 are compared. When there is a thermometer code at this position, the state of each of the plurality of lower phase signals is determined to be state 1.

(Step (8)) . . . Determination related to state 0

The logic states of the lower phase signal CK2 and the lower phase signal xCK8 are compared. When there is a thermometer code at this position, the state of each of the plurality of lower phase signals is determined to be state 0.

In steps (1) to (7), if it is determined that the state of each of the plurality of lower phase signals is not any of states 1 to 7, the state of each of the plurality of lower phase signals is state 0. Thus, step (8) is not particularly necessary.

In the above-described encoding, the logic states of two lower phase signals are detected in time series on the basis of only one of the rising edge and the falling edge of the clock, which are the lower phase signals. Thus, even when the number of clocks generated by the clock generating unit 1018a or the clock generating unit 1018b is large, the circuit scale of the encoding circuit can be reduced and the configuration of the encoding circuit can be simplified.

However, if the tdc SS type AD conversion circuit using the delay circuit 1100a performs encoding by detecting the thermometer code, sixteen latch circuits for latching sixteen lower phase signals (the lower phase signals CK1 to CK8 and the lower phase signals xCK1 to xCK8) from the delay circuit 1100a are necessary in the latch unit 1108a. Thus, the circuit scale of the latch unit 1108a is increased. As a result, large drive capability is required for a latch control unit that controls the latch circuit.

When the drive capability of the latch control unit is not sufficient, it is difficult for the plurality of latch circuits to latch the phase information of the multi-phase clocks at substantially the same time. If a plurality of latch circuits do not latch the phase information of the multi-phase clocks at substantially the same time, an encoding error occurs. That is, AD conversion is not performed correctly.

Compared with the latch unit 1108a, the circuit scale of the latch unit 1108b is reduced. However, it is desirable to further reduce the circuit scale of the latch unit 1108b.

SUMMARY OF THE INVENTION

According to a first aspect of the present invention, an encoding circuit includes a clock generating unit having a delay circuit in which n (n is a power of 2 which is greater than or equal to 2) delay units are connected together, each of the n delay units generating an output signal by delaying an input signal, and the clock generating unit being configured to output a plurality of delayed signals according to a plurality of the output signals generated by the n delay units; a latch unit configured to latch the plurality of delayed signals at a timing at which a control signal is input; and an encoding unit configured to encode state of each of the plurality of delayed signals latched by the latch unit, wherein the encoding unit encodes the state of each of the plurality of delayed signals by performing: a first operation of detecting a position at which logic states of two or more delayed signals included in a signal group change from High to Low, the signal group being configured by at least two of the plurality of delayed signals latched by the latch unit and all the delayed signals included in the signal group being arranged in an order according to an order of connection of the plurality of delay units, a second operation of detecting a position at which logic states of two or more delayed signals included in the signal group change from Low to High, and a third operation of detecting that logic states of two or more signals including at least one delayed signal included in the signal group are predetermined states, the third operation being different from the first operation and the second operation.

According to a second aspect of the present invention, in the encoding circuit according to the first aspect, the third operation may be an operation of detecting whether logic states of a first signal and a second signal are different in a first state, the first signal may be included in the signal group, the second signal may not be included in the signal group, and the second signal may be a signal obtained by inverting a delayed signal different form the first signal.

According to a third aspect of the present invention, in the encoding circuit according to the first aspect, the third operation may be an operation of detecting that logic states of two continuous delayed signals included in the signal group are the same.

According to a fourth aspect of the present invention, in the encoding circuit according to the first aspect, the delay unit may be an inverting delay unit configured to generate an output signal by inverting and delaying an input signal.

According to a fifth aspect of the present invention, an analog-to-digital (AD) conversion circuit includes the encoding circuit according to the first aspect; a reference signal generating unit configured to generate a reference signal that increases or decreases with passage of time; a comparing unit configured to perform a comparison process of comparing an analog signal to be subjected to AD conversion with the reference signal, complete the comparison process at a timing at which the reference signal satisfies a predetermined condition with respect to the analog signal, and output the control signal at the timing; and a counting unit configured to perform a count operation on the basis of any one of the plurality of delayed signals.

According to a sixth aspect of the present invention, an imaging device includes the AD conversion circuit according to the fifth aspect; and an imaging unit having a plurality of pixels arranged in a matrix, wherein the plurality of pixels output pixel signals, wherein the analog signal is a signal according to the pixel signal, and wherein the comparing unit, the latch unit, the encoding unit, and the counting unit are arranged for every column of an array of the plurality of pixels, or arranged for every other two or more columns of the array of the plurality of pixels.

According to a seventh aspect of the present invention, an imaging system includes the imaging device according to the sixth aspect.

DETAILED DESCRIPTION OF THE INVENTION

Embodiments of the present invention will be described with reference to the drawings.

(First Embodiment)

Figure 1:
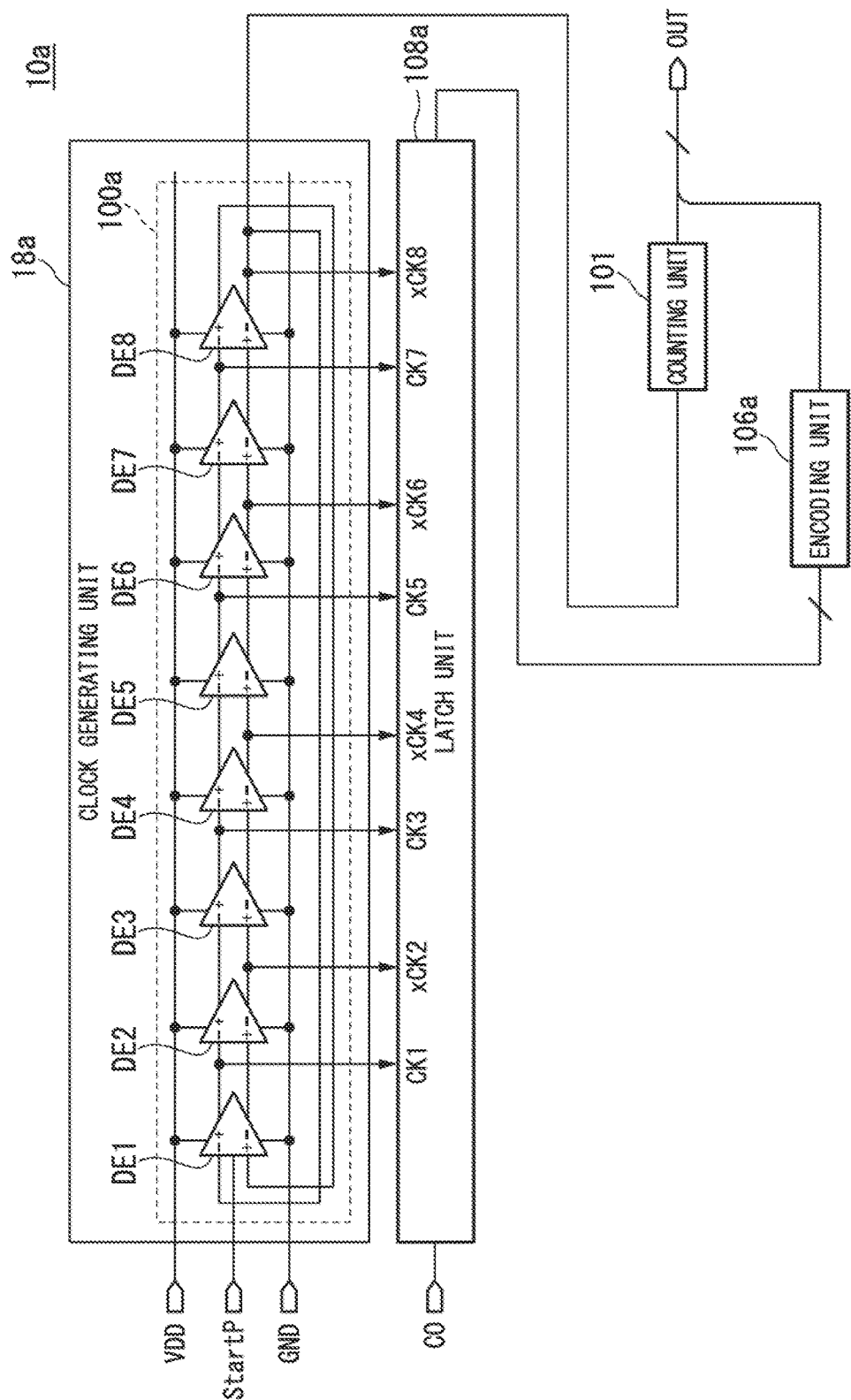
FIG. 1 is a block diagram showing a configuration of an encoding circuit according to a first embodiment of the present invention.

FIG. 1 shows a configuration of an encoding circuit 10a according to the first embodiment of the present invention. As shown in FIG. 1, the encoding circuit 10a includes a clock generating unit 18a, a latch unit 108a, a counting unit 101, and an encoding unit 106a.

The clock generating unit 18a includes a delay circuit 100a in which a plurality of fully-differential delay circuits DE1 to DE8 (delay units) are connected in a ring shape. The clock generating unit 18a outputs a plurality of lower phase signals (lower phase signals CK1, CK3, CK5, and CK7 and lower phase signals xCK2, xCK4, xCK6, and xCK8) according to output signals of the plurality of fully-differential delay circuits DE1 to DE8.

Figure 37:
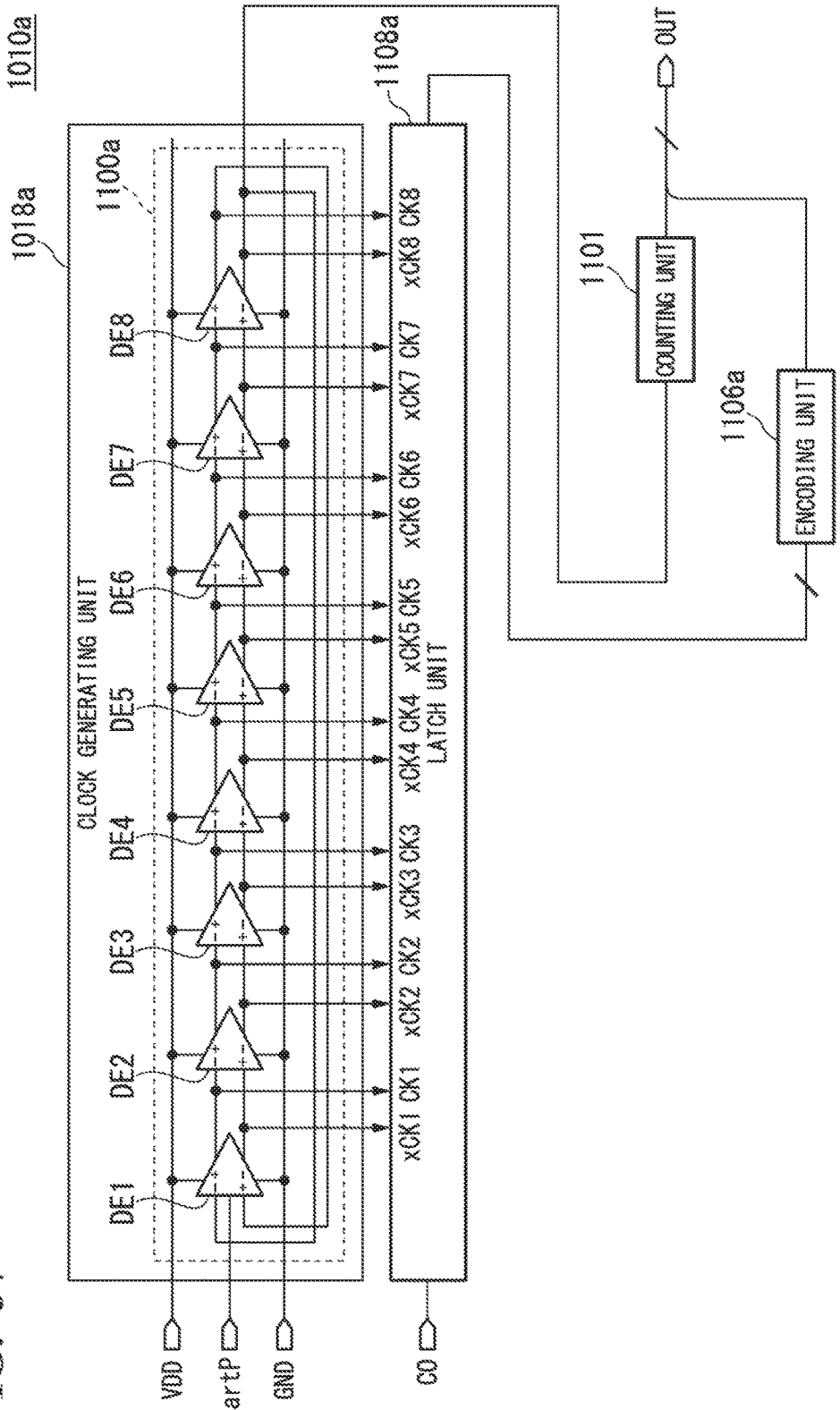
FIG. 37 is a block diagram showing a configuration of an encoding circuit in a tdc SS type AD conversion circuit of a first conventional example.

The lower phase signal (delayed signal) generated by the clock generating unit 18a is the same as the lower phase signal generated by the clock generating unit 1018a shown in FIG. 37. That is, the clock generating unit 18a generates the lower phase signals CK1 to CK8 and the lower phase signals xCK1 to xCK8. The lower phase signals CK1 to CK8 and the lower phase signals xCK1 to xCK8 are clocks whose logic states change periodically. The lower phase signals xCK1 to xCK8 are signals obtained by inverting the lower phase signals CK1 to CK8. That is, the logic states of the lower phase signals xCK1 to xCK8 are opposite to the logic states of the lower phase signals CK1 to CK8. The clock generating unit 18a outputs only some of the plurality of generated lower phase signals (the lower phase signals CK1 to CK8 and the lower phase signals xCK1 to xCK8) for latching by the latch unit 108a.

Each of the fully-differential delay circuits DE1 to DE8 has a first input terminal (+), a second input terminal (−), a first output terminal (+), a second output terminal (−), a first power supply terminal, and a second power supply terminal.

The description of these terminals is the same as the above description. Each of the fully-differential delay circuits DE1 to DE8 generates output signals by delaying the input signals of the first input terminal (+) and the second input terminal (−). That is, each of the fully-differential delay circuits DE1 to DE8 generates a first output signal corresponding to a first input signal of the first input terminal (+) and a second output signal corresponding to a second input signal of the second input terminal (−). The second output signal is a signal obtained by inverting the first output signal.

In the first embodiment, the delay circuit 100a includes fully-differential delay circuits DE1, DE3, DE5, and DE7 which are a plurality of first delay units and fully-differential delay circuits DE2. DE4, DE6, and DE8 which are a plurality of second delay units. The first delay units and the second delay units are arranged in pairs in the connection of the plurality of fully-differential delay circuits DE1 to DE8. Each first delay unit is connected between two of the second delay units. Each second delay unit is connected between two of the first delay units. That is, the first delay units and the second delay units are alternately arranged in the connection of the plurality of fully-differential delay circuits DE1 to DE8.

The clock generating unit 18a outputs the lower phase signals CK1, CK3, CK5, and CK7 which are a plurality of first output signals generated by the plurality of first delay units. Also, the clock generating unit 18a outputs the lower phase signals xCK2, xCK4, xCK6, and xCK8 which are the plurality of second output signals generated by the plurality of second delay units.

The delay circuit 100a may be a circuit having n (n is a power of 2 which is greater than or equal to 2) delay units. It is desirable that delay units constituting the delay circuit 100a be fully-differential delay circuits. However, the delay units constituting the delay circuit 100a are not limited thereto.

The latch unit 108a latches the plurality of lower phase signals (the lower phase signals CK1, CK3, CK5, and CK7 and the lower phase signals xCK2, xCK4, xCK6, and xCK8) output from the clock generating unit 18a at the timing at which a control signal CO is input.

The counting unit 101 performs a count operation on the basis of any one of the plurality of lower phase signals (the lower phase signals CK1, CK3, CK5, CK7 and the lower phase signals xCK2, xCK4, xCK6, and xCK8). For example, the counting unit 101 performs a count operation using the lower phase signal xCK8 output through the latch unit 108a as a count clock. For example, the counting unit 101 performs a count operation at the falling edge of the lower phase signal xCK8. The encoding circuit 10a may not have the counting unit 101.

The encoding unit 106a encodes states of the plurality of lower phase signals (the lower phase signals CK1. CK3, CK5, and CK7 and the lower phase signals xCK2, xCK4, xCK6, and xCK8) latched by the latch unit 108a. Thereby, the encoding unit 106a obtains a binary number according to the states of the plurality of lower phase signals latched by the latch unit 108a.

Next, the operation of the encoding circuit 10a will be described. The waveforms of the start pulse StartP, the lower phase signals CK1 to CK8, and the lower phase signals xCK1 to xCK8 are substantially the same as the waveforms shown in FIG. 38.

When the logic state of the start pulse StartP changes from the L (Low) state to the H (High) state, the delay circuit 100a starts the transition operation. In this transition operation, the logic states of the signals output from the fully-differential delay circuits DE1 to DE8 constituting the delay circuit 100a sequentially change. The counting unit 101 starts a count operation simultaneously when the delay circuit 100a starts the transition operation. Simultaneously with the start of the transition operation by the delay circuit 100a, a reference signal generating unit (not shown) starts the generation of a reference signal (ramp wave). The level of the reference signal generated by the reference signal generating unit monotonically increases or decreases with the passage of time.

An analog signal to be subjected to AD conversion and a reference signal are input to a comparing unit (not shown). At the same time, the lower phase signals CK1, CK3, CK5, and CK7 and the lower phase signals xCK2, xCK4, xCK6, and xCK8 are input to the latch unit 108a. The lower phase signal xCK8 is input to the counting unit 101 through the latch unit 108a. The comparing unit performs a comparison process of comparing the analog signal to be subjected to AD conversion with the reference signal. The comparing unit completes the comparison process at a timing at which the reference signal satisfies a predetermined condition with respect to the analog signal, and outputs the control signal CO at the timing. Specifically, when the magnitude relationship between the two signals input to the comparing unit is switched, the control signal CO is inverted.

At this time, the latch unit 108a latches the logic states of the lower phase signals CK1, CK3, CK5, and CK7 and the lower phase signals xCK2, xCK4, xCK6, and xCK8. Also, the counting unit 101 latches the count value (higher count value). The lower phase signals CK1, CK3, CK5, and CK7 and the lower phase signals xCK2, xCK4, xCK6, and xCK8 latched by the latch unit 108a are encoded by the encoding unit 106a (binary conversion). Thereby, lower data of the digital data is obtained. A higher count value latched by the counting unit 101 constitutes higher data of the digital data. By combining the lower data and the higher data, digital data corresponding to the level of the analog signal can be obtained.

Figure 38:
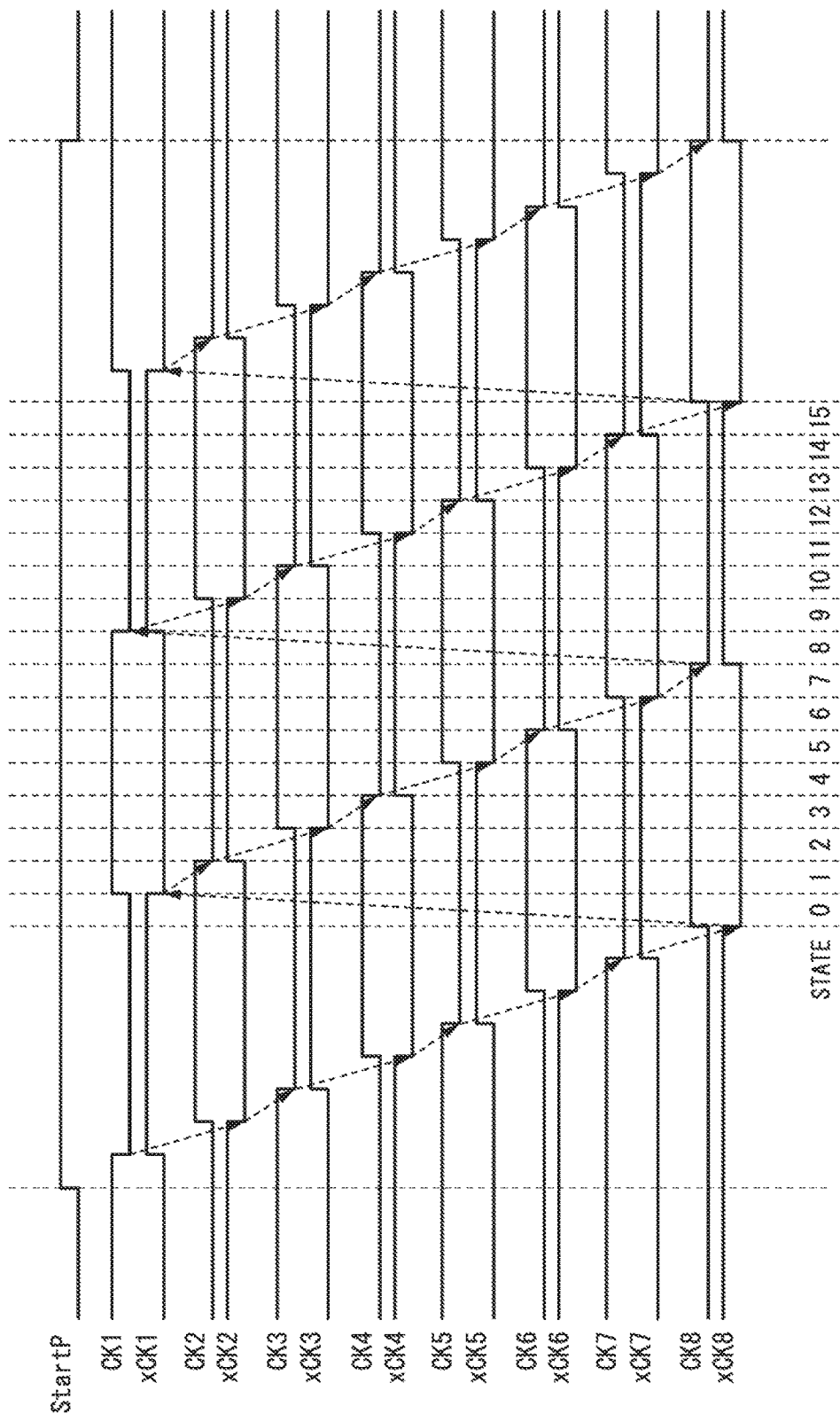
FIG. 38 is a timing chart showing an operation of the encoding circuit in the tdc SS type AD conversion circuit of the first conventional example.

For example, as shown in FIG. 38, the states of the plurality of lower phase signals (the lower phase signals CK1 to CK8 and the lower phase signals xCK1 to xCK8) generated by the clock generating unit 18a (combinations of the logic states of the plurality of lower phase signals) are states 0 to 15. When the counting unit 101 performs a count operation at the falling edge of the lower phase signal xCK8, the combinations of the logic states of the plurality of lower phase signals in periods obtained by dividing a period in which the counting unit 101 performs one count operation (a period from the falling edge of the lower phase signal xCK8 to the next falling edge) into 16 equal parts correspond to states 0 to 15. States 0 to 15 correspond to encoded values 0 to 15 which are encoding results.

The encoding unit 106a encodes states of a plurality of lower phase signals by performing a first operation, a second operation, and a third operation. In the first operation, the encoding unit 106a detects a position at which the logic states of two or more lower phase signals included in the signal group change from High to Low. The signal group includes at least two of the plurality of lower phase signals (lower phase signals CK1, CK3, CK5, and CK7 and lower phase signals xCK2, xCK4, xCK6, and xCK8) latched by the latch unit 108a. The signal group in the first embodiment is constituted of all the plurality of lower phase signals latched by the latch unit 108a. All the lower phase signals included in the signal group are arranged in an order according to an order of connection of the plurality of fully-differential delay circuits DE 1 to DE8. That is, in the first operation, the encoding unit 106*a* detects that the logic states of two continuous lower phase signals in the signal group are High and Low, respectively.

In the second operation, the encoding unit 106*a* detects a position at which the logic states of two or more lower phase signals included in the signal group change from Low to High. That is, in the second operation, the encoding unit 106*a* detects that the logic states of two continuous lower phase signals in the signal group are Low and High, respectively.

In the third operation, the encoding unit 106*a* detects that the logic states of two or more lower phase signals including at least one lower phase signal included in the signal group are predetermined states. The third operation is different from the first operation and the second operation. In the third operation in the first embodiment, the encoding unit 106*a* detects that the logic states of two continuous lower phase signals included in the signal group are the same. The third operation is performed between the first operation and the second operation.

Figure 2:
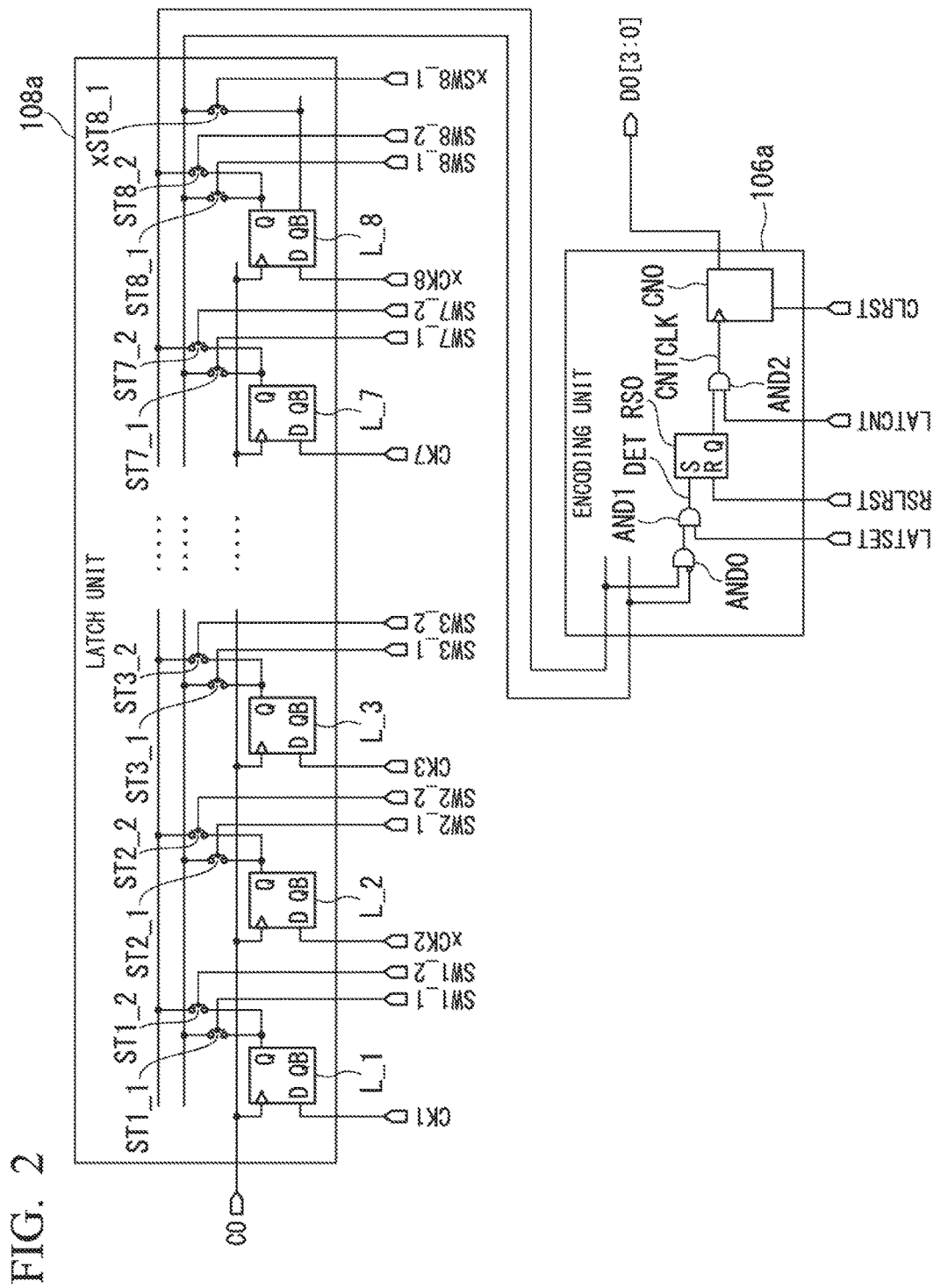
FIG. 2 is a block diagram showing configurations of a latch unit and an encoding unit according to the first embodiment of the present invention.

FIG. 2 shows the configurations of the latch unit 108*a* and the encoding unit 106*a*.

The latch unit 108*a* includes a plurality of latch circuits L_1 to L_8, a plurality of switches ST1_1 to ST8_1, a plurality of switches ST1_2 to ST8_2, and a switch xST8_1. For convenience, the latch circuits L_4 to L_6, the switches ST4_1 to ST6_1, and the switches ST4_2 to ST6_2 are not shown. The latch circuits L_1 to L_8 latches states of a plurality of lower phase signals (lower phase signals CK1, CK3, CK5, and CK7 and lower phase signals xCK2, xCK4, xCK6, and xCK8) at the timing at which the control signal CO from a comparing unit (not shown) is inverted. Control signals SW1_1 to SW8_1 and control signals SW1_2 to SW8_2 are signals which control the switches ST1_1 to ST8_1 and the switches ST1_2 to ST8_2 for outputting any one of the plurality of lower phase signals latched by the latch circuits L_1 to L_8 from the output terminals Q of the latch circuits L_1 to L_8 to the encoding unit 106*a*. A control signal xSW8_1 is a signal which controls the switch xST_1 for outputting a signal (corresponding to the lower phase signal CK8) obtained by inverting the lower phase signal xCK8 latched by the latch circuit L_8 from an inverting output terminal QB of the latch circuit L_8 to the encoding unit 106*a*.

The encoding unit 106*a* has AND circuits AND0, AND1, and AND2, an RS latch RS0, and a counter circuit CN0. Signals obtained by inverting the lower phase signals output from the output terminals Q of the latch circuits L_1 to L_8 and the inverting output terminal QB of the latch circuit L_8 via the switches ST1_1 to ST8_1 and the switch xST8_1 are input to the first input terminal of the AND circuit AND0. The lower phase signals output from the output terminals Q of the latch circuits L_1 to L_8 are input to the second input terminal of the AND circuit AND0 via the switches ST1_2 to ST8_2. The AND circuit AND0 performs an AND operation on the two input signals. The signal output from the AND circuit AND0 and a control signal LATSET are input to the AND circuit AND1. The AND circuit AND1 performs an AND operation on the two input signals. A detection signal DET indicating the result of the AND operation is output from the AND circuit AND1.

The detection signal DET from the AND circuit AND1 and a control signal RSLRST are input to the RS latch RS0. The RS latch RS0 changes the output signal from the L state to the H state when the detection signal DET changes from the L state to the H state after the RS latch RS0 is reset by the control signal RSLRST. Thereafter, the RS latch RS0 maintains the output signal in the H state regardless of the state of the detection signal DET until the RS latch RS0 is reset by the control signal RSLRST. The output signal of the RS latch RS0 and the control signal LATCNT are input to the AND circuit AND2. The AND circuit AND2 performs an AND operation on the two input signals. A lower count signal CNTCLK indicating the result of the AND operation is output from the AND circuit AND2. The lower count signal CNTCLK from the AND circuit AND2 is input to the counter circuit CN0. The counter circuit CN0 performs a count operation using the lower count signal CNTCLK as a count clock. The count value of the counter circuit CN0 is reset by the control signal CLRST.

For example, the counter circuit CN0 is a 4-bit down counter circuit. The counter circuit CN0 outputs a 4-bit output signal DO[3:0].

Figure 3:
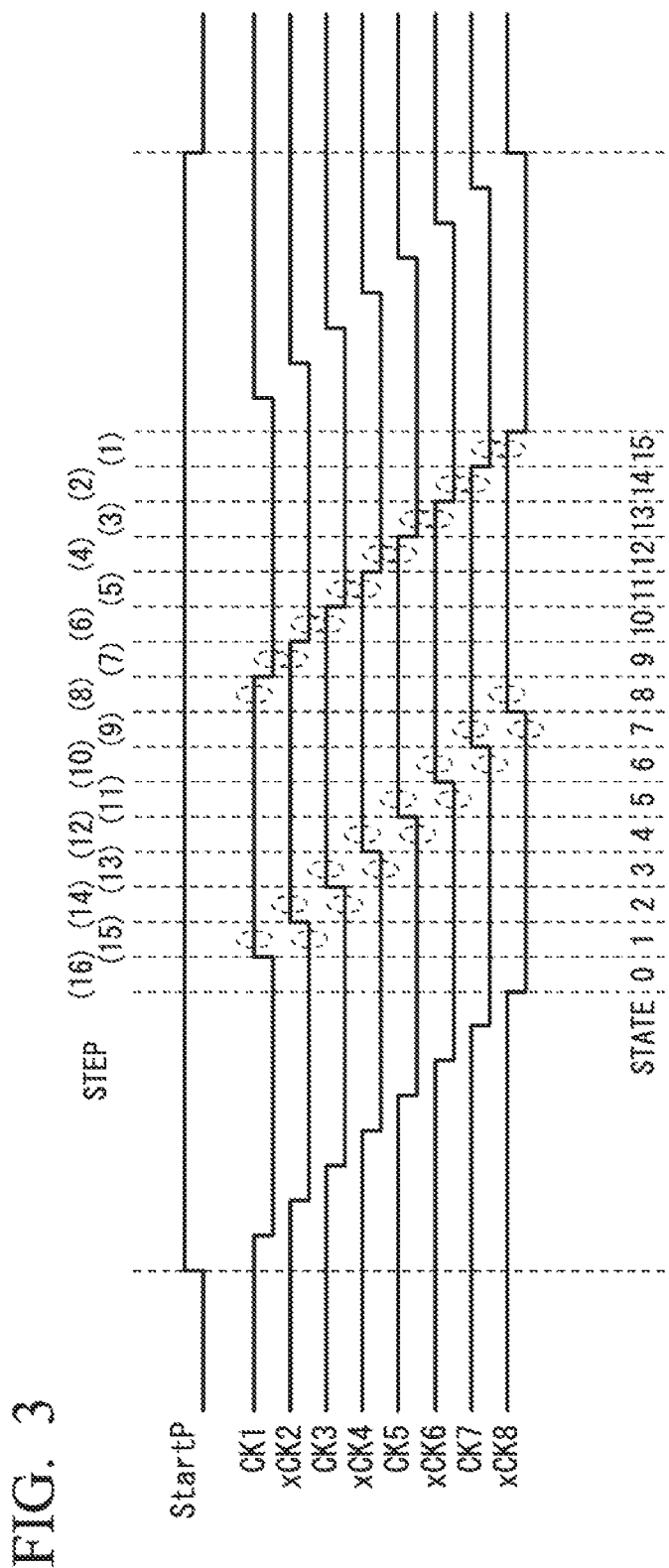
FIG. 3 is a timing chart showing an operation of the encoding circuit according to the first embodiment of the present invention.

A procedure of encoding by the encoding circuit 10*a* will be described. FIG. 3 shows the waveforms of the start pulse StartP, the lower phase signals CK1, CK3, CK5, and CK7 and the lower phase signals xCK2, xCK4, xCK6, and xCK8 in the encoding circuit 10*a*. In FIG. 3, the horizontal direction indicates time and the vertical direction indicates voltage.

In FIG. 3, the lower phase signals CK1, CK3, CK5, and CK7 and the lower phase signals xCK2, xCK4, xCK6, and xCK8 are arranged to constitute a group of signals falling (changing from the H state to the L state) sequentially at predetermined time intervals. Specifically, the lower phase signals are arranged in the order of the lower phase signals CK1, xCK2, CK3, xCK4, CK8, xCK6, CK7, and xCK8. In this signal group, the plurality of lower phase signals are arranged in an order according to the order of connection of the plurality of fully-differential delay circuits DE1 to DE8 on the basis of the lower phase signal xCK8 which is the count clock of the counting unit 101. In the order of connection of the plurality of fully-differential delay circuits DE1 to DE8, the lower phase signals output from the preceding fully-differential delay circuits are arranged at preceding positions in the signal group.

Specifically, the lower phase signal CK1 from the fully-differential delay circuit DE1 connected to the fully-differential delay circuit DE8 that outputs the lower phase signal xCK8 is arranged at the head. Further, the lower phase signals output from the fully-differential delay circuits are arranged so that the order of the plurality of lower phase signals is the same as the order of connection of the fully-differential delay circuits DE1 to DE8. The plurality of lower phase signals may be arranged to constitute a group of signals rising (changing from the L state to the H state) sequentially at predetermined time intervals.

As shown in FIG. 3, the phase signal xCK2 changes from the H state to the L state when a predetermined time (corresponding to the delay time for one of the fully-differential delay circuits DE1 to DE8) has elapsed from the change of the lower phase signal CK1 from the H state to the L state. The lower phase signal CK3 changes from the H state to the L state when a predetermined time has elapsed from the change of the lower phase signal xCK2 from the H state to the L state. Thereafter, likewise, the lower phase signals xCK4, CK8, xCK6, CK7, and xCK8 sequentially change from the H state to the L state.

In the signal group (signal string) in which the plurality of lower phase signals latched by the latch unit 108*a* are arranged in the above-described order, the logic states of two continuous lower phase signals are sequentially detected. If it is detected that the logic states of the two continuous lower phase signals are predetermined states (thermometer codes), the states of a plurality of lower phase signals are determined according to a position at which the states are detected.

For example, the logic states of two continuous lower phase signals are sequentially detected from the bottom to the top of the signal group shown in FIG. 3. In the cases of states 9 to 15, in the signal group, the logic state changes from the H state to the L state between two continuous lower phase signals. In the case of state 8, in the signal group, the logic states of all the lower phase signals are the H state. The only state in which the logic states of any two continuous lower phase signals are the H state is state 8. In the first embodiment, when it is detected that both the lower phase signal CK1 and the lower phase signal xCK8 are in the H state, it is determined that the state of each of the plurality of lower phase signals is state 8. In the case of states 1 to 7, in the signal group, the logic state changes from the L state to the H state between two continuous lower phase signals. In the case of state 0, in the signal group, the logic states of all the lower phase signals are the L state. In the first embodiment, when states 1 to 15 are not detected, it is determined that the state of each of the plurality of lower phase signals is state 0.

Specifically, encoding is performed by performing the following processing of steps (1) to (15) in time series. In the description of the first embodiment, "0" corresponds to the L state of the signal. "1" corresponds to the H state of the signal. This is also applicable for the description of other embodiments.

(Step (1)) . . . Determination related to state 15

The logic states of the lower phase signal xCK8 and the lower phase signal CK7 are compared. If there is a thermometer code "10" at this position, the state of each of a plurality of lower phase signals is determined to be state 15. Step (1) corresponds to a first operation.

(Step (2)) . . . Determination related to state 14

The logic states of the lower phase signal CK7 and the lower phase signal xCK6 are compared. If there is a thermometer code "10" at this position, the state of each of a plurality of lower phase signals is determined to be state 14. Step (2) corresponds to the first operation.

(Step (3)) . . . Determination related to state 13

The logic states of the lower phase signal xCK6 and the lower phase signal CK5 are compared. If there is a thermometer code "10" at this position, the state of each of a plurality of lower phase signals is determined to be state 13. Step (3) corresponds to the first operation.

(Step (4)) . . . Determination related to state 12

The logic states of the lower phase signal CK5 and the lower phase signal xCK4 are compared. If there is a thermometer code "10" at this position, the state of each of a plurality of lower phase signals is determined to be state 12. Step (4) corresponds to the first operation.

(Step (5)) . . . Determination related to state 11

The logic states of the lower phase signal xCK4 and the lower phase signal CK3 are compared. If there is a thermometer code "10" at this position, the state of each of a plurality of lower phase signals is determined to be state 11. Step (5) corresponds to the first operation.

(Step (6)) . . . Determination related to state 10

The logic states of the lower phase signal CK3 and the lower phase signal xCK2 are compared. If there is a thermometer code "10" at this position, the state of each of a plurality of lower phase signals is determined to be state 10. Step (6) corresponds to the first operation.

(Step (7)) . . . Determination related to state 9

The logic states of the lower phase signal xCK2 and the lower phase signal CK1 are compared. If there is a thermometer code "10" at this position, the state of each of a plurality of lower phase signals is determined to be state 9. Step (7) corresponds to the first operation.

(Step (8)) . . . Determination related to state 8

The logic states of the lower phase signal CK1 and the lower phase signal xCK8 are compared. If there is a thermometer code "11" at this position, the state of each of a plurality of lower phase signals is determined to be state 8. Step (8) corresponds to the third operation.

(Step (9)) . . . Determination related to state 7

The logic states of the lower phase signal xCK8 and the lower phase signal CK7 are compared. If there is a thermometer code "01" at this position, the state of each of a plurality of lower phase signals is determined to be state 7. Step (9) corresponds to the second operation.

(Step (10)) . . . Determination related to state 6

The logic states of the lower phase signal CK7 and the lower phase signal xCK6 are compared. If there is a thermometer code "01" at this position, the state of each of a plurality of lower phase signals is determined to be state 6. Step (10) corresponds to the second operation.

(Step (11)) . . . Determination related to state 5

The logic states of the lower phase signal xCK6 and the lower phase signal CK5 are compared. If there is a thermometer code "01" at this position, the state of each of a plurality of lower phase signals is determined to be state 5. Step (11) corresponds to the second operation.

(Step (12)) . . . Determination related to state 4

The logic states of the lower phase signal CK8 and the lower phase signal xCK4 are compared. If there is a thermometer code "01" at this position, the state of each of a plurality of lower phase signals is determined to be state 4. Step (12) corresponds to the second operation.

(Step (13)) . . . Determination related to state 3

The logic states of the lower phase signal xCK4 and the lower phase signal CK3 are compared. If there is a thermometer code "01" at this position, the state of each of a plurality of lower phase signals is determined to be state 3. Step (13) corresponds to the second operation.

(Step (14)) . . . Determination related to state 2

The logic states of the lower phase signal CK3 and the lower phase signal xCK2 are compared. If there is a thermometer code "01" at this position, the state of each of a plurality of lower phase signals is determined to be state 2. Step (14) corresponds to the second operation.

(Step (15)) . . . Determination related to state 1

The logic states of the lower phase signal xCK2 and the lower phase signal CK1 are compared. If there is a thermometer code "01" at this position, the state of each of a plurality of lower phase signals is determined to be state 1. Step (15) corresponds to the second operation.

In steps (1) to (15), if it is determined that the state of each of the plurality of lower phase signals is not any one of states 1 to 15, the state of each of the plurality of lower phase signals is state 0. Thus, no particular determination related to state 0 is necessary. When the encoding unit 106a detects the thermometer code, the control signals SW1_1 to SW8_1, the control signals SW1_2 to SW8_2, and the control signal xSW8_1 are controlled so that the above-described procedure is implemented.

Figure 4:
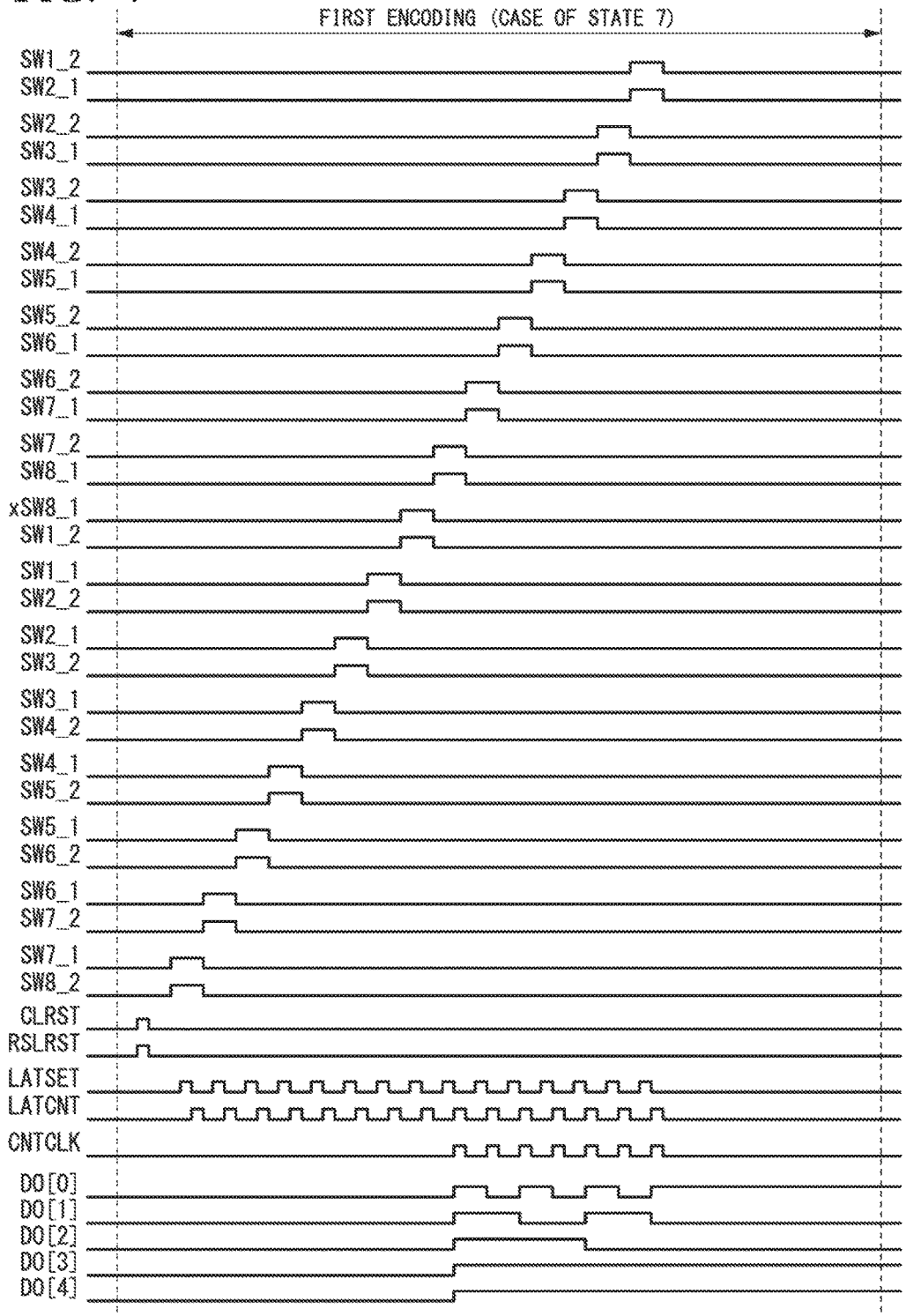
FIG. 4 is a timing chart showing an encoding procedure according to the first embodiment of the present invention.
Figure 5:
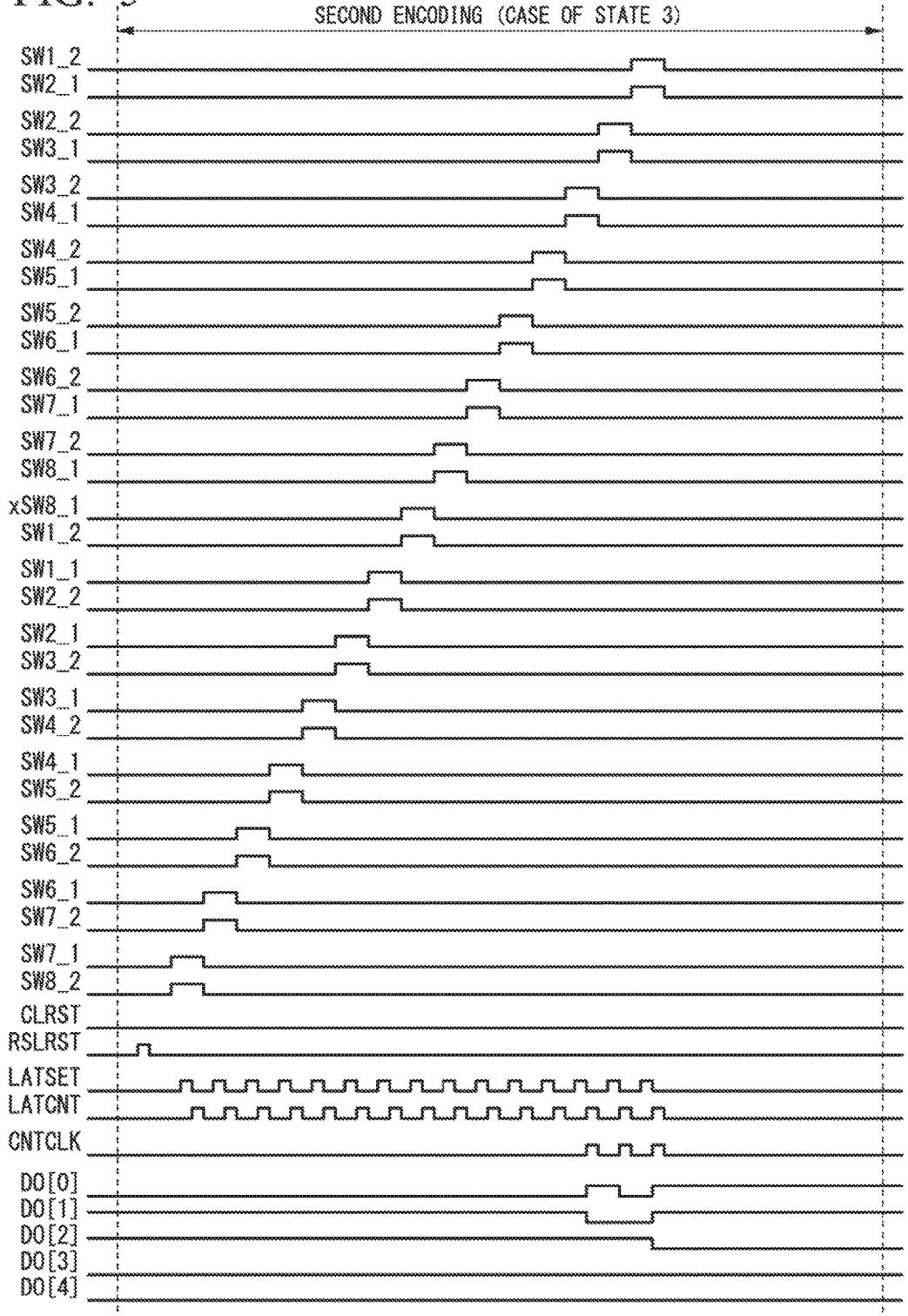
FIG. 5 is a timing chart showing an encoding procedure according to the first embodiment of the present invention.

FIGS. 4 and 5 show waveforms of encoding-related signals. In FIGS. 4 and 5, the horizontal direction indicates time and the vertical direction indicates voltage. An example in which first encoding which is the encoding of state 7 and second encoding which is the encoding of state 3 are performed continuously will be described. This example is applicable to the subtraction of the reset level and the signal level in the imaging device. In this example, a value of −4 is obtained by subtracting an encoded value of 7 corresponding to the state 7 from an encoded value of 3 corresponding to state 3.

The outline of the operation will be described. A lower phase signal CK* or a lower phase signal xCK* is output from any two of the latch circuits L_1 to L_8 by which the lower phase signals CK1, CK3, CK5, and CK7 and the lower phase signals xCK2, xCK4, xCK6, and xCK8 are latched according to the control signals SW1_1 to SW8_1 and the control signals SW1_2 to SW8_2. * in the description of the first embodiment denotes an integer of 1 to 8. Also, the lower phase signal CK8 obtained by inverting the lower phase signal xCK8 is output from the latch circuit L_8 latching the lower phase signal xCK8 according to the control signal xSW8_1. The lower phase signal CK* or the lower phase signal xCK* output from the two latch circuits is input to the encoding unit 106a. The encoding unit 106a detects the thermometer code on the basis of the input lower phase signal CK* or the lower phase signal xCK*. In this example, the thermometer code is a logic state corresponding to an edge position changing from the H state to the L state, an edge position changing from the L state to the H state, and two continuous H states.

If a result of an AND operation on the lower phase signal CK* or the lower phase signal xCK* output from one latch circuit L_* and a signal obtained by inverting the lower phase signal CK* or the lower phase signal xCK* output from another latch circuit L_* indicates the H state, the thermometer code is detected. At the timing at which the thermometer code is detected, the generation of the lower count signal CNTCLK having a number of pulses according to the states of the lower phase signals CK1, CK3, CK5, and CK7 and the lower phase signals xCK2, xCK4, xCK6, and xCK8 starts. At the same time, the counter circuit CN0 starts the counting of the lower count signal CNTCLK. Count values DO[0] to DO[3] of the counter circuit CN0 when the count operation is completed are encoding results.

Detailed operations in steps (1) to (15) will be described. At the timing at which the predetermined condition is satisfied, the logic state of the control signal CO from the comparing unit (not shown) changes. Thereby, the logic states of the lower phase signals CK1, CK3, CK5, and CK7 and the lower phase signals xCK2, xCK4, xCK6, and xCK8 output from the clock generating unit 18a are latched by the latch unit 108a.

Subsequently, the first encoding shown in FIG. 4 starts. The RS latch RS0 is reset by the control signal RSLRST. At this time, the output signal of the RS latch RS0 is in the L state. Also, the counter circuit CN0 is reset by the control signal CLRST. At this time, the count value of the counter circuit CN0 is an initial value of the first encoding, i.e., 4'b[0]0000. "4'b" in the notation of the count value indicates that the output signal is a 4-bit binary number. "[0]" in the notation of the count value indicates the sign of the count value. This sign is used for convenience of description. "[0]" corresponds to a positive sign. "[1]" corresponds to a negative sign. "0000" in the notation of the count value indicates the output signal DO[3:0] of the encoding unit 106a. The same notation of the count value is also used for the description of the second embodiment and the third embodiment. After the RS latch RS0 and the counter circuit CN0 are reset, the control signals SW1_1 to SW8_1, the control signals SW1_2 to SW8_2, and the control signal xSW8_1 change to the H state in a predetermined order.

(Step (1))

The control signal SW8_2 and the control signal SW7_1 change to the H state. Thereby, the lower phase signal xCK8 (L state) latched by the latch circuit L_8 and the signal obtained by inverting the lower phase signal CK7 (H state) latched by the latch circuit L_7 are input to the AND circuit AND0. At this time, the output signal of the AND circuit AND0 is in the L state. The control signal LATSET changes from the L state to the H state and then changes to the L state. Meanwhile, the detection signal DET is kept in the L state. Thus, the output signal of the RS latch RS0 is kept in the L state. As a result, the lower count signal CNTCLK is in the L state. At this time, the count value of the counter circuit CN0 is the initial value of the first encoding.

(Steps (2) to (7))

As the same in step (1), the lower phase signal CK* or the lower phase signal xCK* output from one latch circuit L_* and a signal obtained by inverting the lower phase signal CK* or the lower phase signal xCK* output from another latch circuit L_* are input to the AND circuit AND0. In any of steps (2) to (7), the output signal of the AND circuit AND0 is in the L state. The control signal LATSET changes from the L state to the H state and then changes to the L state. Meanwhile, the detection signal DET is kept in the L state. Thus, the output signal of the RS latch RS0 is kept in the L state. As a result, the lower count signal CNTCLK is in the L state. At this time, the count value of the counter circuit CN0 is the initial value of the first encoding.

(Step (8))

The control signal SW1_2 and the control signal xSW8_1 are in the H state. Thereby, the lower phase signal CK1 (H state) latched by the latch circuit L_1 and a signal obtained by inverting the lower phase signal CK8 (H state) corresponding to the lower phase signal xCK8 (L state) latched by the latch circuit L_8 are input to the AND circuit AND0. At this time, the lower phase signal CK8 is output from the inverting output terminal QB of the latch circuit L_8. At this time, the output signal of the AND circuit AND0 is in the L state. The control signal LATSET changes from the L state to the H state and then changes to the L state. Meanwhile, the detection signal DET is kept in the L state. Thus, the output signal of the RS latch RS0 is kept in the L state. As a result, the lower count signal CNTCLK is in the L state. At this time, the count value of the counter circuit CN0 is the initial value of the first encoding.

(Step (9))

The control signal SW8_1 and the control signal SW7_2 change to the H state. Thereby, a signal obtained by inverting the lower phase signal xCK8 (L state) latched by the latch circuit L_8 and the lower phase signal CK7 (H state) latched by the latch circuit L_7 are input to the AND circuit AND0. At this time, the output signal of the AND circuit AND0 is in the H state. The control signal LATSET changes from the L state to the H state and then changes to the L state. Meanwhile, the detection signal DET changes from the L state to the H state and then changes to the L state. Thereby, the output signal of the RS latch RS0 changes to the H state. The control signal LATCNT changes from the L state to the H state and then changes to the L state. Thereby, the AND circuit AND2 outputs a lower count signal CNTCLK of one pulse. The counter circuit CN0 performs a count operation on the basis of the lower count signal CNTCLK. Thus, the count value of the counter circuit CN0 decreases.

(Steps (10) to (15))

As the same in step (9), a signal obtained by inverting the lower phase signal CK* or the lower phase signal xCK* output from one latch circuit L_* and the lower phase signal CK* or the lower phase signal xCK* output from another latch circuit L_* are input to the AND circuit AND0. In any of steps (10) to (15), regardless of the output signal of the AND circuit AND0, the output signal of the RS latch RS0 is kept in the H state. The control signal LATCNT changes from the L state to the H state and then changes to the L state. Thereby, in each step, the AND circuit AND2 outputs a lower count signal CNTCLK of one pulse. The counter circuit CN0 performs a count operation on the basis of the lower count signal CNTCLK. Thus, the count value of the counter circuit CN0 decreases.

When the processing of step (15) is completed, the count value of the counter circuit CN0 is 4'b[1]1001. This count value corresponds to −7. Upon completion of the processing of step (15), the first encoding shown in FIG. 4 is completed.

After the processing of step (15) is completed, the count value of the counter circuit CN0 is inverted. At this time, the count value of the counter circuit CN0 is 4'b[0]0110. This count value corresponds to 6.

Subsequently, the second encoding shown in FIG. 5 starts. The RS latch RS0 is reset by the control signal RSLRST. The counter circuit CN0 is not reset by the control signal CLRST. At this time, the count value of the counter circuit CN0 is the initial value of the second encoding, i.e., 4'b[0]0110. After the RS latch RS0 is reset, the control signals SW1_1 to SW8_1, the control signals SW1_2 to SW8_2, and the control signal xSW8_1 change to the H state in a predetermined order.

(Step (1))

The control signal SW8_2 and the control signal SW7_1 change to the H state. Thereby, the lower phase signal xCK8 (L state) latched by the latch circuit L_8 and a signal obtained by inverting the lower phase signal CK7 (L state) latched by the latch circuit L_7 are input to the AND circuit AND0. At this time, the output signal of the AND circuit AND0 is in the L state. The control signal LATSET changes from the L state to the H state and then changes to the L state. Meanwhile, the detection signal DET is kept in the L state. Thus, the output signal of the RS latch RS0 is kept in the L state. As a result, the lower count signal CNTCLK is in the L state. At this time, the count value of the counter circuit CN0 is the initial value of the second encoding.

(Steps (2) to (7))

As the same in step (1), the lower phase signal CK* or the lower phase signal xCK* output from one latch circuit L_* and a signal obtained by inverting the lower phase signal CK* or the lower phase signal xCK* output from another latch circuit L_* are input to the AND circuit AND0. In any of steps (2) to (7), the output signal of the AND circuit AND0 is in the L state. The control signal LATSET changes from the L state to the H state and then changes to the L state. Meanwhile, the detection signal DET is kept in the L state. Thus, the output signal of the RS latch RS0 is kept in the L state. As a result, the lower count signal CNTCLK is in the L state. At this time, the count value of the counter circuit CN0 is the initial value of the second encoding.

(Step (8))

The control signal SW 1_2 and the control signal xSW 8_1 change to the H state. Thereby, the lower phase signal CK1 (H state) latched by the latch circuit L_1 and a signal obtained by inverting the lower phase signal CK8 (H state) corresponding to the lower phase signal xCK8 (L state) latched by the latch circuit L_8 are input to the AND circuit AND0. At this time, the lower phase signal CK8 is output from the inverting output terminal QB of the latch circuit L_8. At this time, the output signal of the AND circuit AND0 is in the L state. The control signal LATSET changes from the L state to the H state and then changes to the L state. Meanwhile, the detection signal DET is kept in the L state. Thus, the output signal of the RS latch RS0 is kept in the L state. As a result, the lower count signal CNTCLK is in the L state. At this time, the count value of the counter circuit CN0 is the initial value of the second encoding.

(Step (9))

The control signal SW 8_1 and the control signal SW 7_2 change to the H state. Thereby, a signal obtained by inverting the lower phase signal xCK8 (L state) latched by the latch circuit L_8 and the lower phase signal CK7 (L state) latched by the latch circuit L_7 are input to the AND circuit AND0. At this time, the output signal of the AND circuit AND0 is in the L state. The control signal LATSET changes from the L state to the H state and then changes to the L state. Meanwhile, the detection signal DET is kept in the L state. Thus, the output signal of the RS latch RS0 is kept in the L state. As a result, the lower count signal CNTCLK is in the L state. At this time, the count value of the counter circuit CN0 is the initial value of the second encoding.

(Steps (10) to (12))

As the same in step (9), a signal obtained by inverting the lower phase signal CK* or the lower phase signal xCK* output from one latch circuit L_* and the lower phase signal CK* or the lower phase signal xCK* output from another latch circuit L_* are input to the AND circuit AND0. In any of steps (10) to (12), the output signal of the AND circuit AND0 is in the L state. The control signal LATSET changes from the L state to the H state and then changes to the L state. Meanwhile, the detection signal DET is kept in the L state. Thus, the output signal of the RS latch RS0 is kept in the L state. As a result, the lower count signal CNTCLK is in the L state. At this time, the count value of the counter circuit CN0 is the initial value of the second encoding.

(Step (13))

The control signal SW4_1 and the control signal SW3_2 change to the H state. Thereby, a signal obtained by inverting the lower phase signal xCK4 (L state) latched by the latch circuit L_4 and the lower phase signal CK3 (H state) latched by the latch circuit L_3 are input to the AND circuit AND0. At this time, the output signal of the AND circuit AND0 is in the H state. The control signal LATSET changes from the L state to the H state and then changes to the L state. Meanwhile, the detection signal DET changes from the L state to the H state and then changes to the L state. Thereby, the output signal of the RS latch RS0 changes to the H state. The control signal LATCNT changes from the L state to the H state and then changes to the L state. Thereby, the AND circuit AND2 outputs a lower count signal CNTCLK of one pulse. The counter circuit CN0 performs a count operation on the basis of the lower count signal CNTCLK. Thus, the count value of the counter circuit CN0 decreases.

(Steps (14) and (15))

As the same in step (9), a signal obtained by inverting the lower phase signal CK* or the lower phase signal xCK* output from one latch circuit L_* and the lower phase signal CK* or the lower phase signal xCK*output from another latch circuit L_* are input to the AND circuit AND0. In both of steps (14) and (15), regardless of the output signal of the AND circuit AND0, the output signal of the RS latch RS0 is kept in the H state. The control signal LATCNT changes from the L state to the H state and then changes to the L state. Thereby, in each step, the AND circuit AND2 outputs a lower count signal CNTCLK of one pulse. The counter circuit CN0 performs a count operation on the basis of the lower count signal CNTCLK. Thus, the count value of the counter circuit CN0 decreases.

When the processing of step (15) is completed, the count value of the counter circuit CN0 is 4'b[0]0011. This count value corresponds to 3. Upon completion of the processing of step (15), the second encoding shown in FIG. 5 is completed.

After the processing of step (15) is completed, the count value of the counter circuit CN0 is inverted. At this time, the count value of the counter circuit CN0 is 4'b[1]1100. This count value corresponds to −4. That is, the value of −4 is obtained by subtracting an encoded value of 7 corresponding to state 7 from an encoded value of 3 corresponding to state 3. After a value is inverted in binary subtraction, 1 should be added to the inverted value. However, because the values are inverted in both the first encoding and the second encoding, the change in value due to the addition of 1 to each inverted value is canceled out. Therefore, in this example, after the value is inverted, 1 is not added to the inverted value.

In the third operation, the thermometer code "00" may be detected instead of the thermometer code "11." That is, the determination related to state 0 may be performed.

According to the first embodiment, the encoding circuit 10a includes the clock generating unit 18a having the delay circuit 100a in which n (n is a power of 2 which is greater than or equal to 2) delay units (the fully-differential delay circuits DE1 to DE8) are connected together, each of the n delay units generating an output signal by delaying an input signal, and the clock generating unit 18a being configured to output a plurality of delayed signals (the lower phase signals CK1, CK3, CK8, and CK7 and the lower phase signals xCK2, xCK4, xCK6, and xCK8) according to output signals of a plurality of delay units; the latch unit 108a configured to latch the plurality of delayed signals at the timing at which a control signal CO is input; and the encoding unit 106a configured to encode state of each of the plurality of delayed signals latched by the latch unit 108a. The encoding unit 106a encodes the state of each of the plurality of delayed signals by performing a first operation, a second operation, and a third operation. The first operation is an operation of detecting a position at which logic states of two or more delayed signals included in a signal group change from High to Low. The signal group is configured by at least two of the plurality of delayed signals latched by the latch unit 108a and all the delayed signals included in the signal group are arranged in an order according to an order of connection of the plurality of delay units. The second operation is an operation of detecting a position at which logic states of two or more delayed signals included in the signal group change from Low to High. The third operation is an operation of detecting that logic states of two or more delayed signals including at least one delayed signal included in the signal group are predetermined states. The third operation is different from the first operation and the second operation.

In the first embodiment, the first operation, the second operation, and the third operation are performed when the states of the plurality of lower phase signals latched by the latch unit 108a are encoded. In the second operation, the logic state ("01") different from the logic state ("10") detected in the first operation is detected from the same combination as the combination of the two lower phase signals used in the first operation. Thus, the number of lower phase signals latched by the latch unit 108a is reduced. As a result, the circuit scale of the latch unit 108a can be reduced. For example, the circuit scale of the latch unit 108a is about half that of the latch unit 1108a shown in FIG. 37.

In the first embodiment, the encoding circuit 10a has the same advantages as the conventional encoding circuit. That is, even when the number of clocks generated by the clock generating unit 18a is large, the circuit scale of the encoding circuit 10a is small and the configuration of the encoding circuit 10a is simple.

In the first embodiment, the fully-differential delay circuits DE1 to DE8, which are delay units, are inverting delay units that generate an output signal by inverting and delaying the input signal. Thus, the configuration of the delay circuit 100a is simple.

(Second Embodiment)

Figure 6:
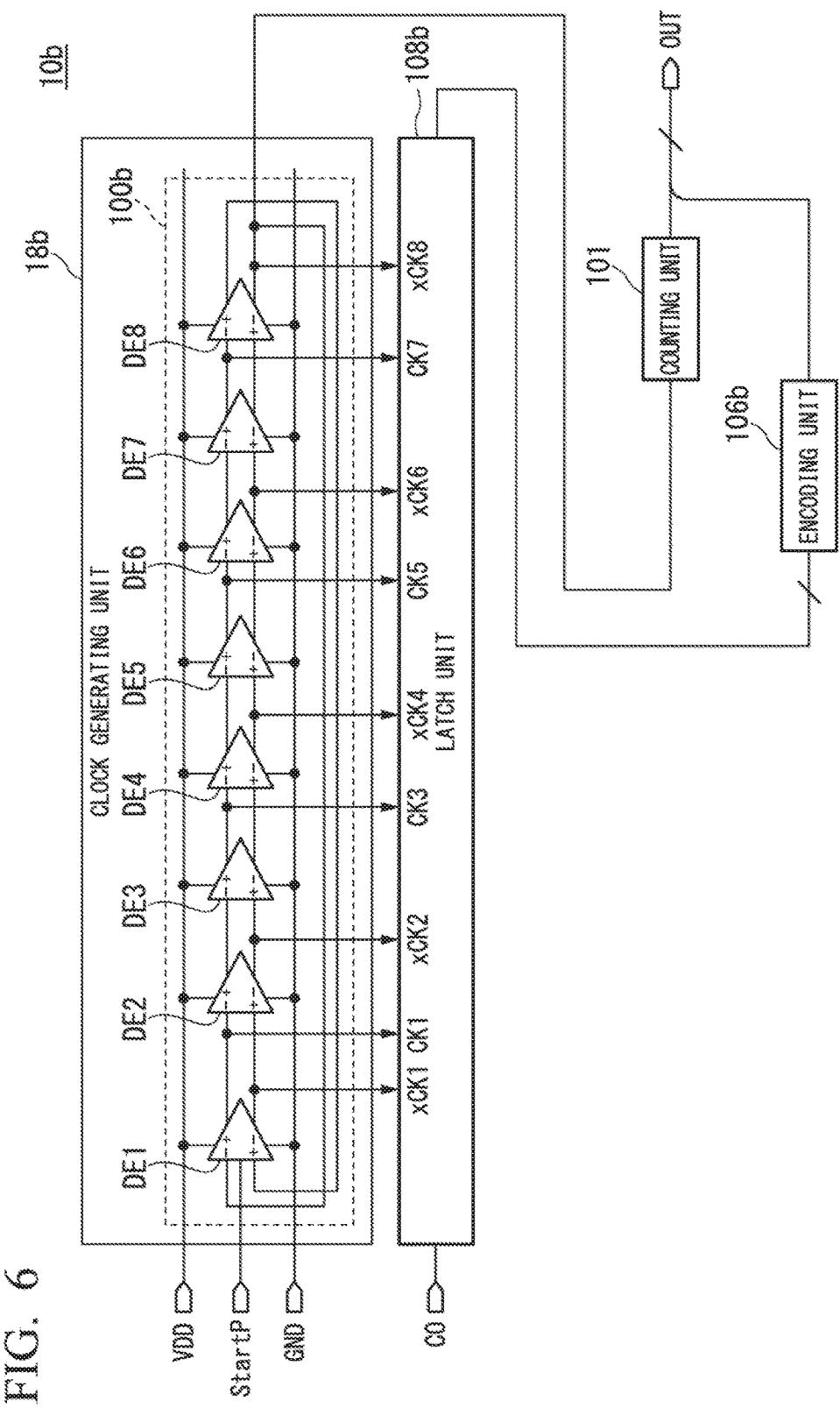
FIG. 6 is a block diagram showing a configuration of an encoding circuit according to a second embodiment of the present invention.

FIG. 6 shows a configuration of an encoding circuit 10b according to the second embodiment of the present invention. As shown in FIG. 6, the encoding circuit 10b includes a clock generating unit 18b, a latch unit 108b, a counting unit 101, and an encoding unit 106b.

Differences of the configuration shown in FIG. 6 from the configuration shown in FIG. 1 will be described. The clock generating unit 18b includes a delay circuit 100b in which a plurality of fully-differential delay circuits DE1 to DE8 (delay units) are connected in a ring shape. The clock generating unit 18b outputs a plurality of lower phase signals (lower phase signals CK1, CK3, CK5, and CK7 and lower phase signals xCK1, xCK2, xCK4, xCK6, and xCK8) according to output signals of the plurality of fully-differential delay circuits DE1 to DE8.

The lower phase signal (delayed signal) generated by the clock generating unit 18b is the same as the lower phase signal generated by the clock generating unit 18a shown in FIG. 1. That is, the clock generating unit 18b generates the lower phase signals CK1 to CK8 and the lower phase signals xCK1 to xCK8. The clock generating unit 18b outputs only some of the generated plurality of lower phase signals (the lower phase signals CK1 to CK8 and the lower phase signals xCK1 to xCK8) for latching by the latch unit 108b. A process in which the clock generating unit 18b outputs the lower phase signal xCK1 is different from the first embodiment.

In the second embodiment, the delay circuit 100b includes fully-differential delay circuits DE3, DE5, and DE7 which are a plurality of first delay units, fully-differential delay circuits DE2, DE4, DE6 and DE8 which are a plurality of second delay units, and a fully-differential delay circuit DE1 which is a third delay unit. The first delay units and the second delay units are arranged in pairs in the connection of the plurality of fully-differential delay circuits DE2 to DE8. Each first delay unit is connected between two of the second delay units. Each second delay unit is connected between two of the first delay units. That is, the first delay units and the second delay units are alternately arranged in the connection of the plurality of fully-differential delay circuits DE2 to DE8. The third delay unit is a delay unit different from the fully-differential delay circuit DE8 that outputs the lower phase signal xCK8 which is a reference signal (a count clock of the counting unit 101).

The clock generating unit 18b outputs the lower phase signals CK3, CK8, and CK7 which are a plurality of first output signals generated by the plurality of first delay units. Also, the clock generating unit 18b outputs the lower phase signals xCK2, xCK4, xCK6, and xCK8 which are a plurality of second output signals generated by the plurality of second delay units. Also, the clock generating unit 18b generates the lower phase signal CK1 which is the first output signal generated by the third delay unit and the lower phase signal xCK1 which is the second output signal generated by the third delay unit.

The latch unit 108b latches the plurality of lower phase signals (the lower phase signals CK1, CK3, CK8, and CK7 and the lower phase signals xCK1, xCK2, xCK4, xCK6, and xCK8) output from the clock generating unit 18b at the timing at which a control signal CO is input.

The encoding unit 106b encodes the states of the plurality of lower phase signals (the lower phase signals CK1, CK3, CK8, and CK7 and the lower phase signals xCK1, xCK2, xCK4, xCK6, and xCK8) latched by the latch unit 108b. Thereby, the encoding unit 106b obtains a binary number according to the states of the plurality of lower phase signals latched by the latch unit 108b.

The encoding unit 106b encodes the states of a plurality of lower phase signals by performing a first operation, a second operation, and a third operation. The signal group in the second embodiment is constituted of some of a plurality of lower phase signals latched by the latch unit 108b. Specifically, the signal group is constituted of lower phase signals other than the lower phase signal xCK1 among the plurality of lower phase signals latched by the latch unit 108b. The first operation in the second embodiment is substantially the same as the first operation in the first embodiment. The second operation in the second embodiment is substantially the same as the second operation in the first embodiment.

In the third operation in the second embodiment, the encoding unit 106b detects that the logic states of the first lower phase signal (first signal) and the second lower phase signal (second signal) are different. The first lower phase signal is the lower phase signal xCK8 included in the signal group. The second lower phase signal is a lower phase signal xCK1 not included in the signal group. Also, the second lower phase signal is a signal obtained by inverting the lower phase signal CK1 different from the first lower phase signal. Also, the second lower phase signal is a signal latched by the latch unit 108b. The third operation is performed between the first operation and the second operation.

The configuration shown in FIG. 6 is substantially the same as that shown in FIG. 1 except for the above points.

Figure 7:
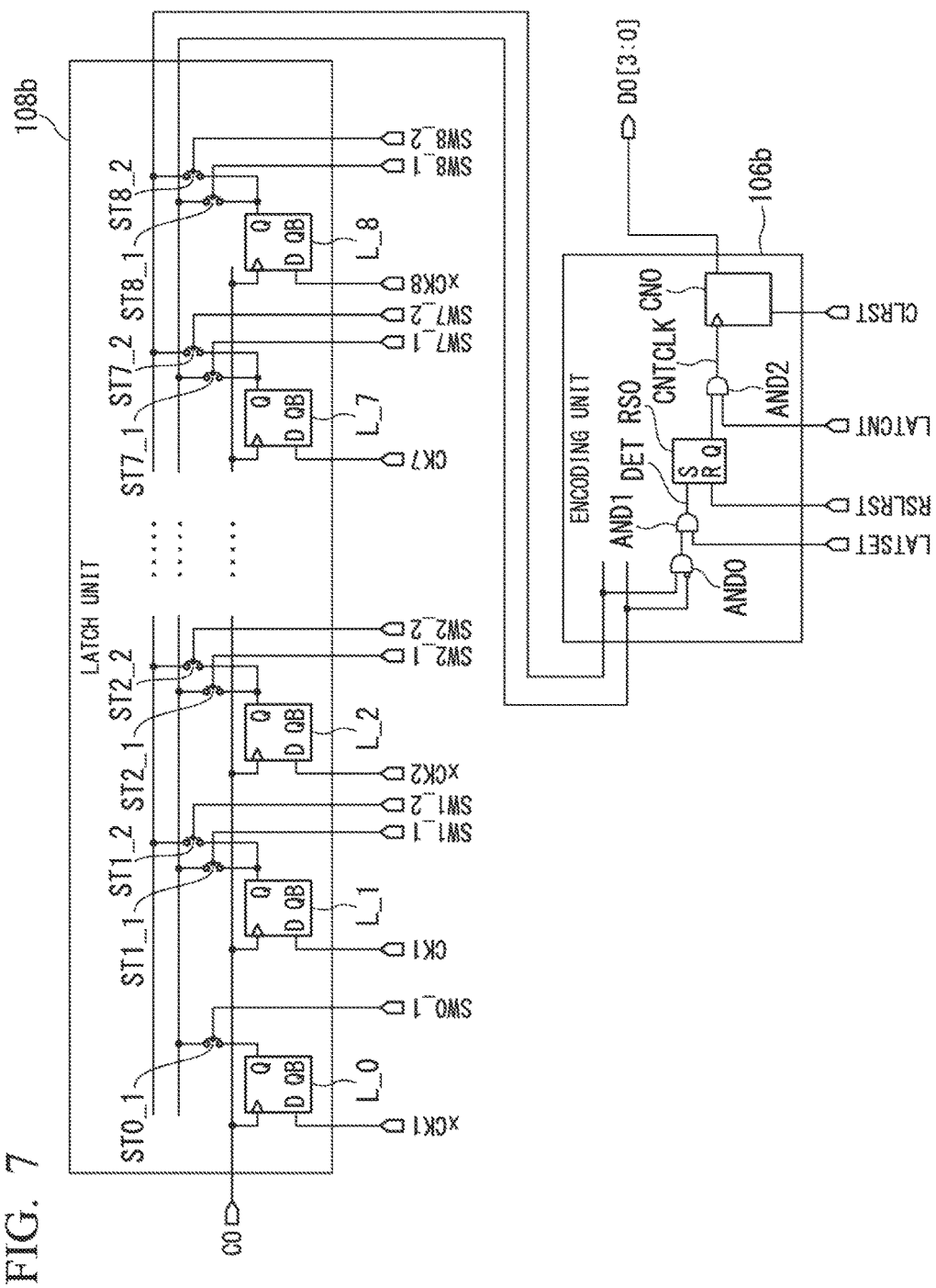
FIG. 7 is a block diagram showing configurations of a latch unit and an encoding unit according to the second embodiment of the present invention.

FIG. 7 shows the configurations of the latch unit 108b and the encoding unit 106b. Differences of the configuration shown in FIG. 7 from the configuration shown in FIG. 2 will be described.

The latch unit 108b includes a plurality of latch circuits L_0 to L_8, a plurality of switches ST0_1 to ST8_1, and a plurality of switches ST1_2 to ST8_2. For convenience, the latch circuits L_3 to L_6, the switches ST3_1 to ST6_1, and the switches ST3_2 to ST6_2 are not shown. The latch circuits L_0 to L_8 latch the states of a plurality of lower phase signals (lower phase signals CK1, CK3, CK5, and CK7 and lower phase signals xCK1, xCK2, xCK4, xCK6, and xCK8) at the timing at which the control signal CO from a comparing unit (not shown) is inverted. Control signals SW0_1 to SW8_1 and control signals SW1_2 to SW8_2 are signals for controlling the switches ST0_1 to ST8_1 and the switches ST1_2 to ST8_2 for outputting any one of the plurality of lower phase signals latched by the latch circuits L_0 to L_8 from the output terminals Q of the latch circuits L_0 to L_8 to the encoding unit 106b. In the latch unit 108b, the latch circuit L_0 and the switch ST0_1 are added to the configuration of the latch unit 108a shown in FIG. 2. Also, in the latch unit 108b, the switch xST8_1 is deleted from the configuration of the latch unit 108a shown in FIG. 2. A signal obtained by inverting the lower phase signal xCK1 output from the output terminal Q of the latch circuit L_0 via the switch ST0_1 is input to the first input terminal of the AND circuit AND0.

The configuration of the encoding unit 106b is the same as that of the encoding unit 106a shown in FIG. 2. The lower phase signal input to the encoding unit 106b is different from the lower phase signal input to the encoding unit 106a shown in FIG. 2. Thus, the operation of the encoding unit 106b is different from the operation of the encoding unit 106a shown in FIG. 2.

The configuration shown in FIG. 7 is substantially the same as that shown in FIG. 2 except for the above points.

Figure 8:
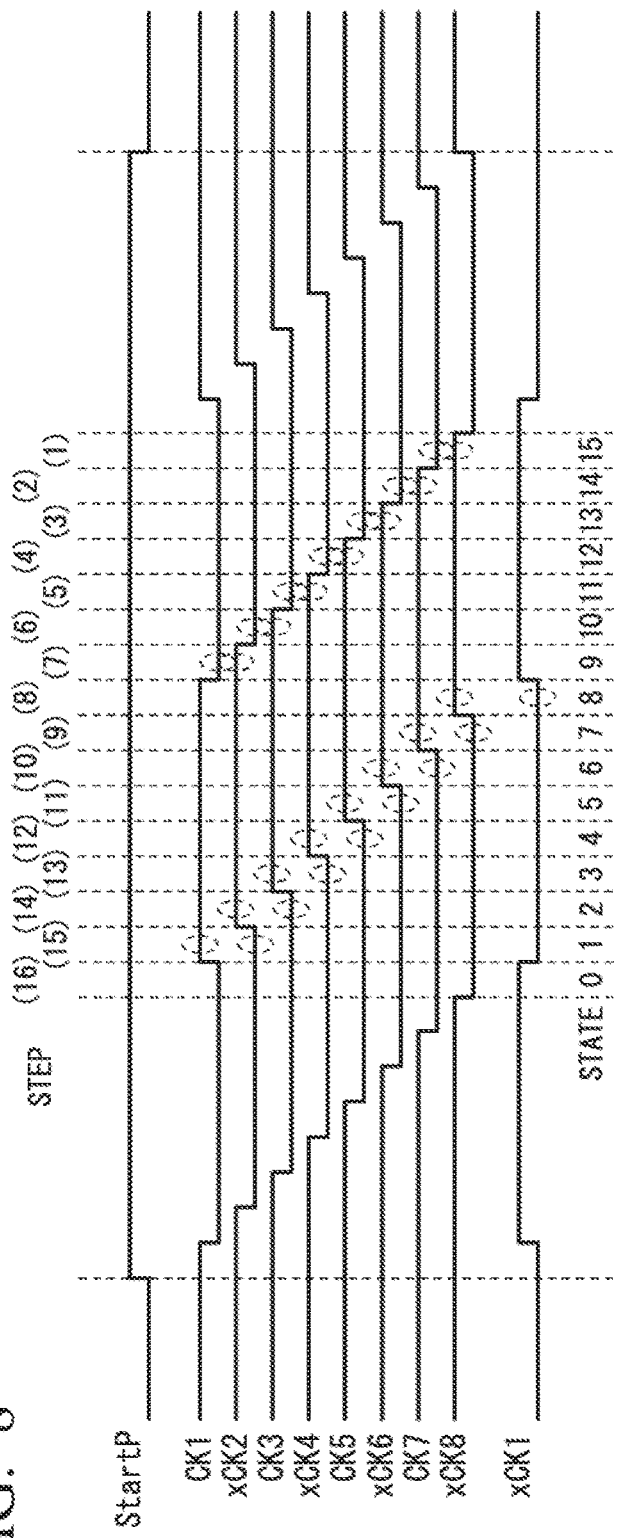
FIG. 8 is a timing chart showing an operation of the encoding circuit according to the second embodiment of the present invention.

A procedure of encoding by the encoding circuit 10b will be described. FIG. 8 shows the waveforms of the start pulse StartP, the lower phase signals CK1, CK3, CK5, and CK7 and the lower phase signals xCK1, xCK2, xCK4, xCK6, and xCK8 in the encoding circuit 10b. In FIG. 8, the horizontal direction indicates time and the vertical direction indicates voltage.

In FIG. 8, the lower phase signals CK1, CK3, CK5, and CK7 and the lower phase signals xCK2, xCK4, xCK6, and xCK8 are arranged to constitute a group of signals falling (changing from the H state to the L state) sequentially at predetermined time intervals. Specifically, the lower phase signals are arranged in the order of the lower phase signals CK1, xCK2, CK3, xCK4, CK8, xCK6, CK7, and xCK8. In this signal group, the plurality of lower phase signals are arranged in an order according to an order of connection of the plurality of fully-differential delay circuits DE1 to DE8 on the basis of the lower phase signal xCK8 which is the count clock of the counting unit 101. In the order of connection of the plurality of fully-differential delay circuits DE1 to DE8, the lower phase signals output from the preceding fully-differential delay circuits are arranged at preceding positions in the signal group.

Specifically, the lower phase signal CK1 from the fully-differential delay circuit DE1 connected to the fully-differential delay circuit DE8 that outputs the lower phase signal xCK8 is arranged at the head. Also, the lower phase signals output from the fully-differential delay circuits are arranged so that the order of the plurality of lower phase signals is the same as the order of connection of the fully-differential delay circuits DE1 to DE8. In addition to the plurality of lower phase signals constituting the signal group, a lower phase signal xCK1 output from the fully-differential delay circuit DE1 is arranged. The plurality of lower phase signals may be arranged to constitute a group of signals rising (changing from the L state to the H state) sequentially at predetermined time intervals. One of the lower phase signals CK2, xCK3, CK4, xCK8, CK6, and xCK7 obtained by inverting one of the lower phase signals xCK2, CK3, xCK4, CK8, xCK6, and CK7 having a falling edge between the falling edge of the lower phase signal CK1 and the falling edge of the lower phase signal xCK8 may be used instead of the lower phase signal xCK1.

The logic states of two continuous lower phase signals are sequentially detected in the signal group (signal string) in which the plurality of lower phase signals latched by the latch unit 108b are arranged in the above-described order and the lower phase signal xCK1. When it is detected that the logic states of two continuous lower phase signals are predetermined states (thermometer codes), the states of a plurality of lower phase signals are determined according to a position at which the states are detected.

For example, the logic states of two continuous lower phase signals are sequentially detected from the bottom to the top of the signal group shown in FIG. 8 and the lower phase signal xCK1. In the case of states 9 to 15, in the signal group, the logic state changes from the H state to the L state between two continuous lower phase signals. In the case of state 8, the logic state changes from the L state to the H state between the lower phase signal xCK1 not included in the signal group and the lower phase signal xCK8 included in the signal group. In the case of states 1 to 7, in the signal group, the logic state changes from the L state to the H state between two continuous lower phase signals. In the case of state 0, in the signal group, the logic states of all the lower phase signals are the L state. In the second embodiment, when states 1 to 15 are not detected, it is determined that the state of each of the plurality of lower phase signals is state 0.

Specifically, encoding is performed by performing the following processing of steps (1) to (15) in time series.

(Step (1)) . . . Determination related to state 15

The logic states of the lower phase signal xCK8 and the lower phase signal CK7 are compared. If there is a thermometer code "10" at this position, the state of each of a plurality of lower phase signals is determined to be state 15. Step (1) corresponds to the first operation.

(Step (2)) . . . Determination related to state 14

The logic states of the lower phase signal CK7 and the lower phase signal xCK6 are compared. If there is a thermometer code "10" at this position, the state of each of a plurality of lower phase signals is determined to be state 14. Step (2) corresponds to the first operation.

(Step (3)) . . . Determination related to state 13

The logic states of the lower phase signal xCK6 and the lower phase signal CK8 are compared. If there is a thermometer code "10" at this position, the state of each of a plurality of lower phase signals is determined to be state 13. Step (3) corresponds to the first operation.

(Step (4)) . . . Determination related to state 12

The logic states of the lower phase signal CK8 and the lower phase signal xCK4 are compared. If there is a thermometer code "10" at this position, the state of each of a plurality of lower phase signals is determined to be state 12. Step (4) corresponds to the first operation.

(Step (5)) . . . Determination related to state 11

The logic states of the lower phase signal xCK4 and the lower phase signal CK3 are compared. If there is a thermometer code "10" at this position, the state of each of a plurality of lower phase signals is determined to be state 11. Step (5) corresponds to the first operation.

(Step (6)) . . . Determination related to state 10

The logic states of the lower phase signal CK3 and the lower phase signal xCK2 are compared. If there is a thermometer code "10" at this position, the state of each of a plurality of lower phase signals is determined to be state 10. Step (6) corresponds to the first operation.

(Step (7)) . . . Determination related to state 9

The logic states of the lower phase signal xCK2 and the lower phase signal CK1 are compared. If there is a thermometer code "10" at this position, the state of each of a plurality of lower phase signals is determined to be state 9. Step (7) corresponds to the first operation.

(Step (8)) . . . Determination related to state 8

The logic states of the lower phase signal xCK1 and the lower phase signal xCK8 are compared. If there is a thermometer code "01" at this position, the state of each of a plurality of lower phase signals is determined to be state 8. Step (8) corresponds to the third operation.

(Step (9)) . . . Determination related to state 7

The logic states of the lower phase signal xCK8 and the lower phase signal CK7 are compared. If there is a thermometer code "01" at this position, the state of each of a plurality of lower phase signals is determined to be state 7. Step (9) corresponds to the second operation.

(Step (10)) . . . Determination related to state 6

The logic states of the lower phase signal CK7 and the lower phase signal xCK6 are compared. If there is a thermometer code "01" at this position, the state of each of a plurality of lower phase signals is determined to be state 6. Step (10) corresponds to the second operation.

(Step (11)) . . . Determination related to state 5

The logic states of the lower phase signal xCK6 and the lower phase signal CK8 are compared. If there is a thermometer code "01" at this position, the state of each of a plurality of lower phase signals is determined to be state 5. Step (11) corresponds to the second operation.

(Step (12)) . . . Determination related to state 4

The logic states of the lower phase signal CK8 and the lower phase signal xCK4 are compared. If there is a thermometer code "01" at this position, the state of each of a plurality of lower phase signals is determined to be state 4. Step (12) corresponds to the second operation.

(Step (13)) . . . Determination related to state 3

The logic states of the lower phase signal xCK4 and the lower phase signal CK3 are compared. If there is a thermometer code "01" at this position, the state of each of a plurality of lower phase signals is determined to be state 3. Step (13) corresponds to the second operation.

(Step (14)) . . . Determination related to state 2

The logic states of the lower phase signal CK3 and the lower phase signal xCK2 are compared. If there is a thermometer code "01" at this position, the state of each of a plurality of lower phase signals is determined to be state 2. Step (14) corresponds to the second operation.

(Step (15)) . . . Determination related to state 1

The logic states of the lower phase signal xCK2 and the lower phase signal CK1 are compared. If there is a thermometer code "01" at this position, the state of each of a plurality of lower phase signals is determined to be state 1. Step (15) corresponds to the second operation.

Steps (1) to (7) and steps (9) to (15) in the second embodiment are the same as those in the first embodiment. Step (8) in the second embodiment is different from step (8) in the first embodiment. In steps (1) to (15), if it is determined that the state of each of the plurality of lower phase signals is not any one of states 1 to 15, the state of each of the plurality of lower phase signals is state 0. Thus, no particular determination related to state 0 is necessary. When the encoding unit 106b detects the thermometer code, the control signals SW0_1 to SW8_1 and the control signals SW1_2 to SW8_2 are controlled so that the above-described procedure is implemented.

Figure 9:
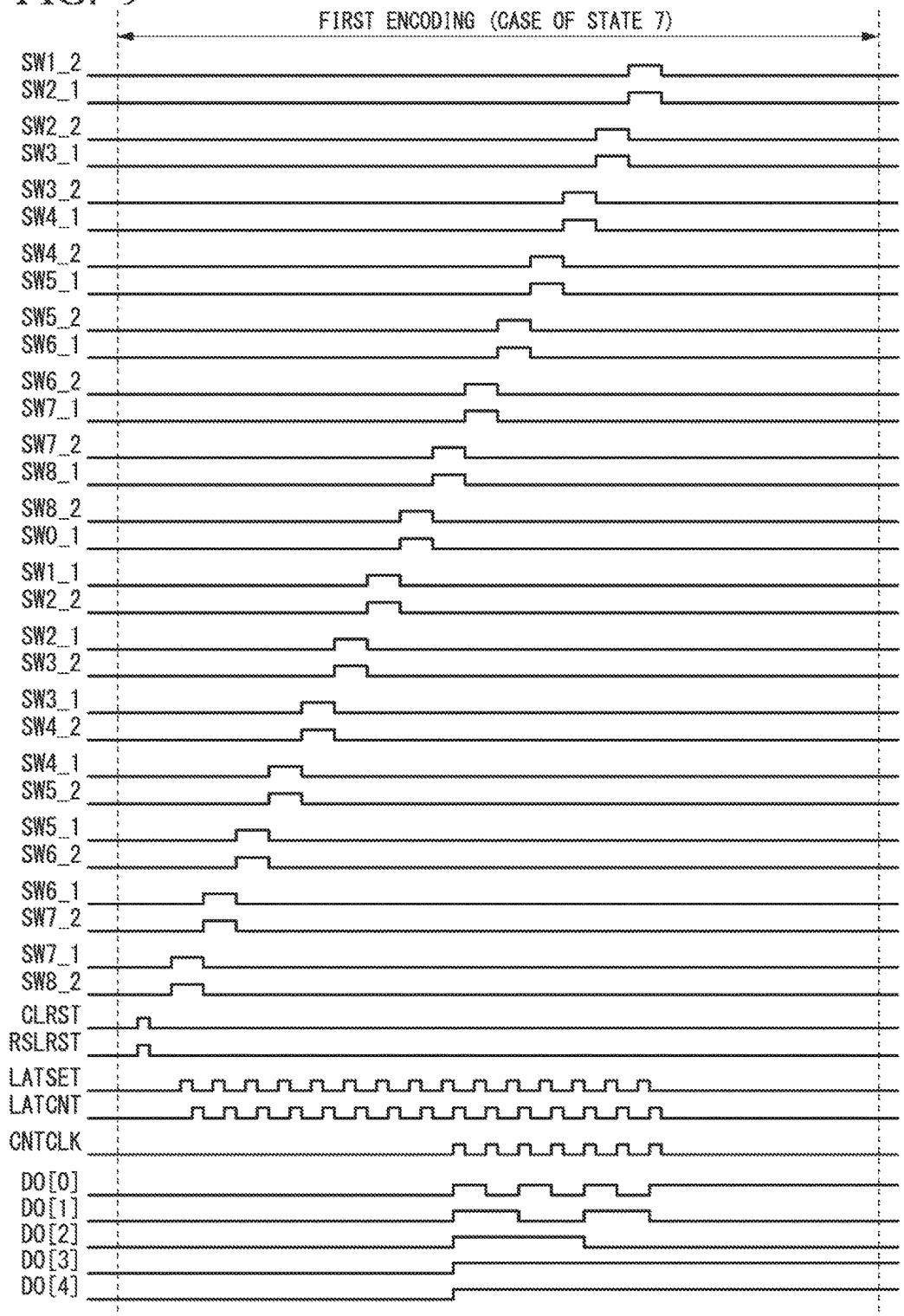
FIG. 9 is a timing chart showing an encoding procedure according to the second embodiment of the present invention.
Figure 10:
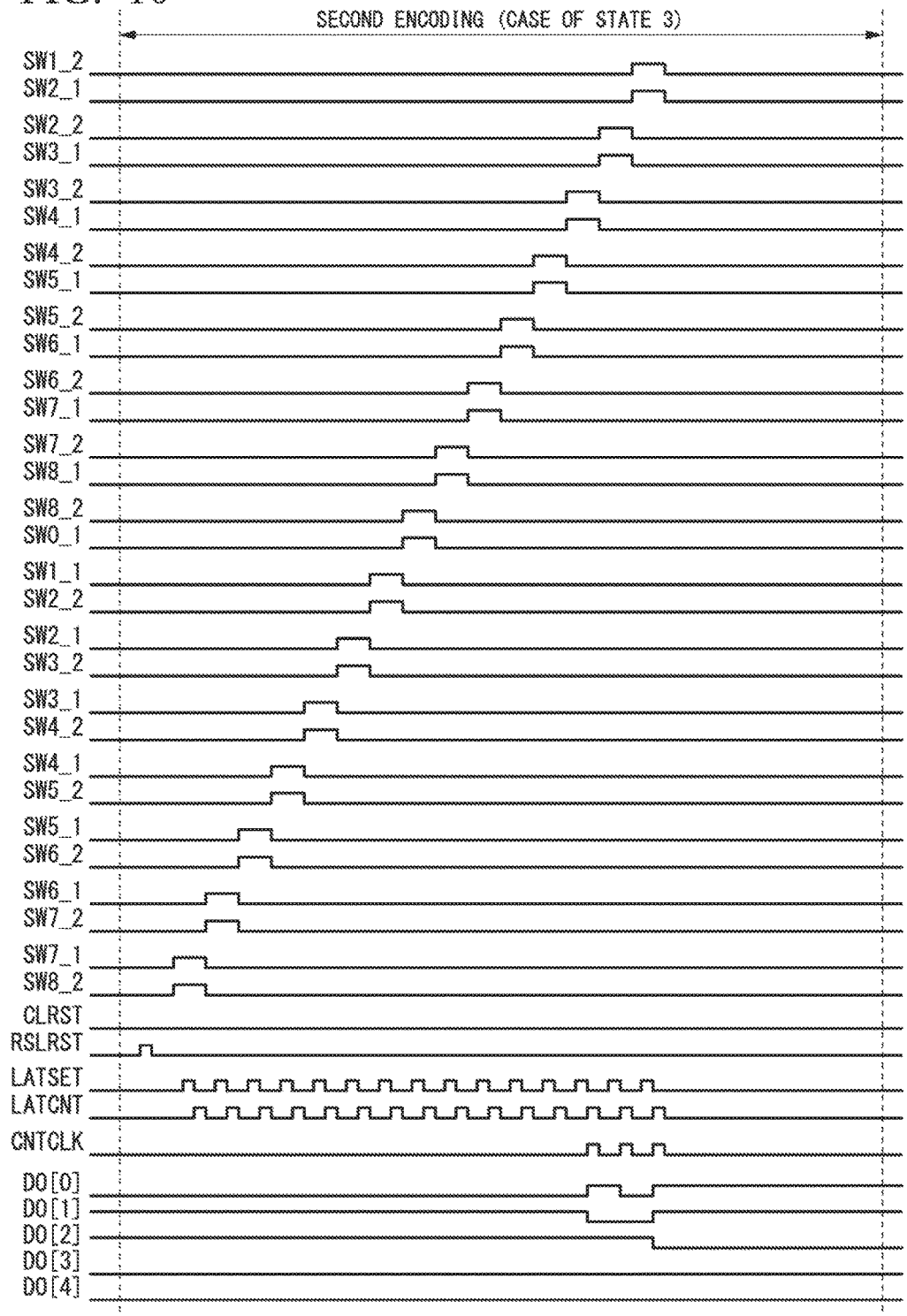
FIG. 10 is a timing chart showing an encoding procedure according to the second embodiment of the present invention.

FIGS. 9 and 10 show waveforms of encoding-related signals. In FIGS. 9 and 10, the horizontal direction indicates time and the vertical direction indicates voltage. An example in which first encoding which is the encoding of state 7 and second encoding which is the encoding of state 3 are performed continuously will be described. This example is applicable to the subtraction of the reset level and the signal level in the imaging device. In this example, a value of −4 is obtained by subtracting an encoded value of 7 corresponding to the state 7 from an encoded value of 3 corresponding to state 3.

The outline of the operation will be described. A lower phase signal CK* or a lower phase signal xCK* is output from any two of the latch circuits L_0 to L_8 by which the lower phase signals CK1, CK3, CK8, and CK7 and the lower phase signals xCK1, xCK2, xCK4, xCK6, and xCK8 are latched according to the control signals SW0_1 to SW8_1 and the control signals SW1_2 to SW8_2. * in the description of the second embodiment denotes an integer of 1 to 8. The lower phase signal CK* or the lower phase signal xCK* output from the two latch circuits is input to the encoding unit 106b. The encoding unit 106b detects the thermometer code on the basis of the input lower phase signal CK* or the lower phase signal xCK*. In this example, the thermometer code is a logic state corresponding to an edge position changing from the H state to the L state and an edge position changing from the L state to the H state.

If a result of an AND operation on the lower phase signal CK* or the lower phase signal xCK* output from one latch circuit L_* and a signal obtained by inverting the lower phase signal CK* or the lower phase signal xCK* output from another latch circuit L_0 or L_* indicates the H state, the thermometer code is detected. At the timing at which the thermometer code is detected, the generation of the lower count signal CNTCLK having a number of pulses according to the states of the lower phase signals CK1, CK3, CK5, and CK7 and the lower phase signals xCK1, xCK2, xCK4, xCK6, and xCK8 starts. At the same time, the counter circuit CN0 starts the counting of the lower count signal CNTCLK. Count values DO[0] to DO[3] of the counter circuit CN0 when the count operation is completed are encoding results.

Detailed operations in steps (1) to (15) will be described. At the timing at which the predetermined condition is satisfied, the logic state of the control signal CO from the comparing unit (not shown) changes. Thereby, the logic states of the lower phase signals CK1, CK3, CK5, and CK7 and the lower phase signals xCK1, xCK2, xCK4, xCK6, and xCK8 output from the clock generating unit 18b are latched by the latch unit 108b.

Subsequently, the first encoding shown in FIG. 9 starts. The RS latch RS0 is reset by the control signal RSLRST. At this time, the output signal of the RS latch RS0 is in the L state. Also, the counter circuit CN0 is reset by the control signal CLRST. At this time, the count value of the counter circuit CN0 is the initial value of the first encoding, i.e., 4'b[0]0000. After the RS latch RS0 and the counter circuit CN0 are reset, the control signals SW0_1 to SW8_1 and the control signals SW1_2 to SW8_2 change to the H state in a predetermined order.

(Step (1))

The control signal SW8_2 and the control signal SW7_1 change to the H state. Thereby, the lower phase signal xCK8 (L state) latched by the latch circuit L_8 and a signal obtained by inverting the lower phase signal CK7 (H state) latched by the latch circuit L_7 are input to the AND circuit AND0. At this time, the output signal of the AND circuit AND0 is in the L state. The control signal LATSET changes from the L state to the H state and then changes to the L state. Meanwhile, the detection signal DET is kept in the L state. Thus, the output signal of the RS latch RS0 is kept in the L state. As a result, the lower count signal CNTCLK is in the L state. At this time, the count value of the counter circuit CN0 is the initial value of the first encoding.

(Steps (2) to (7))

As the same in step (1), the lower phase signal CK* or the lower phase signal xCK* output from one latch circuit L_* and a signal obtained by inverting the lower phase signal CK* or the lower phase signal xCK* output from another latch circuit L_* are input to the AND circuit AND0. In any of steps (2) to (7), the output signal of the AND circuit AND0 is in the L state. The control signal LATSET changes from the L state to the H state and then changes to the L state. Meanwhile, the detection signal DET is kept in the L state. Thus, the output signal of the RS latch RS0 is kept in the L state. As a result, the lower count signal CNTCLK is in the L state. At this time, the count value of the counter circuit CN0 is the initial value of the first encoding.

(Step (8))

The control signal SW0_1 and the control signal SW8_2 change to the H state. Thereby, a signal obtained by inverting the lower phase signal xCK1 (L state) latched by the latch circuit L_0 and the lower phase signal xCK8 (L state) latched by the latch circuit L_8 are input to the AND circuit AND0. At this time, the output signal of the AND circuit AND0 is in the L state. The control signal LATSET changes from the L state to the H state and then changes to the L state. Meanwhile, the detection signal DET is kept in the L state. Thus, the output signal of the RS latch RS0 is kept in the L state. As a result, the lower count signal CNTCLK is in the L state. At this time, the count value of the counter circuit CN0 is the initial value of the first encoding.

(Step (9))

The control signal SW8_1 and the control signal SW7_2 change to the H state. Thereby, a signal obtained by inverting the lower phase signal xCK8 (L state) latched by the latch circuit L_8 and the lower phase signal CK7 (H state) latched by the latch circuit L_7 are input to the AND circuit AND0. At this time, the output signal of the AND circuit AND0 is in the H state. The control signal LATSET changes from the L state to the H state and then changes to the L state. Meanwhile, the detection signal DET changes from the L state to the H state and then changes to the L state. Thereby, the output signal of the RS latch RS0 changes to the H state. The control signal LATCNT changes from the L state to the H state and then changes to the L state. Thereby, the AND circuit AND2 outputs a lower count signal CNTCLK of one pulse. The counter circuit CN0 performs a count operation on the basis of the lower count signal CNTCLK. Thus, the count value of the counter circuit CN0 decreases.

(Steps (10) to (15))

As the same in step (9), a signal obtained by inverting the lower phase signal CK* or the lower phase signal xCK* output from one latch circuit L_* and the lower phase signal CK* or the lower phase signal xCK* output from another latch circuit L_* are input to the AND circuit AND0. In any of steps (10) to (15), regardless of the output signal of the AND circuit AND0, the output signal of the RS latch RS0 is kept in the H state. The control signal LATCNT changes from the L state to the H state and then changes to the L state. Thereby, in each step, the AND circuit AND2 outputs a lower count signal CNTCLK of one pulse. The counter circuit CN0 performs a count operation on the basis of the lower count signal CNTCLK. Thus, the count value of the counter circuit CN0 decreases.

When the processing of step (15) is completed, the count value of the counter circuit CN0 is 4'b[1]1001. This count value corresponds to −7. Upon completion of the processing of step (15), the first encoding shown in FIG. 9 is completed.

After the processing of step (15) is completed, the count value of the counter circuit CN0 is inverted. At this time, the count value of the counter circuit CN0 is 4'b[0]0110. This count value corresponds to 6.

Subsequently, the second encoding shown in FIG. 10 starts. The RS latch RS0 is reset by the control signal RSLRST. The counter circuit CN0 is not reset by the control signal CLRST. At this time, the count value of the counter circuit CN0 is the initial value of the second encoding, i.e., 4'b[0]0110. After the RS latch RS0 is reset, the control signals SW0_1 to SW8_1 and the control signals SW1_2 to SW8_2 change to the H state in a predetermined order.

(Step (1))

The control signal SW8_2 and the control signal SW7_1 change to the H state. Thereby, the lower phase signal xCK8 (L state) latched by the latch circuit L_8 and a signal obtained by inverting the lower phase signal CK7 (L state) latched by the latch circuit L_7 are input to the AND circuit AND0. At this time, the output signal of the AND circuit AND0 is in the L state. The control signal LATSET changes from the L state to the H state and then changes to the L state. Meanwhile, the detection signal DET is kept in the L state. Thus, the output signal of the RS latch RS0 is kept in the L state. As a result, the lower count signal CNTCLK is in the L state. At this time, the count value of the counter circuit CN0 is the initial value of the second encoding.

(Steps (2) to (7))

As the same in step (1), the lower phase signal CK* or the lower phase signal xCK* output from one latch circuit L_* and a signal obtained by inverting the lower phase signal CK* or the lower phase signal xCK* output from another latch circuit L_* are input to the AND circuit AND0. In any of steps (2) to (7), the output signal of the AND circuit AND0 is in the L state. The control signal LATSET changes from the L state to the H state and then changes to the L state. Meanwhile, the detection signal DET is kept in the L state. Thus, the output signal of the RS latch RS0 is kept in the L state. As a result, the lower count signal CNTCLK is in the L state. At this time, the count value of the counter circuit CN0 is the initial value of the second encoding, (Step (8))

The control signal SW0_1 and the control signal SW8_2 change to the H state. Thereby, a signal obtained by inverting the lower phase signal xCK1 (L state) latched by the latch circuit L_0 and the lower phase signal xCK8 (L state) latched by the latch circuit L_8 are input to the AND circuit AND0. At this time, the output signal of the AND circuit AND0 is in the L state. The control signal LATSET changes from the L state to the H state and then changes to the L state. Meanwhile, the detection signal DET is kept in the L state. Thus, the output signal of the RS latch RS0 is kept in the L state. As a result, the lower count signal CNTCLK is in the L state. At this time, the count value of the counter circuit CN0 is the initial value of the second encoding.

(Step (9))

The control signal SW8_1 and the control signal SW7_2 change to the H state. Thereby, a signal obtained by inverting the lower phase signal xCK8 (L state) latched by the latch circuit L_8 and the lower phase signal CK7 (L state) latched by the latch circuit L_7 are input to the AND circuit AND0. At this time, the output signal of the AND circuit AND0 is in the L state. The control signal LATSET changes from the L state to the H state and then changes to the L state. Meanwhile, the detection signal DET is kept in the L state. Thus, the output signal of the RS latch RS0 is kept in the L state. As a result, the lower count signal CNTCLK is in the L state. At this time, the count value of the counter circuit CN0 is the initial value of the second encoding.

(Steps (10) to (12))

As the same in step (9), a signal obtained by inverting the lower phase signal CK* or the lower phase signal xCK* output from one latch circuit L_* and the lower phase signal CK* or the lower phase signal xCK* output from another latch circuit L_* are input to the AND circuit AND0. In any of steps (10) to (12), the output signal of the AND circuit AND0 is in the L state. The control signal LATSET changes from the L state to the H state and then changes to the L state. Meanwhile, the detection signal DET is kept in the L state. Thus, the output signal of the RS latch RS0 is kept in the L state. As a result, the lower count signal CNTCLK is in the L state. At this time, the count value of the counter circuit CN0 is the initial value of the second encoding.

(Step (13))

The control signal SW4_1 and the control signal SW3_2 change to the H state. Thereby, a signal obtained by inverting the lower phase signal xCK4 (L state) latched by the latch circuit L_4 and the lower phase signal CK3 (H state) latched by the latch circuit L_3 are input to the AND circuit AND0. At this time, the output signal of the AND circuit AND0 is in the H state. The control signal LATSET changes from the L state to the H state and then changes to the L state. Meanwhile, the detection signal DET changes from the L state to the H state and then changes to the L state. Thereby, the output signal of the RS latch RS0 changes to the H state. The control signal LATCNT changes from the L state to the H state and then changes to the L state. Thereby, the AND circuit AND2 outputs a lower count signal CNTCLK of one pulse. The counter circuit CN0 performs a count operation on the basis of the lower count signal CNTCLK. Thus, the count value of the counter circuit CN0 decreases.

(Steps (14) and (15))

As the same in step (9), a signal obtained by inverting the lower phase signal CK* or the lower phase signal xCK* output from one latch circuit L_* and the lower phase signal CK* or the lower phase signal xCK*output from another latch circuit L_* are input to the AND circuit AND0. In both of steps (14) and (15), regardless of the output signal of the AND circuit AND0, the output signal of the RS latch RS0 is kept in the H state. The control signal LATCNT changes from the L state to the H state and then changes to the L state. Thereby, in each step, the AND circuit AND2 outputs a lower count signal CNTCLK of one pulse. The counter circuit CN0 performs a count operation on the basis of the lower count signal CNTCLK. Thus, the count value of the counter circuit CN0 decreases.

When the processing of step (15) is completed, the count value of the counter circuit CN0 is 4'b[0]0011. This count value corresponds to 3. Upon completion of the processing of step (15), the second encoding shown in FIG. 10 is completed.

After the processing of step (15) is completed, the count value of the counter circuit CN0 is inverted. At this time, the count value of the counter circuit CN0 is 4'b[1]1100. This count value corresponds to −4. That is, the value of −4 is obtained by subtracting an encoded value of 7 corresponding to state 7 from an encoded value of 3 corresponding to state 3.

In the second embodiment, the number of lower phase signals latched by the latch unit 108b is reduced. As a result, the circuit scale of the latch unit 108b can be reduced. For example, the circuit scale of the latch unit 108b is about half that of the latch unit 1108a shown in FIG. 37.

In the second embodiment, the encoding circuit 10b has the same advantages as the conventional encoding circuit. That is, even when the number of clocks generated by the clock generating unit 18b is large, the circuit scale of the encoding circuit 10b is small and the configuration of the encoding circuit 10b is simple.

(Third Embodiment)

Figure 11:
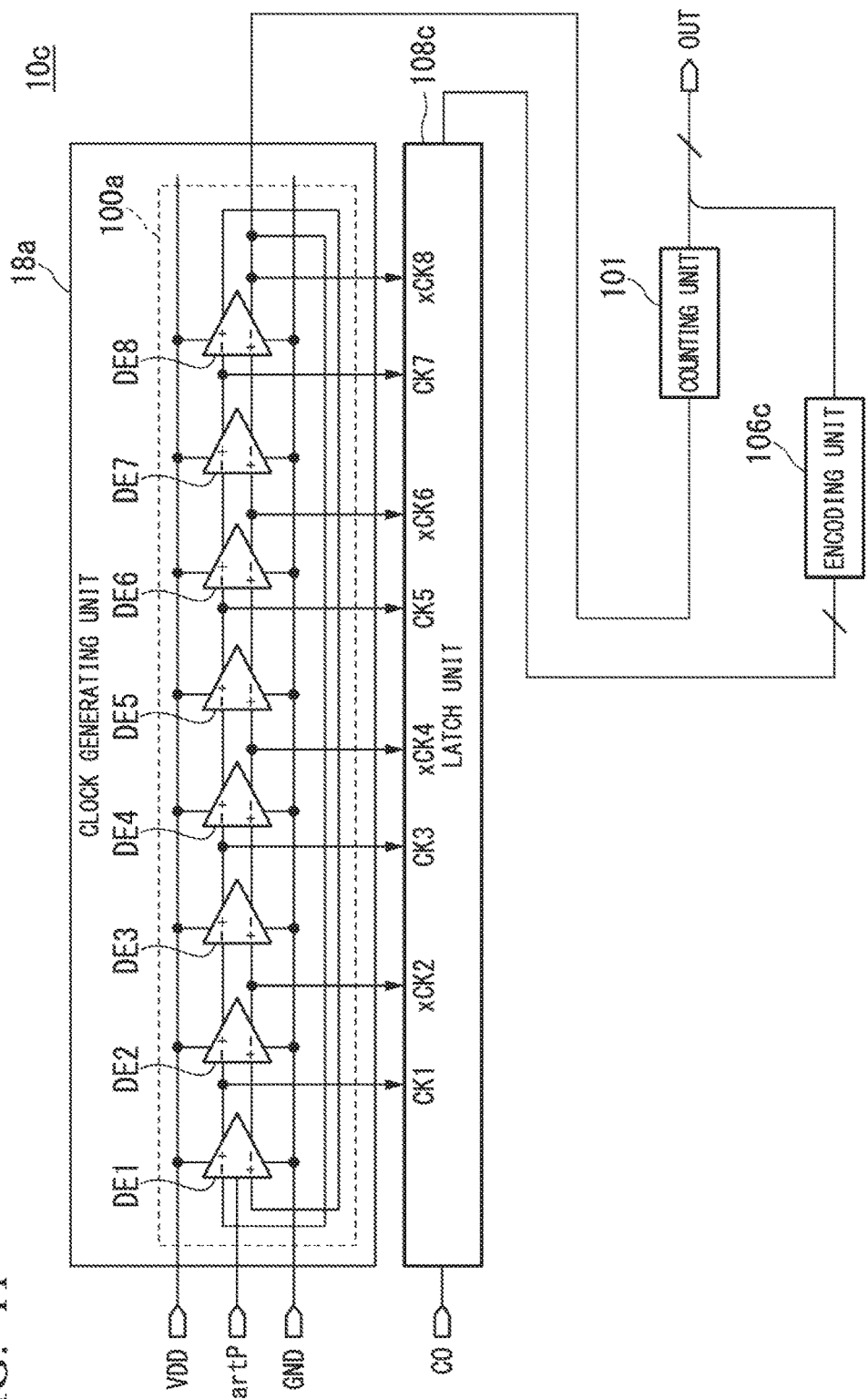
FIG. 11 is a block diagram showing a configuration of an encoding circuit according to a third embodiment of the present invention.

FIG. 11 shows a configuration of an encoding circuit 10c according to the third embodiment of the present invention. As shown in FIG. 11, the encoding circuit 10c includes a clock generating unit 18a, a latch unit 108c, a counting unit 101, and an encoding unit 106c.

Differences of the configuration shown in FIG. 11 from the configuration shown in FIG. 1 will be described. The latch unit 108c latches a plurality of lower phase signals (lower phase signals CK1, CK3, CK5, and CK7 and lower phase signals xCK2, xCK4, xCK6, and xCK8) output from the clock generating unit 18a at the timing at which a control signal CO is input. The configuration of the latch unit 108c is different from that of the latch unit 108a shown in FIG. 1.

The encoding unit 106c encodes the states of the plurality of lower phase signals (the lower phase signals CK1, CK3, CK5, and CK7 and the lower phase signals xCK2, xCK4, xCK6, and xCK8) latched by the latch unit 108c. Thereby, the encoding unit 106c obtains a binary number according to the states of the plurality of lower phase signals latched by the latch unit 108c.

The encoding unit 106c encodes states of a plurality of lower phase signals by performing a first operation, a second operation, and a third operation. A signal group in the third embodiment is constituted of all the plurality of lower phase signals latched by the latch unit 108c. The first operation in the third embodiment is substantially the same as the first operation in the first embodiment. The second operation in the third embodiment is substantially the same as the second operation in the first embodiment.

In the third operation in the third embodiment, the encoding unit 106c detects that the logic states of the first lower phase signal (first signal) and the second lower phase signal (second signal) are different. The first lower phase signal is the lower phase signal xCK8 included in the signal group. The second lower phase signal is a lower phase signal xCK3 not included in the signal group. Also, the second lower phase signal is a signal obtained by inverting the lower phase signal CK3 different from the first lower phase signal. Also, the second lower phase signal is a signal generated from the lower phase signal CK3 latched by the latch unit 108c. The third operation is performed between the first operation and the second operation.

The configuration shown in FIG. 11 is substantially the same as that shown in FIG. 1 except for the above points.

Figure 12:
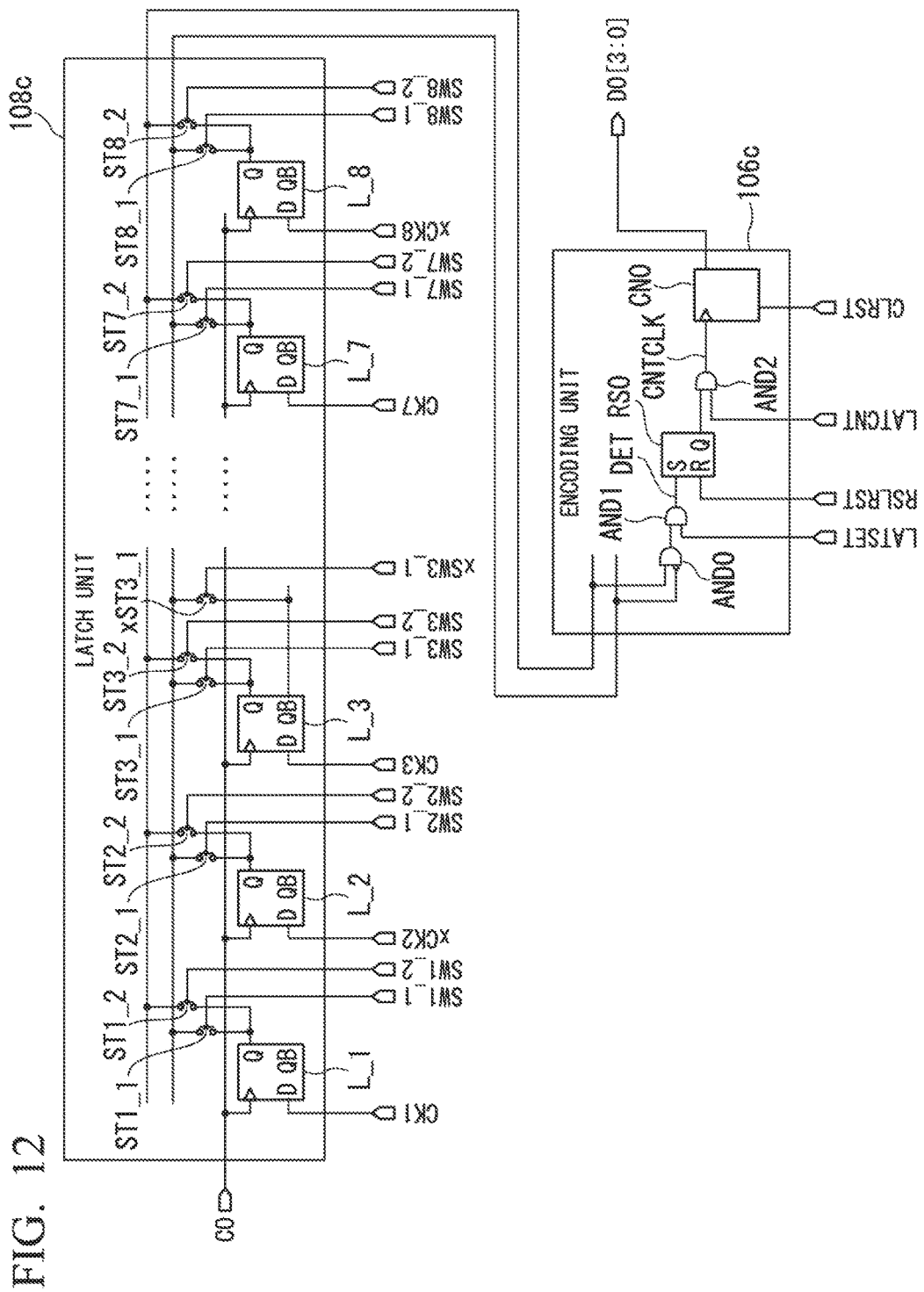
FIG. 12 is a block diagram showing configurations of a latch unit and an encoding unit according to the third embodiment of the present invention.

FIG. 12 shows configurations of the latch unit 108c and the encoding unit 106c. Differences of the configuration shown in FIG. 12 from the configuration shown in FIG. 2 will be described.

The latch unit 108c includes a plurality of latch circuits L_1 to L_8, a plurality of switches ST1_1 to ST8_1, a plurality of switches ST1_2 to ST8_2, and a switch xST3_1. For convenience, the latch circuits L_4 to L_6, the switches ST4_1 to ST6_1, and the switches ST4_2 to ST6_2 are not shown. The latch circuits L_1 to L_8 latch states of a plurality of lower phase signals (lower phase signals CK1, CK3, CK5, and CK7 and lower phase signals xCK2, xCK4, xCK6, and xCK8) at the timing at which the control signal CO from the comparing unit (not shown) is inverted. Control signals SW1_1 to SW8_1 and control signals SW1_2 to SW8_2 are signals which control the switches ST1_1 to ST8_1 and the switches ST1_2 to ST8_2 for outputting any one of the plurality of lower phase signals latched by the latch circuits L_1 to L_8 from the output terminals Q of the latch circuits L_1 to L_8 to the encoding unit 106c. The control signal xSW3_1 is a signal which controls the switch xST3_1 for outputting a signal (corresponding to the lower phase signal xCK3) obtained by inverting the lower phase signal CK3 latched by the latch circuit L_3 from the inverting output terminal QB of the latch circuit L_3 to the encoding unit 106c. In the latch unit 108c, the switch xST8_1 is deleted from the configuration of the latch unit 108a shown in FIG. 2. In the latch unit 108c, the switch xST3_1 is added to the configuration of the latch unit 108a shown in FIG. 2. A signal obtained by inverting the lower phase signal xCK3 output from the inverting output terminal QB of the latch circuit L_3 via the switch xST3_1 is input to the first input terminal of the AND circuit AND0.

The configuration of the encoding unit 106c is the same as that of the encoding unit 106a shown in FIG. 2. The lower phase signal input to the encoding unit 106c is different from the lower phase signal input to the encoding unit 106a shown in FIG. 2. Thus, the operation of the encoding unit 106c is different from the operation of the encoding unit 106a shown in FIG. 2.

The configuration shown in FIG. 12 is substantially the same as that shown in FIG. 2 except for the above points.

Figure 13:
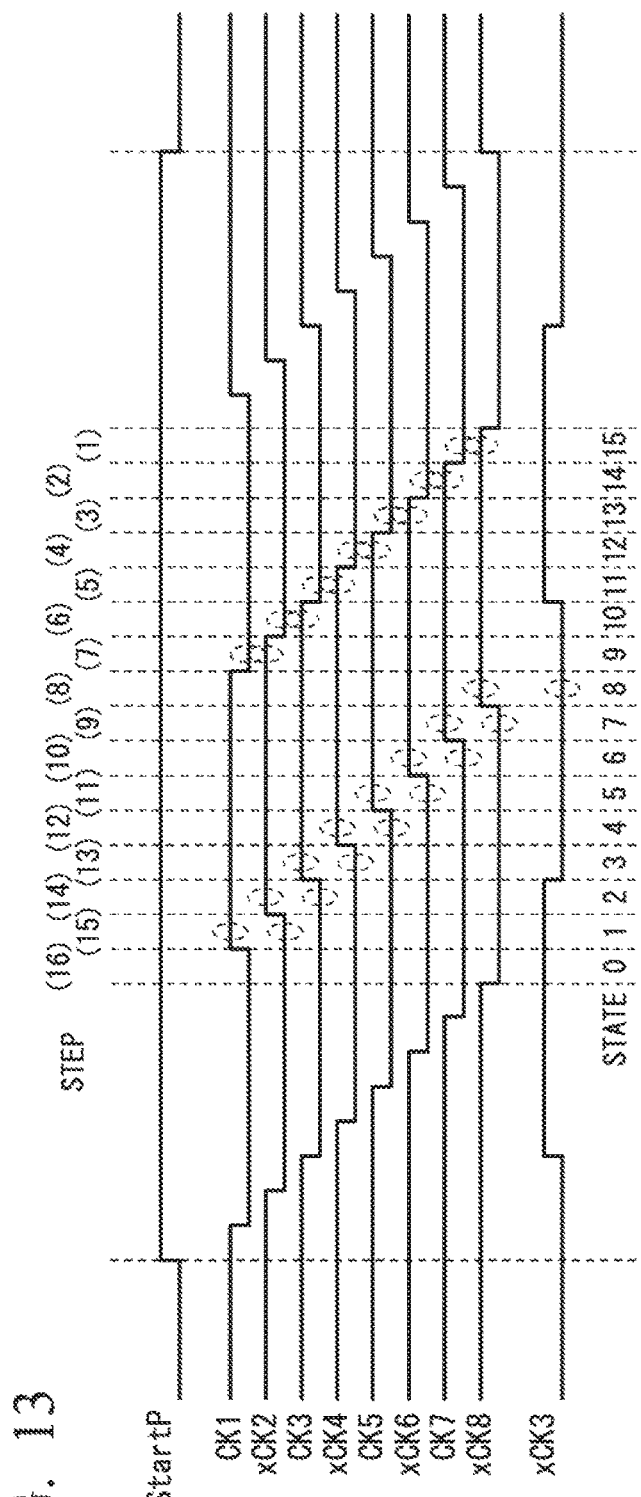
FIG. 13 is a timing chart showing an operation of the encoding circuit according to the third embodiment of the present invention.

A procedure of encoding by the encoding circuit 10e will be described. FIG. 13 shows the waveforms of the start pulse StartP, the lower phase signals CK1, CK3, CK5, and CK7, and the lower phase signals xCK2, xCK3, xCK4, xCK6, and xCK8 in the encoding circuit 10c. In FIG. 13, the horizontal direction indicates time and the vertical direction indicates voltage.

In FIG. 13, the lower phase signals CK1, CK3, CK8, and CK7 and the lower phase signals xCK2, xCK4, xCK6, and xCK8 are arranged to constitute a group of signals falling (changing from the H state to the L state) sequentially at predetermined time intervals. Specifically, the lower phase signals are arranged in the order of the lower phase signals CK1, xCK2, CK3, xCK4, CK5, xCK6, CK7, and xCK8. In this signal group, the plurality of lower phase signals are arranged in an order according to the order of connection of the plurality of fully-differential delay circuits DE1 to DE8 on the basis of the lower phase signal xCK8 which is the count clock of the counting unit 101. In the order of connection of the plurality of fully-differential delay circuits DE1 to DE8, the lower phase signals output from the preceding fully-differential delay circuits are arranged at preceding positions in the signal group.

Specifically, the lower phase signal CK1 from the fully-differential delay circuit DE1 connected to the fully-differential delay circuit DE8 that outputs the lower phase signal xCK8 is arranged at the head. Further, the lower phase signals output from the fully-differential delay circuits are arranged so that the order of the plurality of lower phase signals is the same as the order of connection of the fully-differential delay circuits DE1 to DE8. In addition to the plurality of lower phase signals constituting the signal group, a lower phase signal xCK3 obtained by inverting the lower phase signal CK3 output from the fully-differential delay circuit DE3 is arranged. The plurality of lower phase signals may be arranged to constitute a group of signals rising (changing from the L state to the H state) sequentially at predetermined time intervals. One of the lower phase signals xCK1, CK2, CK4, xCK5, CK6, and xCK7 obtained by inverting any one of the lower phase signals CK1, xCK2, xCK4, CK5, xCK6, and CK7 having the falling edge between the falling edge of the lower phase signal CK1 and the falling edge of the lower phase signal xCK8 may be used instead of the lower phase signal xCK3.

In the signal group (signal string) in which the plurality of lower phase signals latched by the latch unit 108c are arranged in the above-described order and the lower phase signal xCK3, the logic states of two continuous lower phase signals are sequentially detected. If it is detected that the logic states of the two continuous lower phase signals are predetermined states (thermometer codes), the states of a plurality of lower phase signals are determined according to a position at which the states are detected.

For example, the logic states of two continuous lower phase signals are sequentially detected from the bottom to the top of the signal group shown in FIG. 13 and the lower phase signal xCK3. In the case of states 9 to 15, in the signal group, the logic state changes from the H state to the L state between two continuous lower phase signals. In the case of state 8, the logic state changes from the L state to the H state between the lower phase signal xCK3 obtained by inverting the lower phase signal CK3 included in the signal group and the lower phase signal xCK8 included in the signal group. In the case of states 1 to 7, in the signal group, the logic state changes from the L state to the H state between two continuous lower phase signals. In the case of state 0, in the signal group, the logic state of each of the lower phase signals is the L state. In the third embodiment, when states 1 to 15 are not detected, it is determined that the state of each of the plurality of lower phase signals is state 0.

Specifically, encoding is performed by performing the following processing of steps (1) to (15) in time series.

(Step (1)) . . . Determination related to state 15

The logic states of the lower phase signal xCK8 and the lower phase signal CK7 are compared. If there is a thermometer code "10" at this position, the state of each of a plurality of lower phase signals is determined to be state 15. Step (I) corresponds to the first operation.

(Step (2)) . . . Determination related to state 14

The logic states of the lower phase signal CK7 and the lower phase signal xCK6 are compared. If there is a thermometer code "10" at this position, the state of each of a plurality of lower phase signals is determined to be state 14. Step (2) corresponds to the first operation.

(Step (3)) . . . Determination related to state 13

The logic states of the lower phase signal xCK6 and the lower phase signal CK5 are compared. If there is a thermometer code "10" at this position, the state of each of a plurality of lower phase signals is determined to be state 13. Step (3) corresponds to the first operation.

(Step (4)) . . . Determination related to state 12

The logic states of the lower phase signal CK5 and the lower phase signal xCK4 are compared. If there is a thermometer code "10" at this position, the state of each of a plurality of lower phase signals is determined to be state 12. Step (4) corresponds to the first operation.

(Step (5)) . . . Determination related to state 11

The logic states of the lower phase signal xCK4 and the lower phase signal CK3 are compared. If there is a thermometer code "10" at this position, the state of each of a plurality of lower phase signals is determined to be state 11. Step (5) corresponds to the first operation.

(Step (6)) . . . Determination related to state 10

The logic states of the lower phase signal CK3 and the lower phase signal xCK2 are compared. If there is a thermometer code "10" at this position, the state of each of a plurality of lower phase signals is determined to be state 10. Step (6) corresponds to the first operation.

(Step (7)) . . . Determination related to state 9

The logic states of the lower phase signal xCK2 and the lower phase signal CK1 are compared. If there is a thermometer code "10" at this position, the state of each of a plurality of lower phase signals is determined to be state 9. Step (7) corresponds to the first operation.

(Step (8)) . . . Determination related to state 8

The logic states of the lower phase signal xCK3 and the lower phase signal xCK8 are compared. If there is a thermometer code "01" at this position, the state of each of a plurality of lower phase signals is determined to be state 8. Step (8) corresponds to the third operation.

(Step (9)) . . . Determination related to state 7

The logic states of the lower phase signal xCK8 and the lower phase signal CK7 are compared. If there is a thermometer code "01" at this position, the state of each of a plurality of lower phase signals is determined to be state 7. Step (9) corresponds to the second operation.

(Step (10)) . . . Determination related to state 6

The logic states of the lower phase signal CK7 and the lower phase signal xCK6 are compared. If there is a thermometer code "01" at this position, the state of each of a plurality of lower phase signals is determined to be state 6. Step (10) corresponds to the second operation.

(Step (11)) . . . Determination related to state 5

The logic states of the lower phase signal xCK6 and the lower phase signal CK5 are compared. If there is a thermometer code "01" at this position, the state of each of a plurality of lower phase signals is determined to be state 5. Step (11) corresponds to the second operation.

(Step (12)) . . . Determination related to state 4

The logic states of the lower phase signal CK5 and the lower phase signal xCK4 are compared. If there is a thermometer code "01" at this position, the state of each of a plurality of lower phase signals is determined to be state 4. Step (12) corresponds to the second operation.

(Step (13)) . . . Determination related to state 3

The logic states of the lower phase signal xCK4 and the lower phase signal CK3 are compared. If there is a thermometer code "01" at this position, the state of each of a plurality of lower phase signals is determined to be state 3. Step (13) corresponds to the second operation.

(Step (14)) . . . Determination related to state 2

The logic states of the lower phase signal CK3 and the lower phase signal xCK2 are compared. If there is a thermometer code "01" at this position, the state of each of a plurality of lower phase signals is determined to be state 2. Step (14) corresponds to the second operation.

(Step (15)) . . . Determination related to state 1

The logic states of the lower phase signal xCK2 and the lower phase signal CK1 are compared. If there is a thermometer code "01" at this position, the state of each of a plurality of lower phase signals is determined to be state 1. Step (15) corresponds to the second operation.

Steps (1) to (7) and steps (9) to (15) in the third embodiment are the same as those in the first embodiment. Step (8) in the third embodiment is different from step (8) in the first embodiment. In steps (1) to (15), if it is determined that the state of each of the plurality of lower phase signals is not any one of states 1 to 15, the state of each of the plurality of lower phase signals is state 0. Thus, no particular determination related to state 0 is necessary. When the encoding unit 106c detects the thermometer code, the control signals SW1_1 to SW8_1, the control signals SW1_2 to SW8_2, and the control signal xSW3_1 are controlled so that the above-described procedure is implemented.

Figure 14:
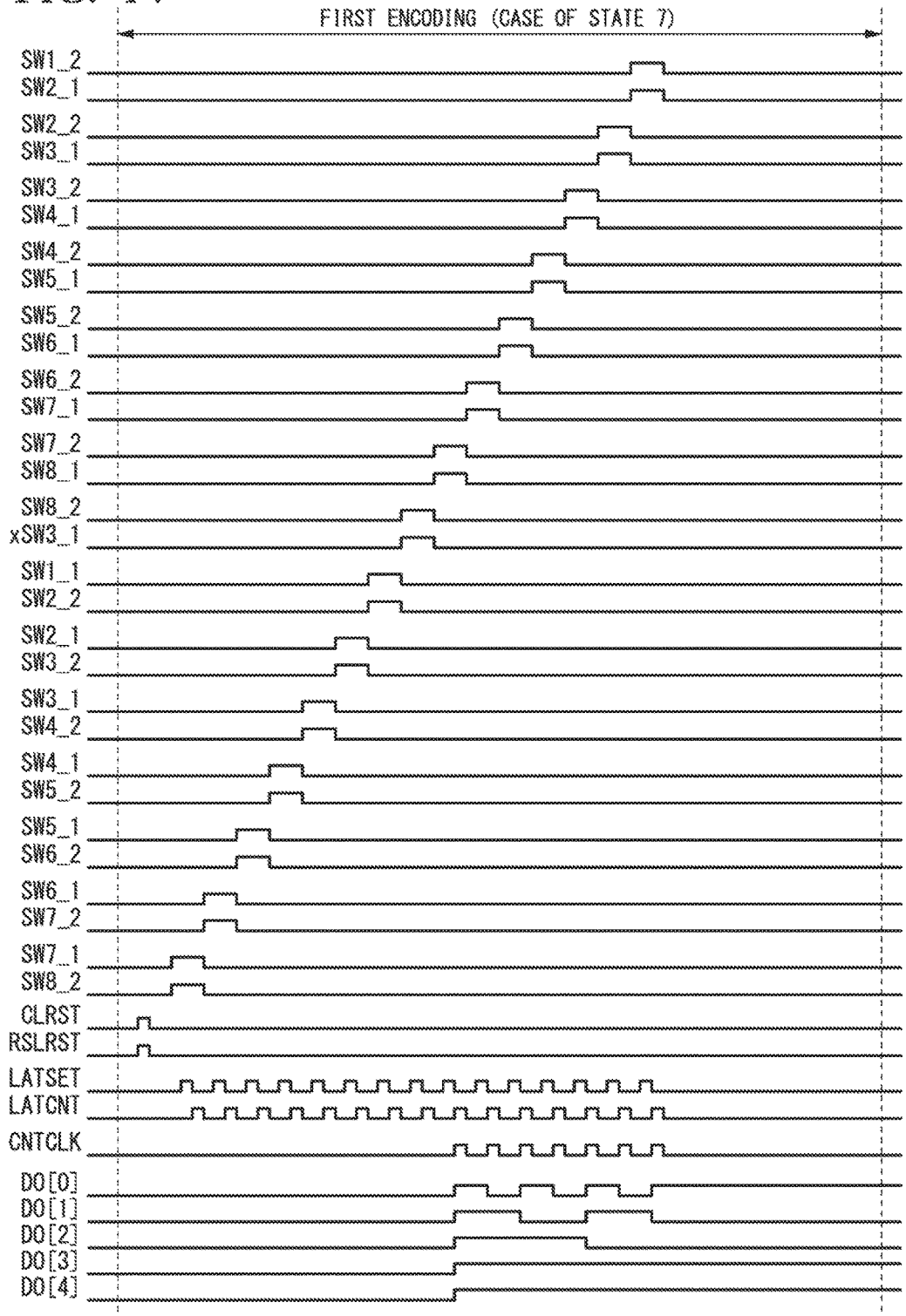
FIG. 14 is a timing chart showing an encoding procedure according to the third embodiment of the present invention.
Figure 15:
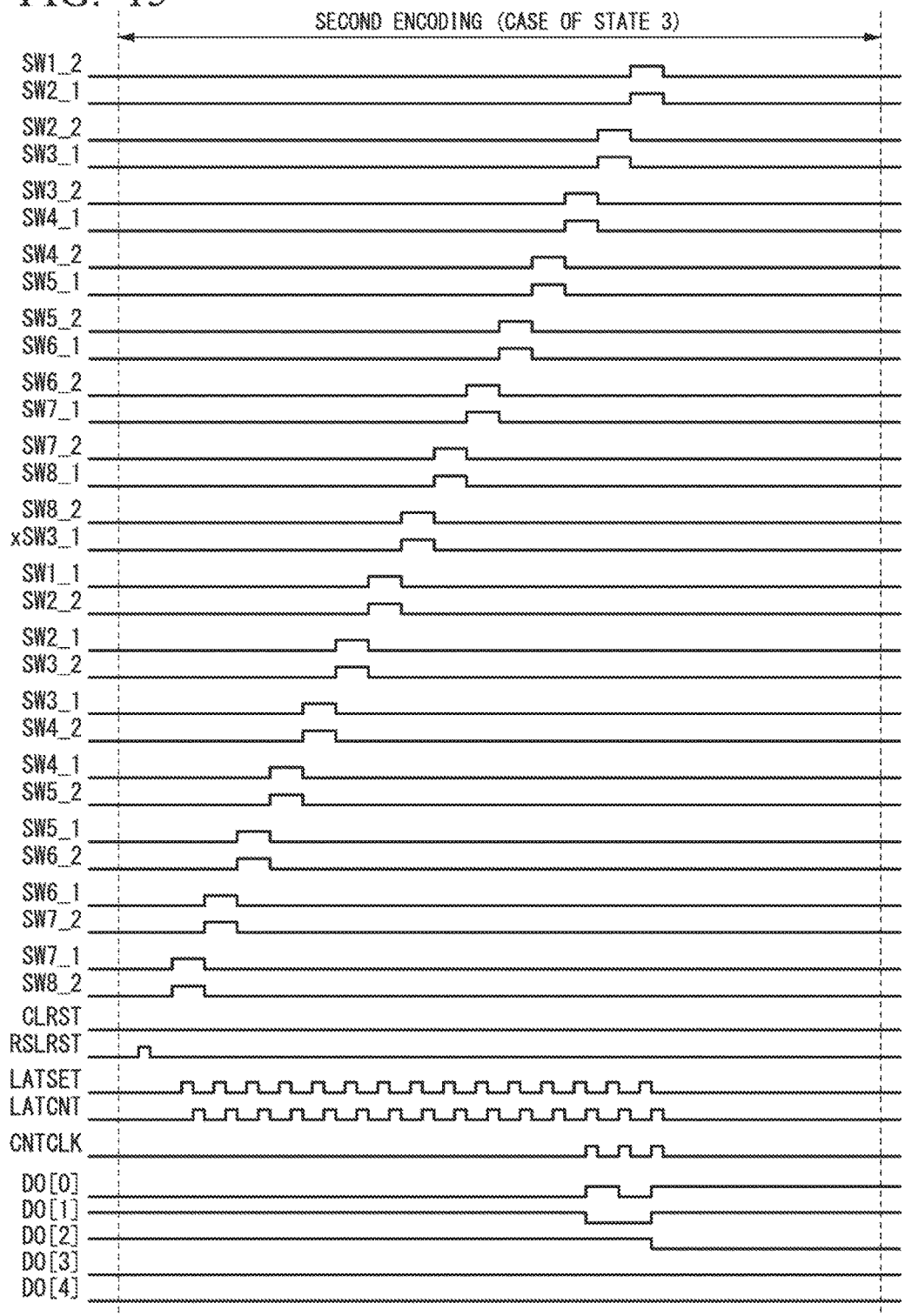
FIG. 15 is a timing chart showing an encoding procedure according to the third embodiment of the present invention.

FIGS. 14 and 15 show waveforms of encoding-related signals. In FIGS. 14 and 15, the horizontal direction indicates time and the vertical direction indicates voltage. An example in which first encoding which is the encoding of state 7 and second encoding which is the encoding of state 3 are performed continuously will be described. This example is applicable to the subtraction of the reset level and the signal level in the imaging device. In this example, a value of −4 is obtained by subtracting an encoded value of 7 corresponding to state 7 from an encoded value of 3 corresponding to state 3.

The outline of the operation will be described. A lower phase signal CK* or a lower phase signal xCK* is output from any two of the latch circuits L_1 to L_8 by which the lower phase signals CK1, CK3, CK8, and CK7 and the lower phase signals xCK2, xCK4, xCK6, and xCK8 according to the control signals SW1_1 to SW8_1 and the control signals SW1_2 to SW8_2. * in the description of the third embodiment denotes an integer of 1 to 8. Also, the lower phase signal xCK3 obtained by inverting the lower phase signal CK3 is output from the latch circuit L_3 latching the lower phase signal CK3 according to the control signal xSW3_1. The lower phase signal CK* or the lower phase signal xCK* output from the two latch circuits is input to the encoding unit 106c. The encoding unit 106c detects the thermometer code on the basis of the input lower phase signal CK* or the lower phase signal xCK*. In this example, the thermometer code is a logic state corresponding to an edge position changing from the H state to the L state and an edge position changing from the L state to the H state.

If a result of an AND operation on the lower phase signal CK* or the lower phase signal xCK* output from one latch circuit L_* and a signal obtained by inverting the lower phase signal CK* or the lower phase signal xCK* output from another latch circuit L_* indicates the H state, the thermometer code is detected. At the timing at which the thermometer code is detected, the generation of the lower count signal CNTCLK having a number of pulses according to the states of the lower phase signals CK1, CK3, CK8, and CK7 and the lower phase signals xCK2, xCK4, xCK6, and xCK8 starts. At the same time, the counter circuit CN0 starts the counting of the lower count signal CNTCLK. Count values DO[0] to DO[3] of the counter circuit CN0 when the count operation is completed are encoding results.

Detailed operations in steps (1) to (15) will be described. At the timing at which the predetermined condition is satisfied, the logic state of the control signal CO from the comparing unit (not shown) changes. Thereby, the logic states of the lower phase signals CK1, CK3, CK5, and CK7 and the lower phase signals xCK2, xCK4, xCK6, and xCK8 output from the clock generating unit 18a are latched by the latch unit 108c.

Subsequently, the first encoding shown in FIG. 14 starts. The RS latch RS0 is reset by the control signal RSLRST. At this time, the output signal of the RS latch RS0 is in the L state. Also, the counter circuit CN0 is reset by the control signal CLRST. At this time, the count value of the counter circuit CN0 is the initial value of the first encoding, i.e., 4'b[0]0000. After the RS latch RS0 and the counter circuit CN0 are reset, the control signals SW1_1 to SW8_, the control signals SW1_2 to SW8_2, and the control signal xSW3_1 change to the H state in a predetermined order.

(Step (1))

The control signal SW8_2 and the control signal SW7_1 change to the H state. Thereby, the lower phase signal xCK8 (L state) latched by the latch circuit L_8 and a signal obtained by inverting the lower phase signal CK7 (H state) latched by the latch circuit L_7 are input to the AND circuit AND0. At this time, the output signal of the AND circuit AND0 is in the L state. The control signal LATSET changes from the L state to the H state and then changes to the L state. Meanwhile, the detection signal DET is kept in the L state. Thus, the output signal of the RS latch RS0 is kept in the L state. As a result, the lower count signal CNTCLK is in the L state. At this time, the count value of the counter circuit CN0 is the initial value of the first encoding.

(Steps (2) to (7))

As the same in step (1), the lower phase signal CK* or the lower phase signal xCK* output from one latch circuit L_* and a signal obtained by inverting the lower phase signal CK* or the lower phase signal xCK* output from another latch circuit L_* are input to the AND circuit AND0. In any of steps (2) to (7), the output signal of the AND circuit AND0 is in the L state. The control signal LATSET changes from the L state to the H state and then changes to the L state. Meanwhile, the detection signal DET is kept in the L state. Thus, the output signal of the RS latch RS0 is kept in the L state. As a result, the lower count signal CNTCLK is in the L state. At this time, the count value of the counter circuit CN0 is the initial value of the first encoding.

(Step (8))

The control signal xSW3_1 and the control signal SW8_2 change to the H state. Thereby, a signal obtained by inverting the lower phase signal xCK3 (L state) corresponding to the lower phase signal CK3 (H state) latched by the latch circuit L_3, and the lower phase signal xCK8 (L state) latched by the latch circuit L_8 are input to the AND circuit AND0. At this time, the lower phase signal xCK3 is output from the inverting output terminal QB of the latch circuit L_3. At this time, the output signal of the AND circuit AND0 is in the L state. The control signal LATSET changes from the L state to the H state and then changes to the L state. Meanwhile, the detection signal DET is kept in the L state. Thus, the output signal of the RS latch RS0 is kept in the L state. As a result, the lower count signal CNTCLK is in the L state. At this time, the count value of the counter circuit CN0 is the initial value of the first encoding.

(Step (9))

The control signal SW8_1 and the control signal SW7_2 change to the H state. Thereby, the signal obtained by inverting the lower phase signal xCK8 (L state) latched by the latch circuit L_8 and the lower phase signal CK7 (H state) latched by the latch circuit L_7 are input to the AND circuit AND0. At this time, the output signal of the AND circuit AND0 is in the H state. The control signal LATSET changes from the L state to the H state and then changes to the L state. Meanwhile, the detection signal DET changes from the L state to the H state and then changes to the L state. Thereby, the output signal of the RS latch RS0 changes to the H state. The control signal LATCNT changes from the L state to the H state and then changes to the L state. Thereby, the AND circuit AND2 outputs a lower count signal CNTCLK of one pulse. The counter circuit CN0 performs a count operation on the basis of the lower count signal CNTCLK. Thus, the count value of the counter circuit CN0 decreases.

(Steps (10) to (15))

As the same in step (9), a signal obtained by inverting the lower phase signal CK* or the lower phase signal xCK* output from one latch circuit L_* and the lower phase signal CK* or the lower phase signal xCK* output from another latch circuit L_* are input to the AND circuit AND0. In any of steps (10) to (15), regardless of the output signal of the AND circuit AND0, the output signal of the RS latch RS0 is kept in the H state. The control signal LATCNT changes from the L state to the H state and then changes to the L state. Thereby, in each step, the AND circuit AND2 outputs a lower count signal CNTCLK of one pulse. The counter circuit CN0 performs a count operation on the basis of the lower count signal CNTCLK. Thus, the count value of the counter circuit CN0 decreases.

When the processing of step (15) is completed, the count value of the counter circuit CN0 is 4'b[1]1001. This count value corresponds to −7. Upon completion of the processing of step (15), the first encoding shown in FIG. 14 is completed.

After the processing of step (15) is completed, the count value of the counter circuit CN0 is inverted. At this time, the count value of the counter circuit CN0 is 4'b[0]0110. This count value corresponds to 6.

Subsequently, the second encoding shown in FIG. 15 starts. The RS latch RS0 is reset by the control signal RSLRST. The counter circuit CN0 is not reset by the control signal CLRST. At this time, the count value of the counter circuit CN0 is the initial value of the second encoding, i.e., 4'b[0]0110. After the RS latch RS0 is reset, the control signals SW1_1 to SW8_1, the control signals SW1_2 to SW8_2, and the control signal xSW3_1 change to the H state in a predetermined order.

(Step (1))

The control signal SW8_2 and the control signal SW7_1 change to the H state. Thereby, the lower phase signal xCK8 (L state) latched by the latch circuit L_8 and a signal obtained by inverting the lower phase signal CK7 (L state) latched by the latch circuit L_7 are input to the AND circuit AND0. At this time, the output signal of the AND circuit AND0 is in the L state. The control signal LATSET changes from the L state to the H state and then changes to the L state. Meanwhile, the detection signal DET is kept in the L state. Thus, the output signal of the RS latch RS0 is kept in the L state. As a result, the lower count signal CNTCLK is in the L state. At this time, the count value of the counter circuit CN0 is the initial value of the second encoding.

(Steps (2) to (7))

As the same in step (1), the lower phase signal CK* or the lower phase signal xCK* output from one latch circuit L_* and a signal obtained by inverting the lower phase signal CK* or the lower phase signal xCK* output from another latch circuit L_* are input to the AND circuit AND0. In any of steps (2) to (7), the output signal of the AND circuit AND0 is in the L state. The control signal LATSET changes from the L state to the H state and then changes to the L state. Meanwhile, the detection signal DET is kept in the L state. Thus, the output signal of the RS latch RS0 is kept in the L state. As a result, the lower count signal CNTCLK is in the L state. At this time, the count value of the counter circuit CN0 is the initial value of the second encoding.

(Step (8))

The control signal xSW3_1 and the control signal SW8_2 change to the H state. Thereby, a signal obtained by inverting the lower phase signal xCK3 (L state) corresponding to the lower phase signal CK3 (H state) latched by the latch circuit L_3 and the lower phase signal xCK8 (L State) latched by the latch circuit L_8 are input to the AND circuit AND0. At this time, the lower phase signal xCK3 is output from the inverting output terminal QB of the latch circuit L_3. At this time, the output signal of the AND circuit AND0 is in the L state. The control signal LATSET changes from the L state to the H state and then changes to the L state. Meanwhile, the detection signal DET is kept in the L state. Thus, the output signal of the RS latch RS0 is kept in the L state. As a result, the lower count signal CNTCLK is in the L state. At this time, the count value of the counter circuit CN0 is the initial value of the second encoding.

(Step (9))

The control signal SW8_1 and the control signal SW7_2 change to the H state. Thereby, a signal obtained by inverting the lower phase signal xCK8 (L state) latched by the latch circuit L_8 and the lower phase signal CK7 (L state) latched by the latch circuit L_7 are input to the AND circuit AND0. At this time, the output signal of the AND circuit AND0 is in the L state. The control signal LATSET changes from the L state to the H state and then changes to the L state. Meanwhile, the detection signal DET is kept in the L state. Thus, the output signal of the RS latch RS0 is kept in the L state. As a result, the lower count signal CNTCLK is in the L state. At this time, the count value of the counter circuit CN0 is the initial value of the second encoding.

(Steps (10) to (12))

As the same in step (9), a signal obtained by inverting the lower phase signal CK* or the lower phase signal xCK* output from one latch circuit L_* and the lower phase signal CK* or the lower phase signal xCK*output from another latch circuit L_* are input to the AND circuit AND0. In any of steps (10) to (12), the output signal of the AND circuit AND0 is in the L state. The control signal LATSET changes from the L state to the H state and then changes to the L state. Meanwhile, the detection signal DET is kept in the L state. Thus, the output signal of the RS latch RS0 is kept in the L state. As a result, the lower count signal CNTCLK is in the L state. At this time, the count value of the counter circuit CN0 is the initial value of the second encoding.

(Step (13))

The control signal SW4_1 and the control signal SW3_2 change to the H state. Thereby, a signal obtained by inverting the lower phase signal xCK4 (L state) latched by the latch circuit L_4 and the lower phase signal CK3 (H state) latched by the latch circuit L_3 are input to the AND circuit AND0. At this time, the output signal of the AND circuit AND0 is in the H state. The control signal LATSET changes from the L state to the H state and then changes to the L state. Meanwhile, the detection signal DET changes from the L state to the H state and then changes to the L state. Thereby, the output signal of the RS latch RS0 changes to the H state. The control signal LATCNT changes from the L state to the H state and then changes to the L state. Thereby, the AND circuit AND2 outputs a lower count signal CNTCLK of one pulse. The counter circuit CN0 performs a count operation on the basis of the lower count signal CNTCLK. Thus, the count value of the counter circuit CN0 decreases.

(Steps (14) and (15))

As the same in step (9), a signal obtained by inverting the lower phase signal CK* or the lower phase signal xCK* output from one latch circuit L_* and the lower phase signal CK* or the lower phase signal xCK* output from another latch circuit L_* are input to the AND circuit AND0. In both of steps (14) and (15), regardless of the output signal of the AND circuit AND0, the output signal of the RS latch RS0 is kept in the H state. The control signal LATCNT changes from the L state to the H state and then changes to the L state. Thereby, in each step, the AND circuit AND2 outputs a lower count signal CNTCLK of one pulse. The counter circuit CN0 performs a count operation on the basis of the lower count signal CNTCLK. Thus, the count value of the counter circuit CN0 decreases.

When the processing of step (15) is completed, the count value of the counter circuit CN0 is 4'b[0]0011. This count value corresponds to 3. Upon completion of the processing of step (15), the second encoding shown in FIG. 15 is completed.

After the processing of step (15) is completed, the count value of the counter circuit CN0 is inverted. At this time, the count value of the counter circuit CN0 is 4'b[1]1100. This count value corresponds to −4. That is, the value of −4 is obtained by subtracting an encoded value of 7 corresponding to state 7 from an encoded value of 3 corresponding to state 3.

In the third embodiment, the number of lower phase signals latched by the latch unit 108c is reduced. As a result, the circuit scale of the latch unit 108c can be reduced. For example, the circuit scale of the latch unit 108c is about half that of the latch unit 1108a shown in FIG. 37.

In the third embodiment, the encoding circuit 10c has the same advantages as the conventional encoding circuit. That is, even when the number of clocks generated by the clock generating unit 18a is large, the circuit scale of the encoding circuit 10c is small and the configuration of the encoding circuit 10c is simple.

(Fourth Embodiment)

Figure 16:
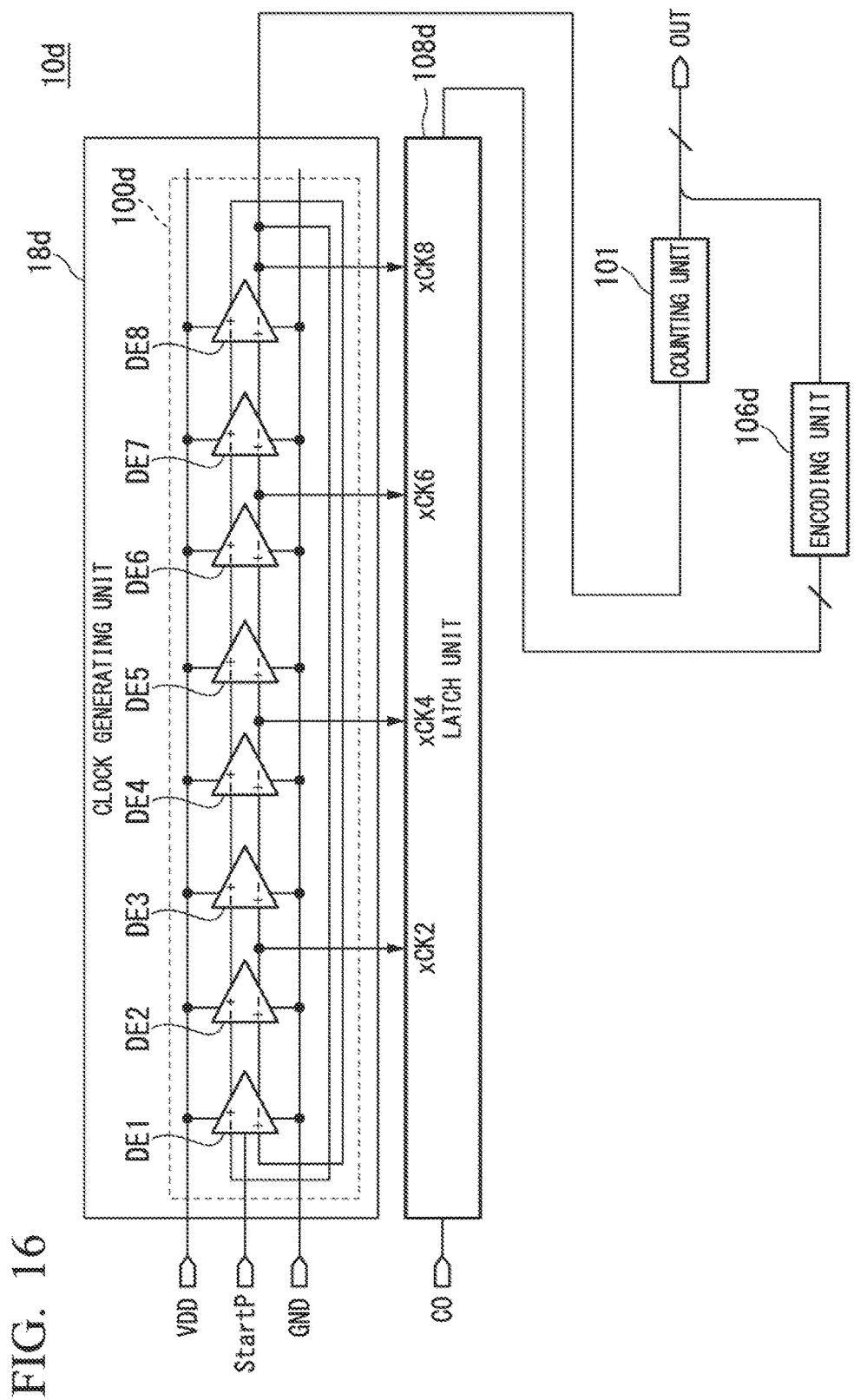
FIG. 16 is a block diagram showing a configuration of an encoding circuit according to a fourth embodiment of the present invention.

FIG. 16 shows a configuration of an encoding circuit 10d according to the fourth embodiment of the present invention. As shown in FIG. 16, the encoding circuit 10d includes a clock generating unit 18d, a latch unit 108d, a counting unit 101, and an encoding unit 106d.

Differences of the configuration shown in FIG. 16 from the configuration shown in FIG. 1 will be described. The clock generating unit 18d includes a delay circuit 100d in which a plurality of fully-differential delay circuits DE1 to DE8 (delay units) are connected in a ring shape. The clock generating unit 18d outputs a plurality of lower phase signals (lower phase signals xCK2, xCK4, xCK6, and xCK8) according to output signals of the plurality of fully-differential delay circuits DE1 to DE8.

The lower phase signal (delayed signal) generated by the clock generating unit 18d is the same as the lower phase signal generated by the clock generating unit 18a shown in FIG. 1. That is, the clock generating unit 18d generates the lower phase signals CK1 to CK8 and the lower phase signals xCK1 to xCK8. The clock generating unit 18d outputs only some of the generated plurality of lower phase signals (lower phase signals CK1 to CK and lower phase signals xCK1 to xCK8) for latching by the latch unit 108d. A process in which the clock generating unit 18d outputs only the lower phase signals xCK2, xCK4, xCK6, and xCK8 is different from the first embodiment.

In the fourth embodiment, the delay circuit 100d includes fully-differential delay circuits DE1, DE3, DE5, and DE7 which are a plurality of first delay units, and fully-differential delay circuits DE2, DE4, DE6, and DE8 which are a plurality of second delay units. The first delay units and the second delay units are arranged in pairs in the connection of the plurality of fully-differential delay circuits DE1 to DE8. Each first delay unit is connected between two of the second delay units. Each second delay unit is connected between two of the first delay units. That is, the first delay units and the second delay units are alternately arranged in the connection of the plurality of fully-differential delay circuits DE1 to DE8. The clock generating unit 18d outputs the lower phase signals xCK2, xCK4, xCK6, and xCK8, which are the plurality of second output signals generated by the plurality of second delay units.

The latch unit 108d latches the plurality of lower phase signals (the lower phase signals xCK2, xCK4, xCK6, and xCK8) output from the clock generating unit 18d at the timing at which a control signal CO is input.

The encoding unit 106d encodes the states of the plurality of lower phase signals (lower phase signals xCK2, xCK4, xCK6, and xCK8) latched by the latch unit 1084. Thereby, the encoding unit 106d obtains a binary number according to the states of the plurality of lower phase signals latched by the latch unit 108d.

The encoding unit 106d encodes states of a plurality of lower phase signals by performing a first operation, a second operation, and a third operation. In the first operation, the encoding unit 106d detects a position at which the logic states of two or more lower phase signals included in the signal group change from High to Low. The signal group includes at least two of the plurality of lower phase signals latched by the latch unit 108d. The signal group in the fourth embodiment is constituted of all the plurality of lower phase signals latched by the latch unit 108d. All the lower phase signals included in the signal group are arranged in an order according to the order of connection of the plurality of fully-differential delay circuits DE1 to DE8. That is, in the first operation, the encoding unit 106d detects that the logic states of two continuous lower phase signals in the signal group are High and Low, respectively.

In the second operation, the encoding unit 106d detects a position at which the logic states of two or more lower phase signals included in the signal group change from Low to High. That is, in the second operation, the encoding unit 106d detects that the logic states of two continuous lower phase signals in the signal group are Low and High, respectively.

In the third operation, the encoding unit 106d detects that the logic states of two or more lower phase signals including at least one lower phase signal included in the signal group are predetermined states. The third operation is different from the first operation and the second operation. In the third operation in the fourth embodiment, the encoding unit 106d detects that the logic states of two continuous lower phase signals included in the signal group are the same. The third operation is performed between the first operation and the second operation.

The configuration shown in FIG. 16 is substantially the same as that shown in FIG. 1 except for the above points.

Figure 17:
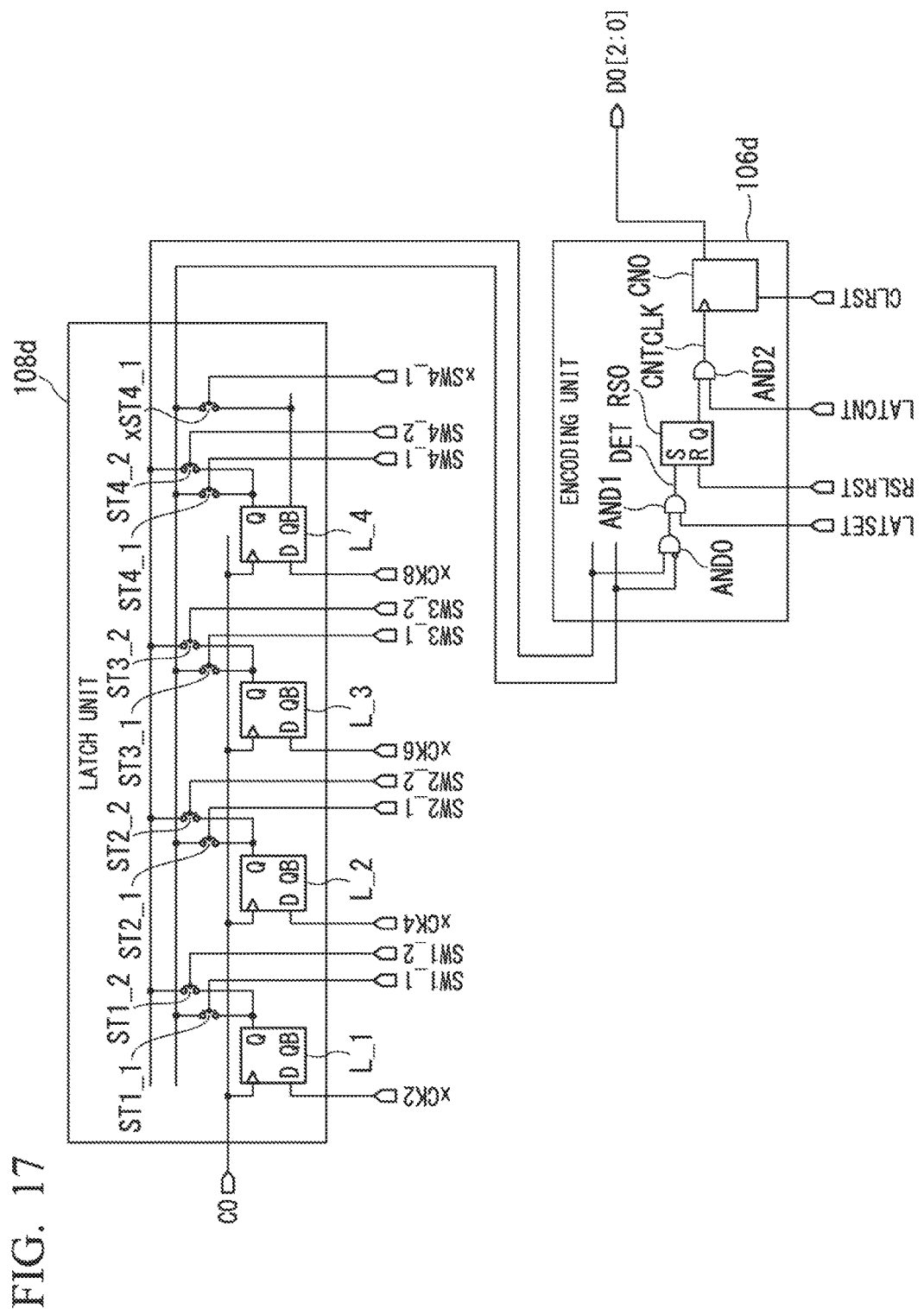
FIG. 17 is a block diagram showing configurations of a latch unit and an encoding unit according to the fourth embodiment of the present invention.

FIG. 17 shows the configurations of the latch unit 108d and the encoding unit 106d. Differences of the configuration shown in FIG. 17 from the configuration shown in FIG. 2 will be described.

The latch unit 108d includes a plurality of latch circuits L_1 to L_4, a plurality of switches ST1_1 to ST 4_1, a plurality of switches ST1_2 to ST4_2, and a switch xST4_1. The latch circuits L_1 to L_4 latch the states of a plurality of lower phase signals (lower phase signals xCK2, xCK4, xCK6, and xCK8) at the timing at which the control signal CO from the comparing unit (not shown) is inverted. Control signals SW1_1 to SW4_1 and control signals SW1_2 to SW4_2 are signals which control the switches ST1_1 to ST4_1 and the switches ST1_2 to ST4_2 for outputting any one of the plurality of lower phase signals latched by the latch circuits L_1 to L_4 from the output terminals Q of the latch circuits L_1 to L_4 to the encoding unit 106d. The control signal xSW4_1 is a signal which controls the switch xST4_1 for outputting a signal (corresponding to the lower phase signal CK8) obtained by inverting the lower phase signal xCK8 latched by the latch circuit L_4 from the inverting output terminal QB of the latch circuit L_4 to the encoding unit 106d. In the latch unit 108d, the latch circuits L_5 to L_8, the switches ST5_1 to ST8_1, the switches ST5_2 to ST8_2, and the switch xST8_1 are deleted from the configuration of the latch unit 108a shown in FIG. 2. In the latch unit 108d, the switch xST4_1 is added to the configuration of the latch unit 108a shown in FIG. 2. A signal obtained by inverting the lower phase signal CK8 output from the inverting output terminal QB of the latch circuit L_4 via the switch xST4_1 is input to the first input terminal of the AND circuit AND0.

The configuration of the encoding unit 106d is the same as that of the encoding unit 106a shown in FIG. 2. The lower phase signal input to the encoding unit 106d is different from the lower phase signal input to the encoding unit 106a shown in FIG. 2. Thus, the operation of the encoding unit 106d is different from the operation of the encoding unit 106a shown in FIG. 2.

The configuration shown in FIG. 17 is substantially the same as that shown in FIG. 2 except for the above points.

Figure 18:
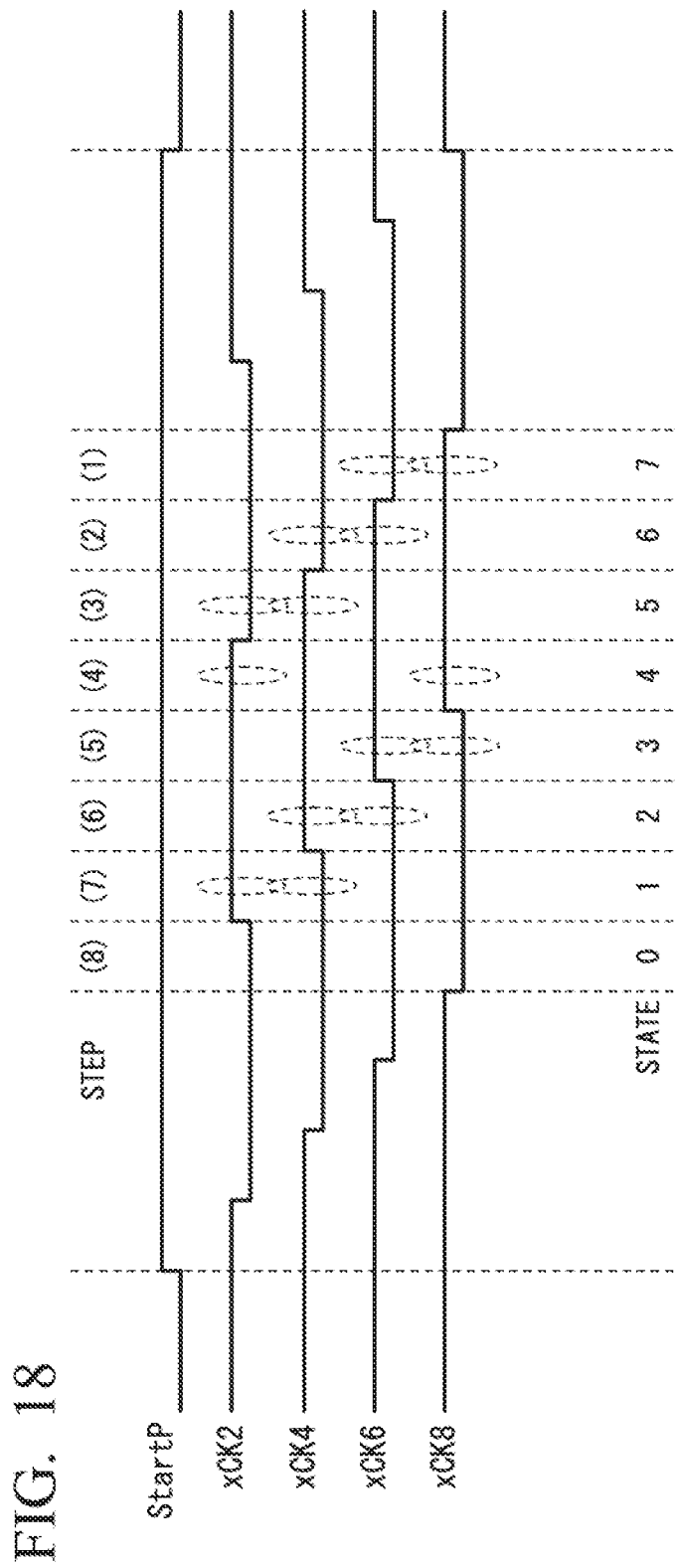
FIG. 18 is a timing chart showing an operation of the encoding circuit according to the fourth embodiment of the present invention.

The procedure of encoding by the encoding circuit 10d will be described. FIG. 18 shows the waveforms of the start pulse StartP and the lower phase signals xCK2, xCK4, xCK6, and xCK8 in the encoding circuit 10d. In FIG. 18, the horizontal direction indicates time and the vertical direction indicates voltage.

In FIG. 18, the lower phase signals xCK2, xCK4, xCK6, and xCK8 are arranged to constitute a group of signals falling (changing from the H state to the L state) sequentially. Specifically, the lower phase signals are arranged in the order of the lower phase signals xCK2, xCK4, xCK6, and xCK8. In this signal group, the plurality of lower phase signals are arranged in an order according to an order of connection of the plurality of fully-differential delay circuits DE2, DE4, DE6, and DE8 on the basis of the lower phase signal xCK8 which is the count clock of the counting unit 101. In the order of connection of the plurality of fully-differential delay circuits DE2, DE4, DE6, and DE8, the lower phase signals output from the preceding fully-differential delay circuits are arranged at preceding positions in the signal group.

Specifically, the lower phase signal xCK2 from the fully-differential delay circuit DE2 connected behind two fully-differential delay circuits from the fully-differential delay circuit DE8 that outputs the lower phase signal xCK8 is arranged at the head. Further, the lower phase signals output from the fully-differential delay circuits are arranged so that the order of the plurality of lower phase signals is the same as the order of connection of the fully-differential delay circuits DE2, DE4, DE6, and DE8. The plurality of lower phase signals may be arranged to constitute a group of signals rising (changing from the L state to the H state) sequentially at predetermined time intervals.

In the signal group (signal string) in which the plurality of lower phase signals latched by the latch unit 108d are arranged in the above-described order, the logic states of two continuous lower phase signals are sequentially detected. When it is detected that the logic states of two continuous lower phase signals are predetermined states (thermometer codes), the states of a plurality of lower phase signals are determined according to a position at which the states are detected.

For example, the logic states of two continuous lower phase signals are sequentially detected from the bottom to the top of the signal group shown in FIG. 18. In the case of states 5 to 7, in the signal group, the logic state changes from the H state to the L state between two continuous lower phase signals. In the case of state 4, in the signal group, the logic state of each of the lower phase signals is the H state. The only state in which the logic states of any two continuous lower phase signals are the H state is state 4. In the fourth embodiment, when it is detected that the logic states of both the lower phase signal xCK2 and the lower phase signal xCK8 are the H state, it is determined that the state of each of the plurality of lower phase signals is state 4. In the case of states 1 to 3, in the signal group, the logic state changes from the L state to the H state between two continuous lower phase signals. In the case of state 0, in the signal group, the logic state of each of the lower phase signals is the L state. In the third embodiment, when states 1 to 7 are not detected, it is determined that the state of each of the plurality of lower phase signals is state 0.

Specifically, encoding is performed by executing the following processing of steps (1) to (7) in time series.

(Step (1)) . . . Determination related to state 7

The logic states of the lower phase signal xCK8 and the lower phase signal xCK6 are compared. If there is a thermometer code "10" at this position, the state of each of a plurality of lower phase signals is determined to be state 7. Step (1) corresponds to the first operation.

(Step (2)) . . . Determination related to state 6

The logic states of the lower phase signal xCK6 and the lower phase signal xCK4 are compared. If there is a thermometer code "10" at this position, the state of each of a plurality of lower phase signals is determined to be state 6. Step (2) corresponds to the first operation.

(Step (3)) . . . Determination related to state 5

The logic states of the lower phase signal xCK4 and the lower phase signal xCK2 are compared. If there is a thermometer code "10" at this position, the state of each of a plurality of lower phase signals is determined to be state 5. Step (3) corresponds to the first operation.

(Step (4)) . . . Determination related to state 4

The logic states of the lower phase signal xCK2 and the lower phase signal xCK8 are compared. If there is a thermometer code "1" at this position, the state of each of a plurality of lower phase signals is determined to be state 4. Step (4) corresponds to the third operation.

(Step (5)) . . . Determination related to state 3

The logic states of the lower phase signal xCK8 and the lower phase signal xCK6 are compared. If there is a thermometer code "01" at this position, the state of each of a plurality of lower phase signals is determined to be state 3. Step (5) corresponds to the second operation.

(Step (6)) . . . Determination related to state 2

The logic states of the lower phase signal xCK6 and the lower phase signal xCK4 are compared. If there is a thermometer code "01" at this position, the state of each of a plurality of lower phase signals is determined to be state 2. Step (6) corresponds to the second operation.

(Step (7)) . . . Determination related to state 1

The logic states of the lower phase signal xCK4 and the lower phase signal xCK2 are compared. If there is a thermometer code "01" at this position, the state of each of a plurality of lower phase signals is determined to be state 1. Step (7) corresponds to the second operation.

In steps (1) to (7), if it is determined that the state of the plurality of lower phase signals is not any one of states 1 to 7, the state of each of the plurality of lower phase signals is state 0. Thus, no particular determination related to state 0 is necessary. When the encoding unit 106d detects the thermometer code, the control signals SW1_1 to SW4_1, the control signals SW1_2 to SW4_2, and the control signal xSW4_1 are controlled so that the above-described procedure is implemented.

Figure 19:
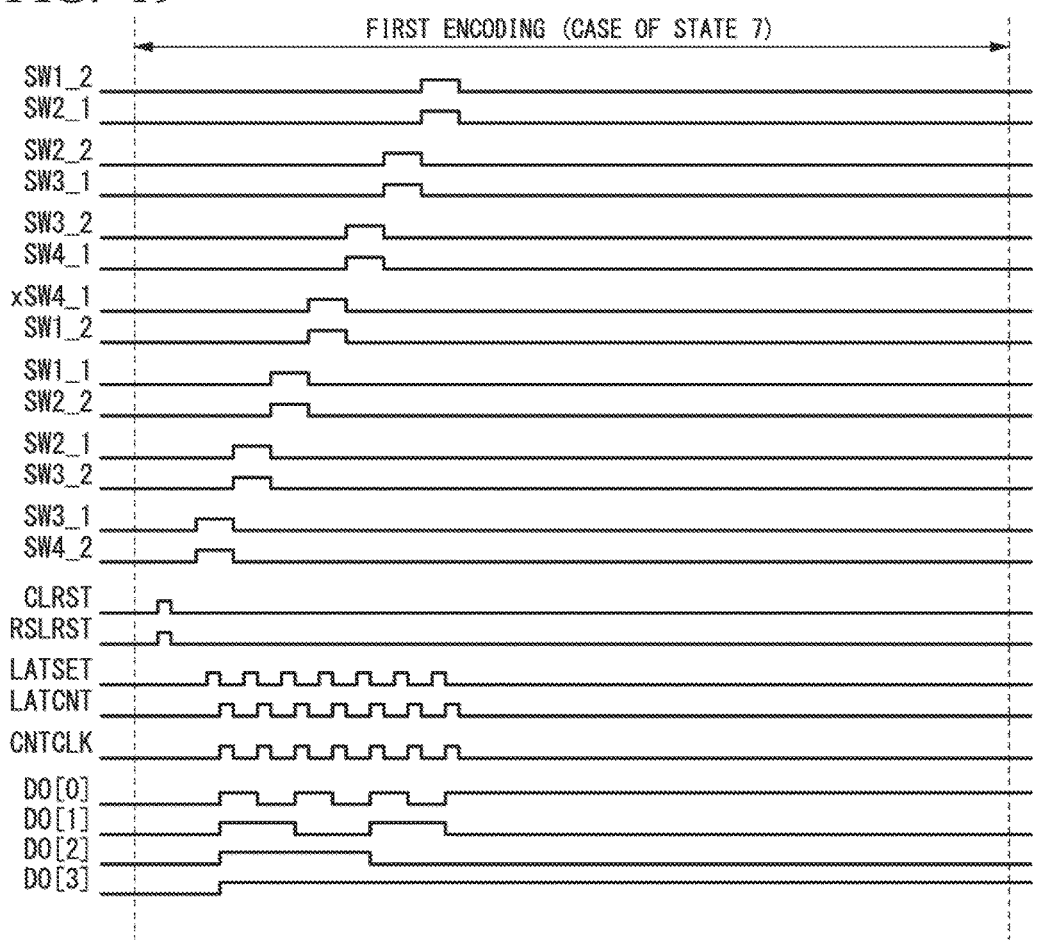
FIG. 19 is a timing chart showing an encoding procedure according to the fourth embodiment of the present invention.
Figure 20:
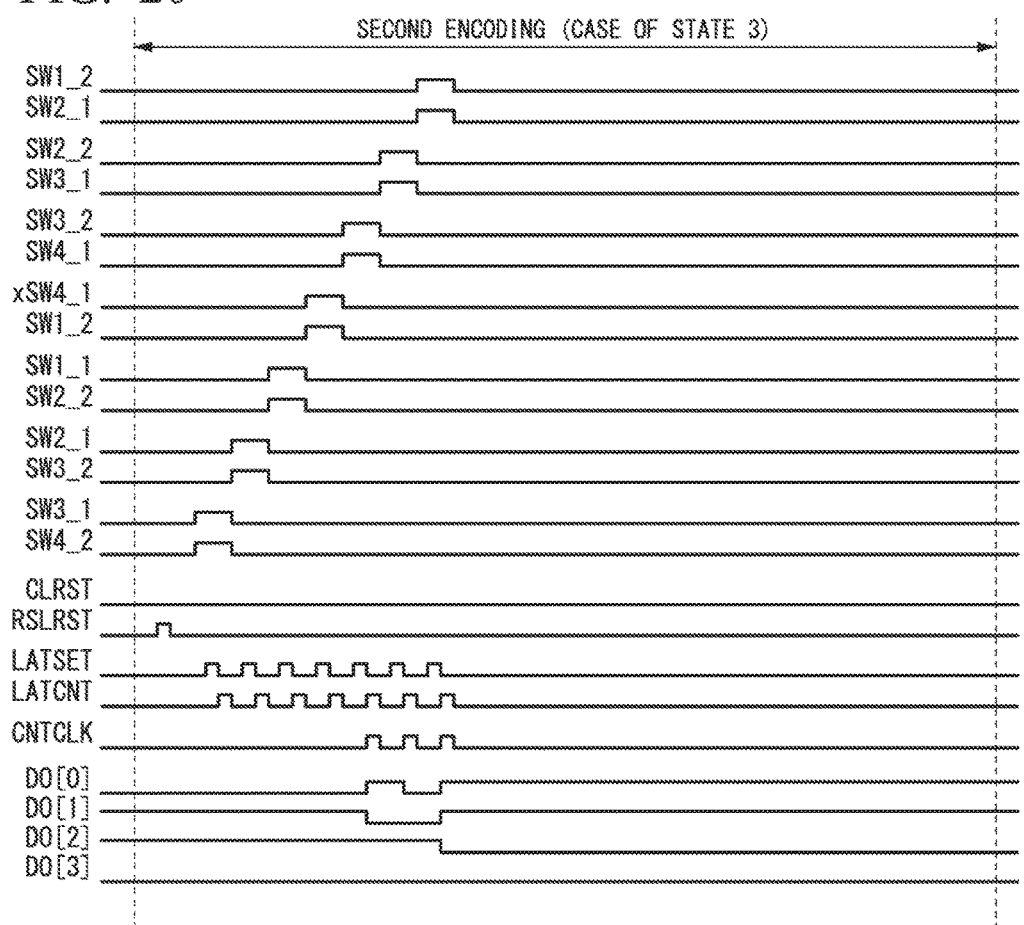
FIG. 20 is a timing chart showing an encoding procedure according to the fourth embodiment of the present invention.

FIGS. 19 and 20 show waveforms of encoding-related signals. In FIGS. 19 and 20, the horizontal direction indicates time and the vertical direction indicates voltage. An example in which first encoding which is the encoding of state 7 and second encoding which is the encoding of state 3 are performed continuously will be described. This example is applicable to the subtraction of the reset level and the signal level in the imaging device. In this example, a value of −4 is obtained by subtracting an encoded value of 7 corresponding to state 7 from an encoded value of 3 corresponding to state 3.

The outline of the operation will be described. The lower phase signal xCK* is output from any two of the latch circuits L_1 to L_4 by which the lower phase signals xCK2, xCK4, xCK6, and xCK8 are latched according to the control signals SW1_1 to SW4_1 and the control signals SW1_2 to SW4_2. In the description of the fourth embodiment, * is an integer of 2, 4, 6, or 8. Also, the lower phase signal CK8 obtained by inverting the lower phase signal xCK8 is output from the latch circuit L_4 latching the lower phase signal xCK8 according to the control signal xSW4_1. The lower phase signal CK8 or the lower phase signal xCK* output from the two latch circuits is input to the encoding unit 106d. The encoding unit 106d detects a thermometer code on the basis of the input lower phase signal xCK*. In this example, the thermometer code is a logic state corresponding to an edge position changing from the H state to the L state, an edge position changing from the L state to the H state, and two continuous H states.

If a result of an AND operation on the lower phase signal xCK* output from one latch circuit L_* and a signal obtained by inverting the lower phase signal CK8 or the lower phase signal xCK* output from another latch circuit L_* indicates the H state, the thermometer code is detected. At the timing at which the thermometer code is detected, the generation of the lower count signal CNTCLK having a number of pulses according to the states of the lower phase signals xCK2, xCK4, xCK6, and xCK8 starts. At the same time, the counter circuit CN0 starts the counting of the lower count signal CNTCLK. Count values DO[0] to DO[2] of the counter circuit CN0 when the count operation is completed are encoding results.

Detailed operations in steps (1) to (7) will be described. At the timing at which the predetermined condition is satisfied, the logic state of the control signal CO from the comparing unit (not shown) changes. Thereby, the logic states of the lower phase signals xCK2, xCK4, xCK6, and xCK8 output from the clock generating unit 18d are latched by the latch unit 108d.

Subsequently, the first encoding shown in FIG. 19 starts. The RS latch RS0 is reset by the control signal RSLRST. At this time, the output signal of the RS latch RS0 is in the L state. Also, the counter circuit CN0 is reset by the control signal CLRST. At this time, the count value of the counter circuit CN0 is an initial value of the first encoding, i.e., 3'b[0]000. "3'b" in the notation of the count value indicates that the output signal is a 3-bit binary number. "[0]" in the notation of the count value indicates the sign of the count value. This sign is used for convenience of description. "[0]" corresponds to a positive sign. "[1]" corresponds to a negative sign. "000" in the notation of the count value indicates the output signal DO[2:0] of the encoding unit 106d. The same notation of the count value is also used for the description of the fourth to seventh embodiments. After the RS latch RS0 and the counter circuit CN0 are reset, the control signals SW1_1 to SW4_1, the control signals SW1_2 to SW4_2, and the control signal xSW4_1 change to the H state in a predetermined order (Step (1))

The control signal SW4_2 and the control signal SW3_1 change to the H state. Thereby, the lower phase signal xCK8 (H state) latched by the latch circuit L_4 and a signal obtained by inverting the lower phase signal xCK6 (L state) latched by the latch circuit L_3 are input to the AND circuit AND0. At this time, the output signal of the AND circuit AND0 is in the H state. The control signal LATSET changes from the L state to the H state and then changes to the L state. Meanwhile, the detection signal DET changes from the L state to the H state and then changes to the L state. Thereby, the output signal of the RS latch RS0 changes to the H state. The control signal LATCNT changes from the L state to the H state and then changes to the L state. Thereby, the AND circuit AND2 outputs a lower count signal CNTCLK of one pulse. The counter circuit CN0 performs a count operation on the basis of the lower count signal CNTCLK. Thus, the count value of the counter circuit CN0 decreases.

(Steps (2) and (3))

As the same in step (1), the lower phase signal xCK* output from one latch circuit L_* and a signal obtained by inverting the lower phase signal xCK* output from another latch circuit L_* are input to the AND circuit AND0. In both of steps (2) and (3), regardless of the output signal of the AND circuit AND0, the output signal of the RS latch RS0 is kept in the H state. The control signal LATCNT changes from the L state to the H state and then changes to the L state. Thereby, in each step, the AND circuit AND2 outputs a lower count signal CNTCLK of one pulse. The counter circuit CN0 performs a count operation on the basis of the lower count signal CNTCLK. Thus, the count value of the counter circuit CN0 decreases.

(Step (4))

The control signal SW1_2 and the control signal xSW4_1 change to the H state. Thereby, the lower phase signal xCK2 (L state) latched by the latch circuit L_1 and a signal obtained by inverting the lower phase signal CK8 (L state) corresponding to the lower phase signal xCK8 (H state) latched by the latch circuit L_4 are input to the AND circuit AND0. At this time, the lower phase signal CK8 is output from the inverting output terminal QB of the latch circuit L_4. At this time, regardless of the output signal of the AND circuit AND0, the output signal of the RS latch RS0 is kept in the H state. The control signal LATCNT changes from the L state to the H state and then changes to the L state. Thereby, in each step, the AND circuit AND2 outputs a lower count signal CNTCLK of one pulse. The counter circuit CN0 performs a count operation on the basis of the lower count signal CNTCLK. Thus, the count value of the counter circuit CN0 decreases.

(Step (5))

The control signal SW4_1 and the control signal SW3_2 change to the H state. Thereby, a signal obtained by inverting the lower phase signal xCK8 (H state) latched by the latch circuit L_4 and the lower phase signal xCK6 (L state) latched by the latch circuit L_3 are input to the AND circuit AND0. At this time, regardless of the output signal of the AND circuit AND0, the output signal of the RS latch RS0 is kept in the H state. The control signal LATCNT changes from the L state to the H state and then changes to the L state. Thereby, in each step, the AND circuit AND2 outputs a lower count signal CNTCLK of one pulse. The counter circuit CN0 performs a count operation on the basis of the lower count signal CNTCLK. Thus, the count value of the counter circuit CN0 decreases.

(Steps (6) and (7))

As the same in step (5), a signal obtained by inverting the lower phase signal xCK* output from one latch circuit L_* and the lower phase signal xCK* output from another latch circuit L_* are input to an AND circuit AND0. In both of steps (6) and (7), regardless of the output signal of the AND circuit AND0, the output signal of the RS latch RS0 is kept in the H state. The control signal LATCNT changes from the L state to the H state and then changes to the L state. Thereby, in each step, the AND circuit AND2 outputs a lower count signal CNTCLK of one pulse. The counter circuit CN0 performs a count operation on the basis of the lower count signal CNTCLK. Thus, the count value of the counter circuit CN0 decreases.

When the processing of step (7) is completed, the count value of the counter circuit CN0 is 3'b[1]001. This count value corresponds to −7. Upon completion of the processing of step (7), the first encoding shown in FIG. 19 is completed.

After the processing of step (7) is completed, the count value of the counter circuit CN0 is inverted. At this time, the count value of the counter circuit CN0 is 3'b[0]110. This count value corresponds to 6.

Subsequently, the second encoding shown in FIG. 20 starts. The RS latch RS0 is reset by the control signal RSLRST. The counter circuit CN0 is not reset by the control signal CLRST. At this time, the count value of the counter circuit CN0 is the initial value of the second encoding, i.e., 3'b[0]110. After the RS latch RS0 is reset, the control signals SW1_1 to SW4_1, the control signals SW1_2 to SW4_2, and the control signal xSW4_1 change to the H state in a predetermined order.

(Step (1))

The control signal SW4_2 and the control signal SW3_1 change to the H state. Thereby, the lower phase signal xCK8 (L state) latched by the latch circuit L_4 and a signal obtained by inverting the lower phase signal xCK6 (H state) latched by the latch circuit L_3 are input to the AND circuit AND0. At this time, the output signal of the AND circuit AND0 is in the L state. The control signal LATSET changes from the L state to the H state and then changes to the L state. Meanwhile, the detection signal DET is kept in the L state. Thus, the output signal of the RS latch RS0 is kept in the L state. As a result, the lower count signal CNTCLK is in the L state. At this time, the count value of the counter circuit CN0 is the initial value of the second encoding.

(Steps (2) and (3))

As the same in step (1), the lower phase signal xCK* output from one latch circuit L_* and a signal obtained by inverting the lower phase signal xCK* output from another latch circuit L_* are input to the AND circuit AND0. In both of steps (2) and (3), the output signal of the AND circuit AND0 is in the L state. The control signal LATSET changes from the L state to the H state and then changes to the L state. Meanwhile, the detection signal DET is kept in the L state. Thus, the output signal of the RS latch RS0 is kept in the L state. As a result, the lower count signal CNTCLK is in the L state. At this time, the count value of the counter circuit CN0 is the initial value of the second encoding.

(Step (4))

The control signal SW1_2 and the control signal xSW4_1 change to the H state. Thereby, the lower phase signal xCK2 (H state) latched by the latch circuit L_1 and a signal obtained by inverting the lower phase signal CK8 (H state) corresponding to the lower phase signal xCK8 (L state) latched by the latch circuit L_4 are input to the AND circuit AND0. At this time, the lower phase signal CK8 is output from the inverting output terminal QB of the latch circuit L_4. At this time, the output signal of the AND circuit AND0 is in the L state. The control signal LATSET changes from the L state to the H state and then changes to the L state. Meanwhile, the detection signal DET is kept in the L state. Thus, the output signal of the RS latch RS0 is kept in the L state. As a result, the lower count signal CNTCLK is in the L state. At this time, the count value of the counter circuit CN0 is the initial value of the second encoding.

(Step (5))

The control signal SW4_1 and the control signal SW3_2 change to the H state. Thereby, a signal obtained by inverting the lower phase signal xCK8 (L state) latched by the latch circuit L_4 and the lower phase signal xCK6 (H state) latched by the latch circuit L_3 are input to the AND circuit AND0. At this time, the output signal of the AND circuit AND0 is in the H state. The control signal LATSET changes from the L state to the H state and then changes to the L state. Meanwhile, the detection signal DET changes from the L state to the H state and then changes to the L state. Thereby, the output signal of the RS latch RS0 changes to the H state.

The control signal LATCNT changes from the L state to the H state and then changes to the L state. Thereby, the AND circuit AND2 outputs a lower count signal CNTCLK of one pulse. The counter circuit CN0 performs a count operation on the basis of the lower count signal CNTCLK. Thus, the count value of the counter circuit CN0 decreases.

(Steps (6) and (7))

As the same in step (5), a signal obtained by inverting the lower phase signal xCK* output from one latch circuit L_* and a lower phase signal xCK* output from another latch circuit L_* are input to an AND circuit AND0. In both of steps (6) and (7), the output signal of the RS latch RS0 is latched in the H state regardless of the output signal of the AND circuit AND0. The control signal LATCNT changes from the L state to the H state and then changes to the L state. Thereby, in each step, the AND circuit AND2 outputs a lower count signal CNTCLK of one pulse. The counter circuit CN0 performs a count operation on the basis of the lower count signal CNTCLK. Thus, the count value of the counter circuit CN0 decreases.

When the processing of step (7) is completed, the count value of the counter circuit CN0 is 3'b[0]011. This count value corresponds to 3. Upon completion of the processing of step (7), the second encoding shown in FIG. 20 is completed.

After the processing of step (7) is completed, the count value of the counter circuit CN0 is inverted. At this time, the count value of the counter circuit CN0 is 3'b[1]100. This count value corresponds to −4. That is, the value of −4 is obtained by subtracting an encoded value of 7 corresponding to state 7 from an encoded value of 3 corresponding to state 3.

In the third operation, the thermometer code "00" may be detected instead of the thermometer code "11." That is, the determination related to state 0 may be performed.

Figure 39:
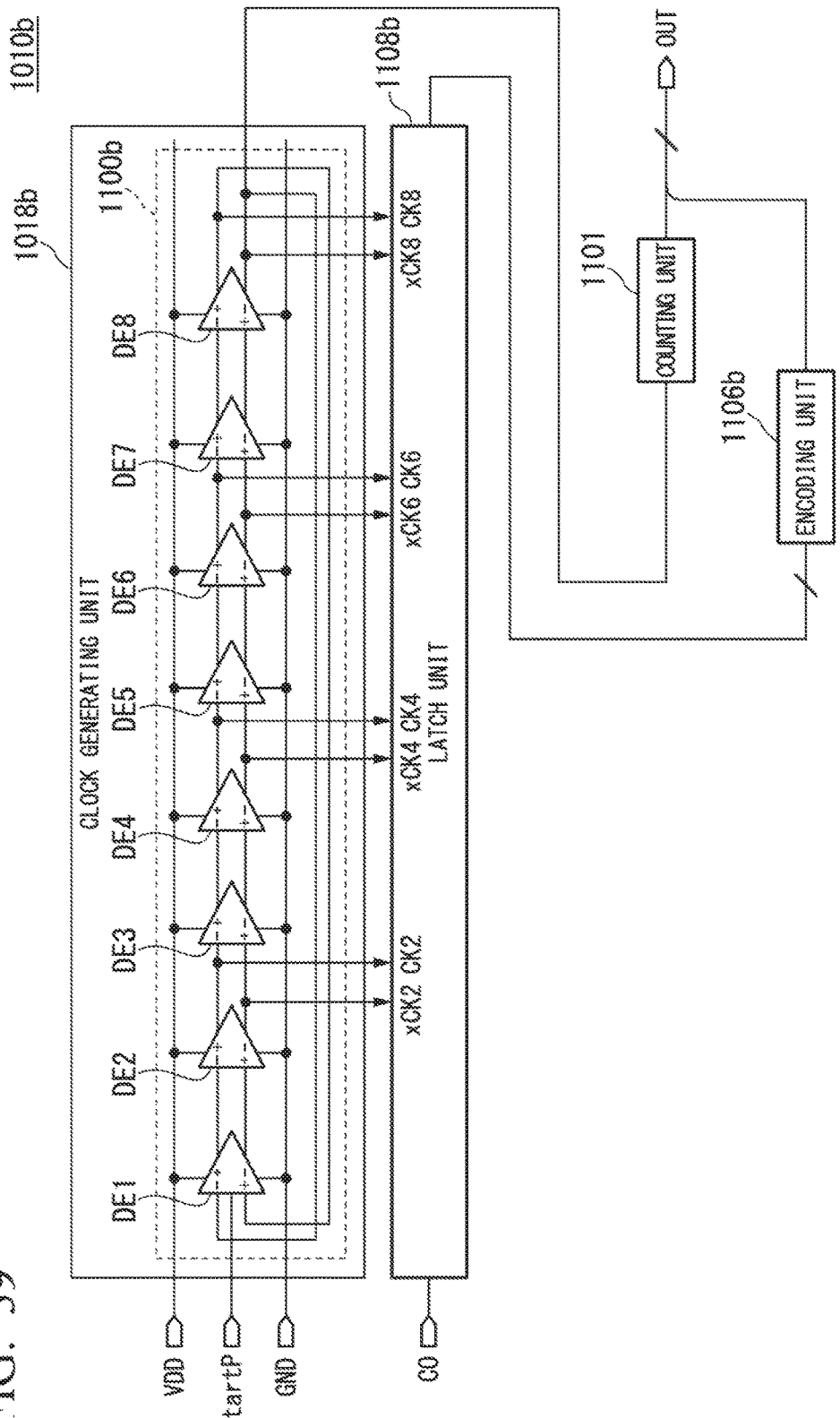
FIG. 39 is a block diagram showing a configuration of an encoding circuit in a tdc SS type AD conversion circuit of a second conventional example.
Figure 40:
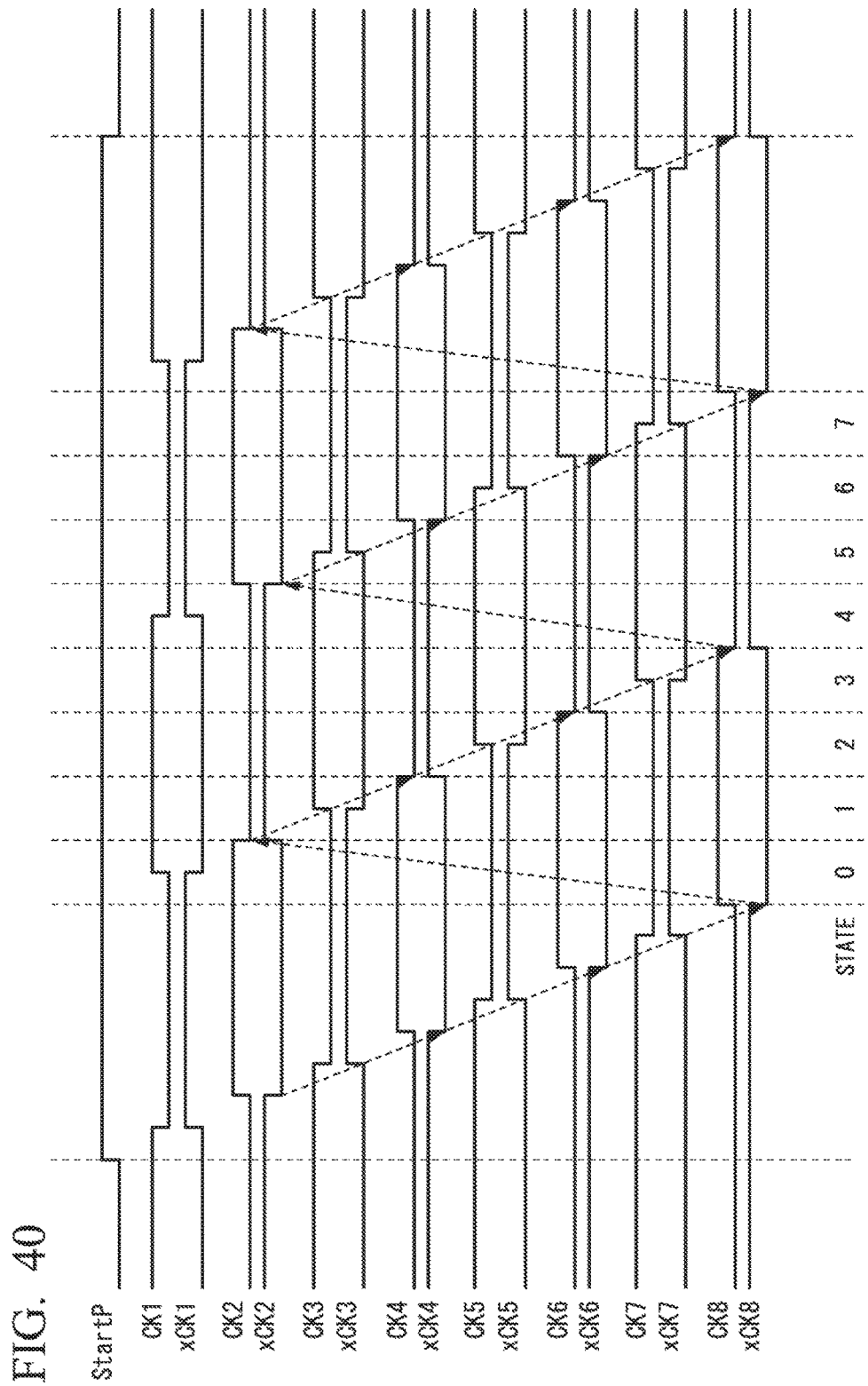
FIG. 40 is a timing chart showing an operation of the encoding circuit in the tdc SS type AD conversion circuit of the second conventional example.
Figure 41:
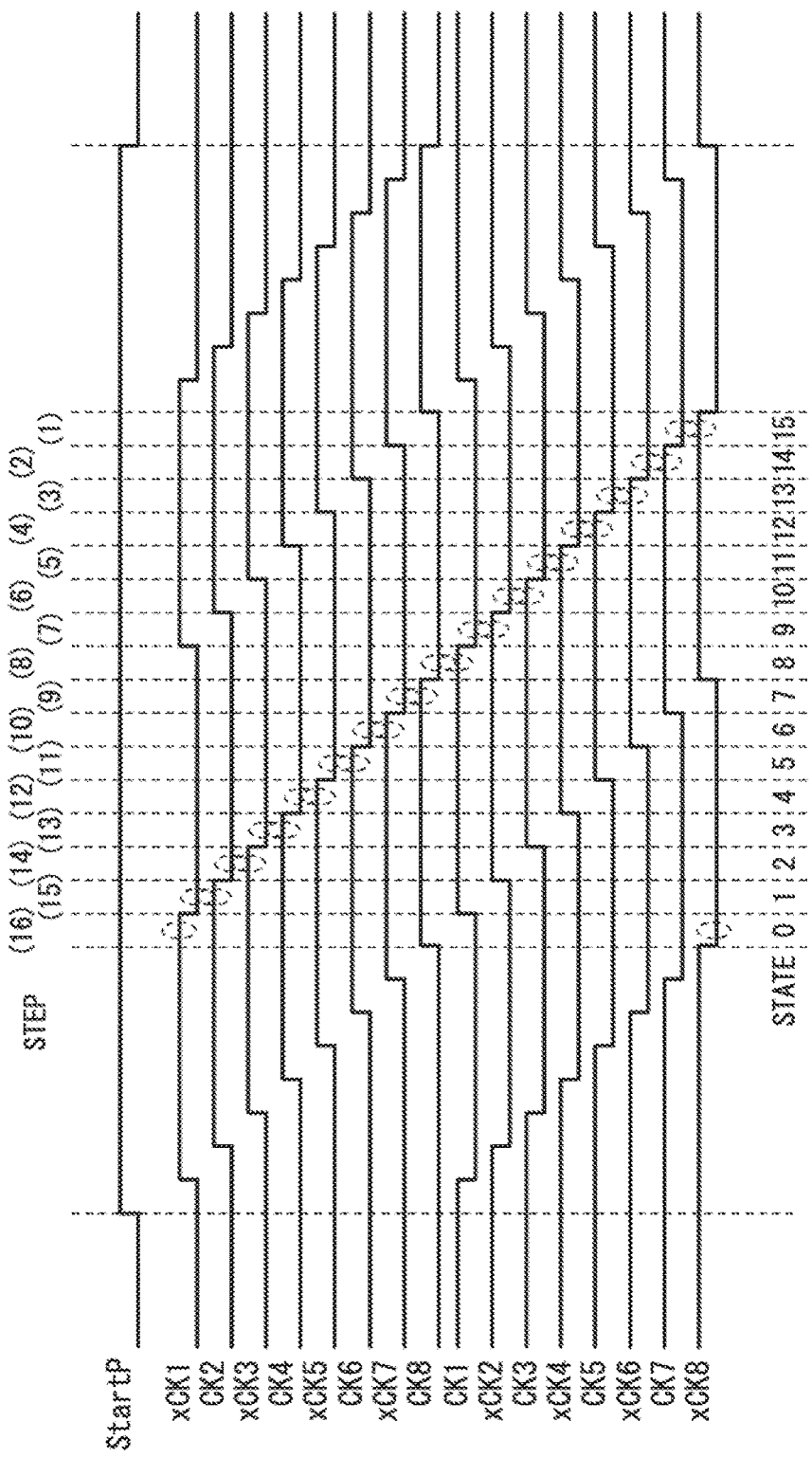
FIG. 41 is a timing chart showing an operation of the encoding circuit in the tdc SS type AD conversion circuit of the first conventional example.
Figure 42:
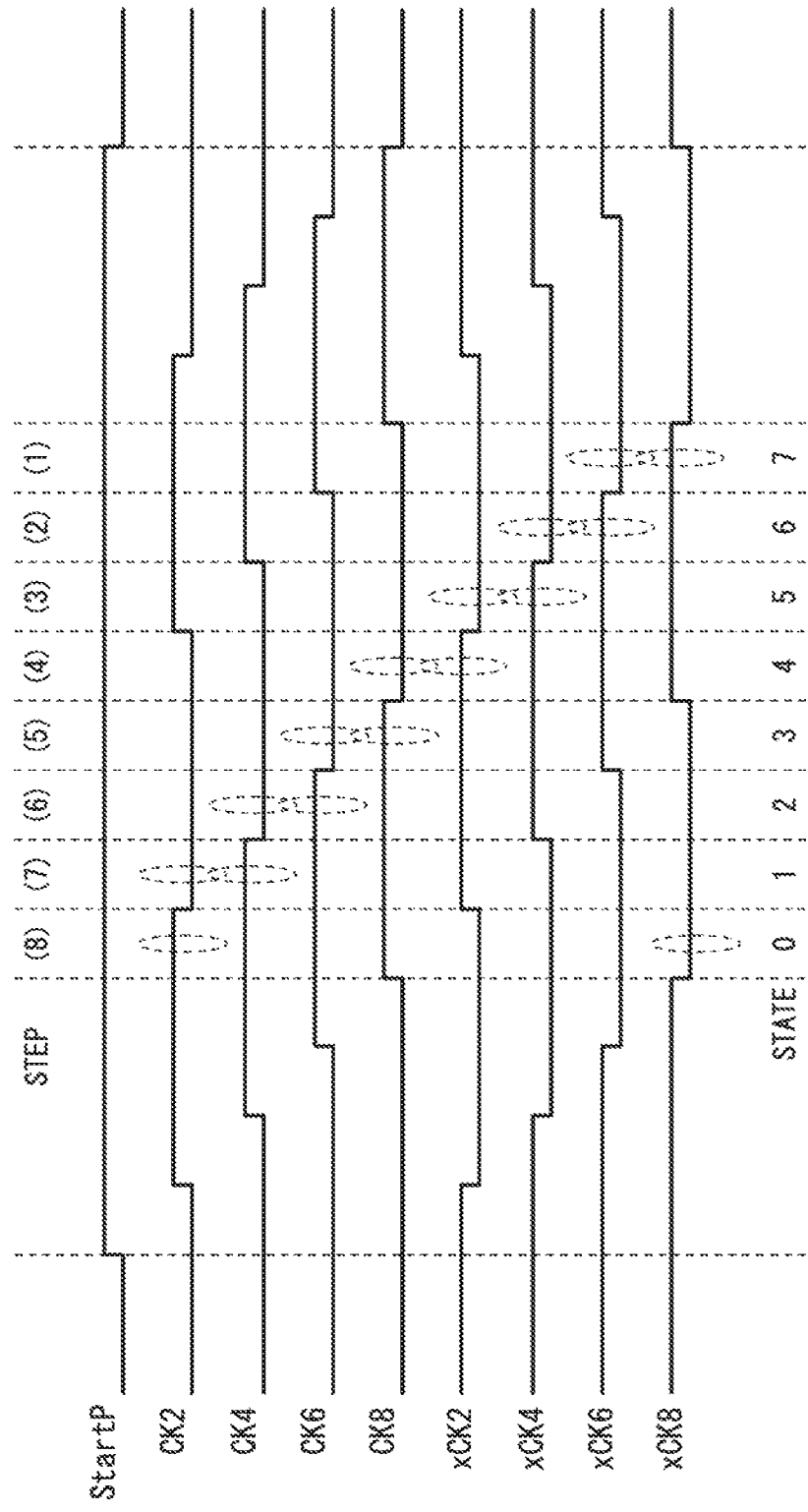
FIG. 42 is a timing chart showing an operation of the encoding circuit in the tdc SS type AD conversion circuit of the second conventional example.

In the fourth embodiment, the number of lower phase signals latched by the latch unit 108d is reduced. As a result, the circuit scale of the latch unit 108d can be reduced. For example, the circuit scale of the latch unit 108d is about half that of the latch unit 1108b shown in FIG. 39.

In the fourth embodiment, the encoding circuit 10d has the same advantages as the conventional encoding circuit. That is, even when the number of clocks generated by the clock generating unit 18d is large, the circuit scale of the encoding circuit 10d is small and the configuration of the encoding circuit 10d is simple.

(Fifth Embodiment)

Figure 21:
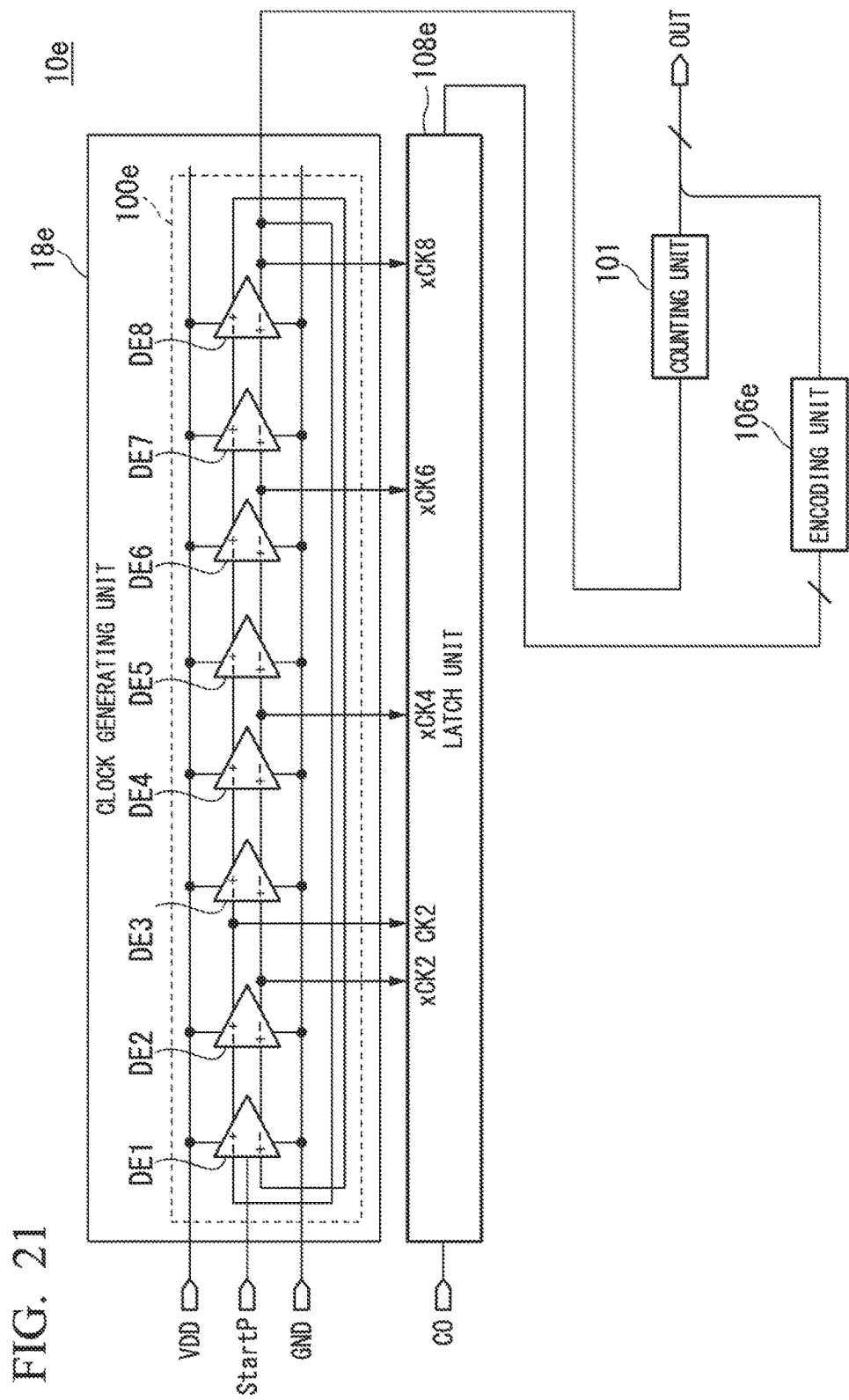
FIG. 21 is a block diagram showing a configuration of an encoding circuit according to a fifth embodiment of the present invention.

FIG. 21 shows a configuration of an encoding circuit 10e according to the fifth embodiment of the present invention. As shown in FIG. 21, the encoding circuit 10e includes a clock generating unit 18e, a latch unit 108e, a counting unit 101, and an encoding unit 106e.

Differences of the configuration shown in FIG. 21 from the configuration shown in FIG. 16 will be described. The clock generating unit 18e includes a delay circuit 100e in which a plurality of fully-differential delay circuits DE1 to DE8 (delay units) are connected in a ring shape. The clock generating unit 18e outputs a plurality of lower phase signals (a lower phase signal CK2 and lower phase signals xCK2, xCK4, xCK6, and xCK8) according to the output signals of the plurality of fully-differential delay circuits DE1 to DE8.

The lower phase signal (delayed signal) generated by the clock generating unit 18e is the same as the lower phase signal generated by the clock generating unit 18a shown in FIG. 1. That is, the clock generating unit 18e generates the lower phase signals CK1 to CK8 and the lower phase signals xCK1 to xCK8. The clock generating unit 18e outputs only some of the plurality of generated lower phase signals (the lower phase signals CK1 to CK8 and the lower phase signals xCK1 to xCK8) for latching by the latch unit 108e. A process in which the clock generating unit 18e outputs the lower phase signal CK2 is different from the fourth embodiment.

In the fifth embodiment, the delay circuit 100e includes fully-differential delay circuits DE1, DE3, DE5, and DE7 which are a plurality of first delay units, fully-differential delay circuits DE4, DE6, and DE8 which are a plurality of second delay units, and a fully-differential delay circuit DE2 which is a third delay unit. The first and second delay units are arranged in pairs in the connection of the plurality of fully-differential delay circuits DE3 to DE8 and DE1. Each first delay unit is connected between two of the second delay units. Each second delay unit is connected between two of the first delay units. That is, the first delay unit and the second delay unit are alternately arranged in the connection of the plurality of fully-differential delay circuits DE3 to DE8 and DE1. The third delay unit is a delay unit different from the fully-differential delay circuit DE8 that outputs the lower phase signal xCK8 which is a reference signal (a count clock of the counting unit 101).

The clock generating unit 18e outputs the lower phase signals xCK4, xCK6, and xCK8 which are second output signals generated by the plurality of second delay units. Also, the clock generating unit 18e outputs the lower phase signal CK2 which is a first output signal generated by the third delay unit and the lower phase signal xCK2 which is a second output signal generated by the third delay unit.

The latch unit 108e latches a plurality of lower phase signals (the lower phase signal CK2 and the lower phase signals xCK2, xCK4, xCK6, and xCK8) output from the clock generating unit 18e at the timing at which a control signal CO is input.

The encoding unit 106e encodes the states of the plurality of lower phase signals (the lower phase signal CK2 and the lower phase signals xCK2, xCK4, xCK6, and xCK8) latched by the latch unit 108e. Thereby, the encoding unit 106e obtains a binary number according to the states of a plurality of lower phase signals latched by the latch unit 108e.

The encoding unit 106e encodes states of a plurality of lower phase signals by performing a first operation, a second operation, and a third operation. The signal group in the fifth embodiment is constituted of some of a plurality of lower phase signals latched by the latch unit 108e. Specifically, the signal group is constituted of lower phase signals other than the lower phase signal CK2 among the plurality of lower phase signals latched by the latch unit 108e. The first operation in the fifth embodiment is substantially the same as the first operation in the fourth embodiment. The second operation in the fifth embodiment is substantially the same as the second operation in the fourth embodiment.

In the third operation in the fifth embodiment, the encoding unit 106e detects that the logic states of the first lower phase signal (first signal) and the second lower phase signal (second signal) are different. The first lower phase signal is the lower phase signal xCK8 included in the signal group. The second lower phase signal is a lower phase signal CK2 not included in the signal group. Also, the second lower phase signal is a signal obtained by inverting the lower phase signal xCK2 different from the first lower phase signal. The second lower phase signal is a signal latched by the latch unit 108e. The third operation is performed between the first operation and the second operation.

The configuration shown in FIG. 21 is substantially the same as that shown in FIG. 16 except for the above points.

Figure 22:
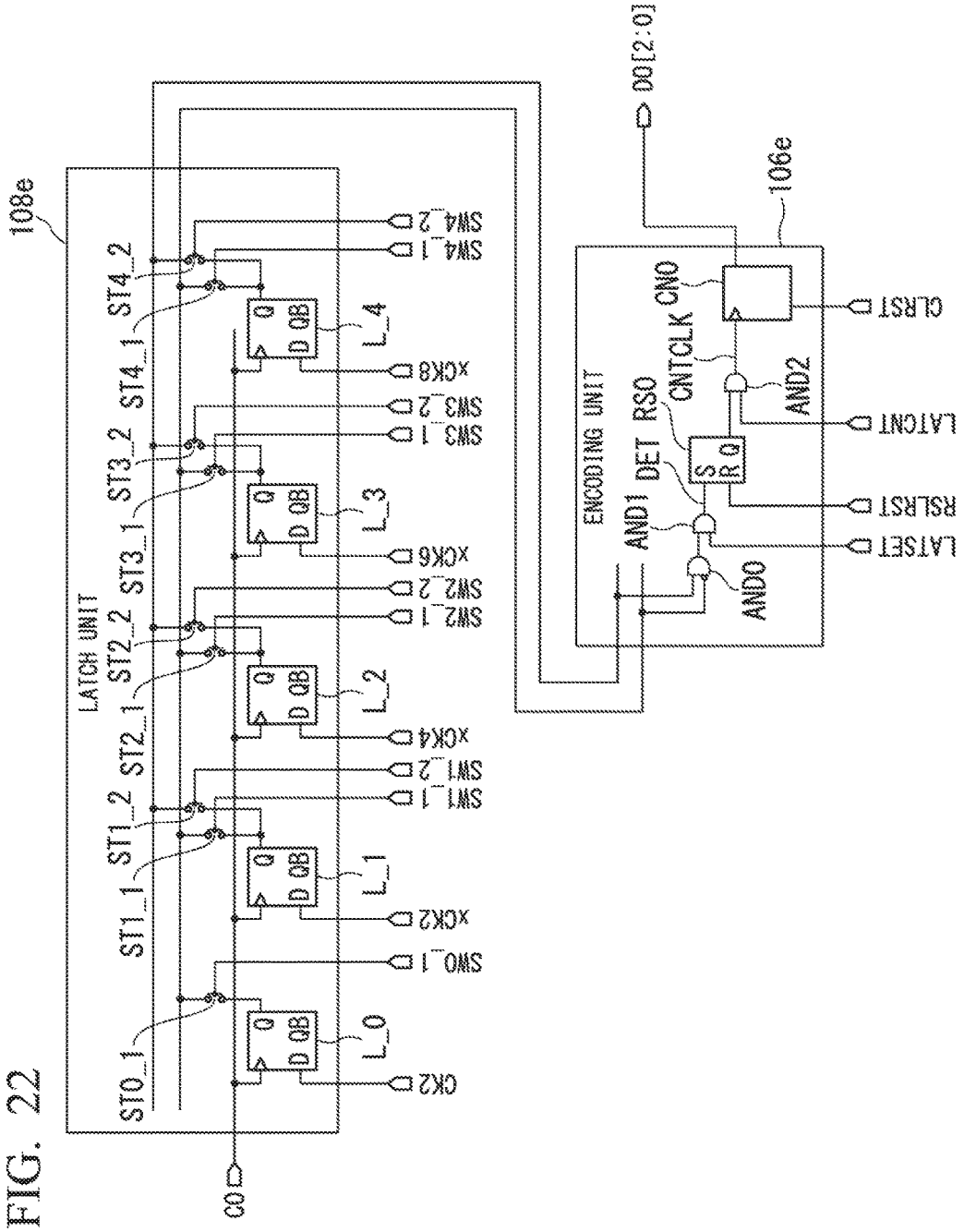
FIG. 22 is a block diagram showing configurations of a latch unit and an encoding unit according to the fifth embodiment of the present invention.

FIG. 22 shows the configurations of the latch unit 108e and the encoding unit 106e. Differences of the configuration shown in FIG. 17 from the configuration shown in FIG. 22 will be described.

The latch unit 108e has a plurality of latch circuits L_0 to L_4, a plurality of switches ST0_1 to ST4_1 and a plurality of switches ST1_2 to ST4_2. The latch circuits L_0 to L_4 latch the states of a plurality of lower phase signals (the lower phase signal CK2 and the lower phase signals xCK2, xCK4, xCK6, and xCK8) at the timing at which the control signal CO from the comparing unit (not shown) is inverted. Control signals SW0_1 to SW4_1 and control signals SW1_2 to SW4_2 are signals for controlling the switches ST0_1 to ST4_1 and the switches ST1_2 to ST4_2 for outputting any one of the plurality of lower phase signals latched by the latch circuits L_0 to L_4 from the output terminals Q of the latch circuits L_0 to L_4 to the encoding unit 106e. In the latch unit 108e, the latch circuit L_0 and the switch ST0_1 are added to the configuration of the latch unit 108d shown in FIG. 17. Also, in the latch unit 108e, the switch xST4_1 is omitted from the configuration of the latch unit 108d shown in FIG. 17. A signal obtained by inverting the lower phase signal CK2 output from the output terminal Q of the latch circuit L_0 via the switch ST0_1 is input to the first input terminal of the AND circuit AND0.

The configuration of the encoding unit 106e is the same as that of the encoding unit 106d shown in FIG. 17. The lower phase signal input to the encoding unit 106e is different from the lower phase signal input to the encoding unit 106d shown in FIG. 17. Thus, the operation of the encoding unit 106e is different from the operation of the encoding unit 106d shown in FIG. 17.

The configuration shown in FIG. 22 is almost the same as the configuration shown in FIG. 17 except for the above points.

Figure 23:
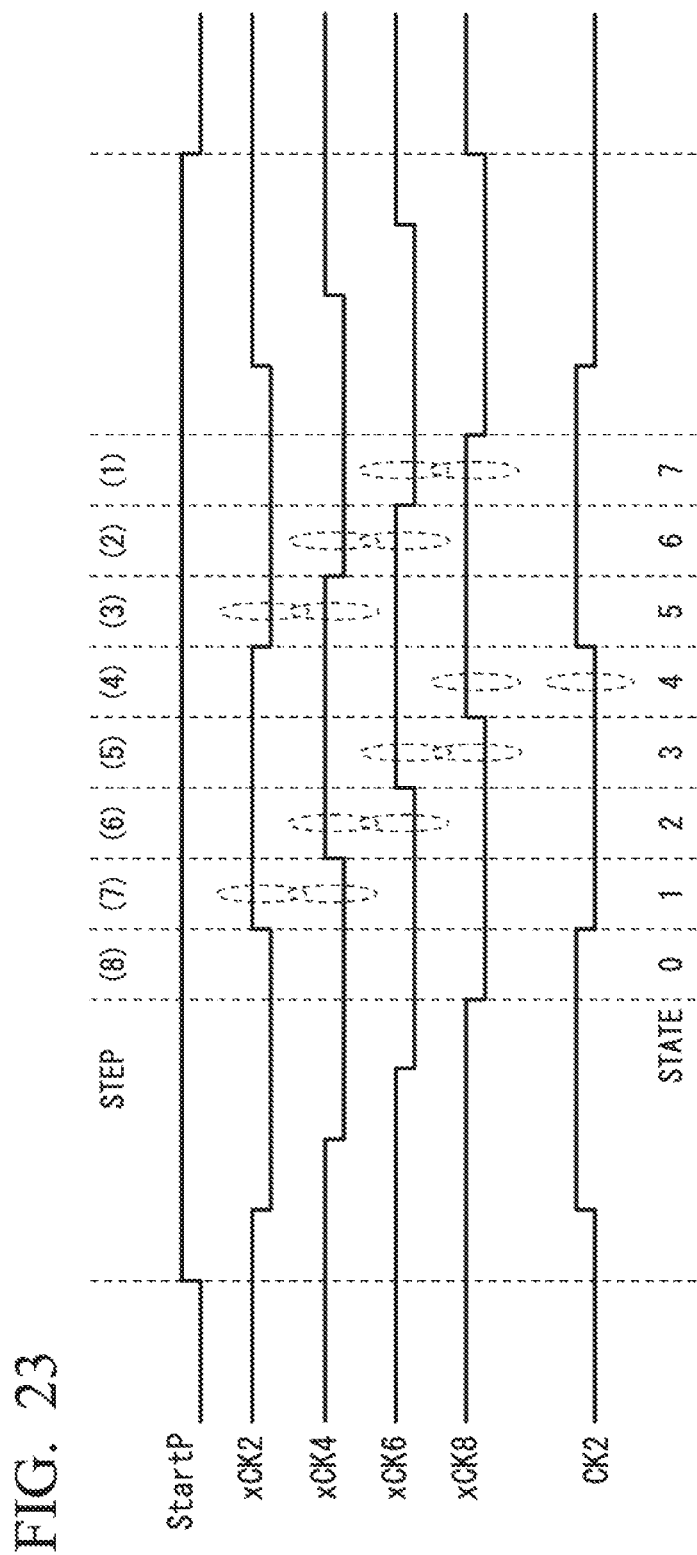
FIG. 23 is a timing chart showing an operation of the encoding circuit according to the fifth embodiment of the present invention.

A procedure of encoding by the encoding circuit 10e will be described. FIG. 23 shows the waveforms of the start pulse StartP, the lower phase signal CK2, and the lower phase signals xCK2, xCK3, xCK4, xCK6, and xCK8 in the encoding circuit 10e. In FIG. 23, the horizontal direction indicates time and the vertical direction indicates voltage.

In FIG. 23, the lower phase signals xCK2, xCK4, xCK6, and xCK8 are arranged to constitute a group of signals falling (changing from the H state to the L state) sequentially. Specifically, the lower phase signals are arranged in the order of the lower phase signals xCK2, xCK4, xCK6, and xCK8. In the signal group, the plurality of lower phase signals are arranged in an order according to an order of connection of the plurality of fully-differential delay circuits DE2, DE4, DE6, and DE8 on the basis of the lower phase signal xCK8 which is the count clock of the counting unit 101. In the order of connection of the plurality of fully-differential delay circuits DE2, DE4, DE6, and DE8, the lower phase signals output from the preceding fully-differential delay circuits are arranged at preceding positions in the signal group.

Specifically, the lower phase signal xCK2 from the fully-differential delay circuit DE2 connected behind two fully-differential delay circuits from the fully-differential delay circuit DE8 that outputs the lower phase signal xCK8 is arranged at the head. Further, the lower phase signals output from the fully-differential delay circuits are arranged so that the order of the plurality of lower phase signals is the same as the order of connection of the fully-differential delay circuits DE2. DE4, DE6, and DE8. In addition to the plurality of lower phase signals constituting the signal group, the lower phase signal CK2 output by the fully-differential delay circuit DE2 is arranged. The plurality of lower phase signals may be arranged to constitute a group of signals rising (changing from the L state to the H state) sequentially at predetermined time intervals. The lower phase signal CK4 or CK6 obtained by inverting the lower phase signal xCK4 or xCK6 having the falling edge between the falling edge of the lower phase signal xCK2 and the falling edge of the lower phase signal xCK8 may be used instead of the lower phase signal CK2.

In the signal group (signal string) in which the plurality of lower phase signals latched by the latch unit 108e are arranged in the above-described order and the lower phase signal CK2, the logic states of two continuous lower phase signals are sequentially detected. If it is detected that the logic states of the two continuous lower phase signals are predetermined states (thermometer codes), the states of a plurality of lower phase signals are determined according to a position at which the states are detected.

For example, the logic states of two continuous lower phase signals are sequentially detected from the bottom to the top of the signal group shown in FIG. 23 and the lower phase signal CK2. In the case of states 5 to 7, in the signal group, the logic state changes from the H state to the L state between two continuous lower phase signals. In the case of state 4, the logic state changes from the L state to the H state between the lower phase signal CK2 not included in the signal group and the lower phase signal xCK8 included in the signal group. In the case of states 1 to 3, in the signal group, the logic state changes from the L state to the H state between two continuous lower phase signals. In the case of state 0, in the signal group, the logic state of each of the lower phase signals is the L state. In the fifth embodiment, when states 1 to 7 are not detected, it is determined that the state of each of the plurality of lower phase signals is state 0.

Specifically, encoding is performed by performing the following processing of steps (1) to (7) in time series.

(Step (1)) . . . Determination related to state 7

The logic states of the lower phase signal xCK8 and the lower phase signal xCK6 are compared. If there is a thermometer code "10" at this position, the state of each of a plurality of lower phase signals is determined to be state 7. Step (1) corresponds to the first operation.

(Step (2)) . . . Determination related to state 6

The logic states of the lower phase signal xCK6 and the lower phase signal xCK4 are compared. If there is a thermometer code "10" at this position, the state of each of a plurality of lower phase signals is determined to be state 6. Step (2) corresponds to the first operation.

(Step (3)) . . . Determination related to state 5

The logic states of the lower phase signal xCK4 and the lower phase signal xCK2 are compared. If there is a thermometer code "10" at this position, the state of each of a plurality of lower phase signals is determined to be state 5. Step (3) corresponds to the first operation.

(Step (4)) . . . Determination related to state 4

The logic states of the lower phase signal CK2 and the lower phase signal xCK8 are compared. If there is a thermometer code "01" at this position, the state of each of a plurality of lower phase signals is determined to be state 4. Step (4) corresponds to the third operation.

(Step (5)) . . . Determination related to state 3

The logic states of the lower phase signal xCK8 and the lower phase signal xCK6 are compared. If there is a thermometer code "01" at this position, the state of each of a plurality of lower phase signals is determined to be state 3. Step (5) corresponds to the second operation.

(Step (6)) . . . Determination related to state 2

The logic states of the lower phase signal xCK6 and the lower phase signal xCK4 are compared. If there is a thermometer code "01" at this position, the state of each of a plurality of lower phase signals is determined to be state 2. Step (6) corresponds to the second operation.

(Step (7)) . . . Determination related to state 1

The logic states of the lower phase signal xCK4 and the lower phase signal xCK2 are compared. If there is a thermometer code "01" at this position, the state of each of a plurality of lower phase signals is determined to be state 1. Step (7) corresponds to the second operation.

Steps (1) to (3) and steps (5) to (7) in the fifth embodiment are the same as those in the fourth embodiment. Step (4) in the fifth embodiment is different from step (4) in the fourth embodiment. In steps (1) to (7), if it is determined that the state of each of the plurality of lower phase signals is not any one of states 1 to 7, the state of each of the plurality of lower phase signals is state 0. Thus, no particular determination related to state 0 is necessary. When the encoding unit 106e detects the thermometer code, the control signals SW0_1 to SW4_1 and the control signals SW1_2 to SW4_2 are controlled so that the above-described procedure is implemented.

Figure 24:
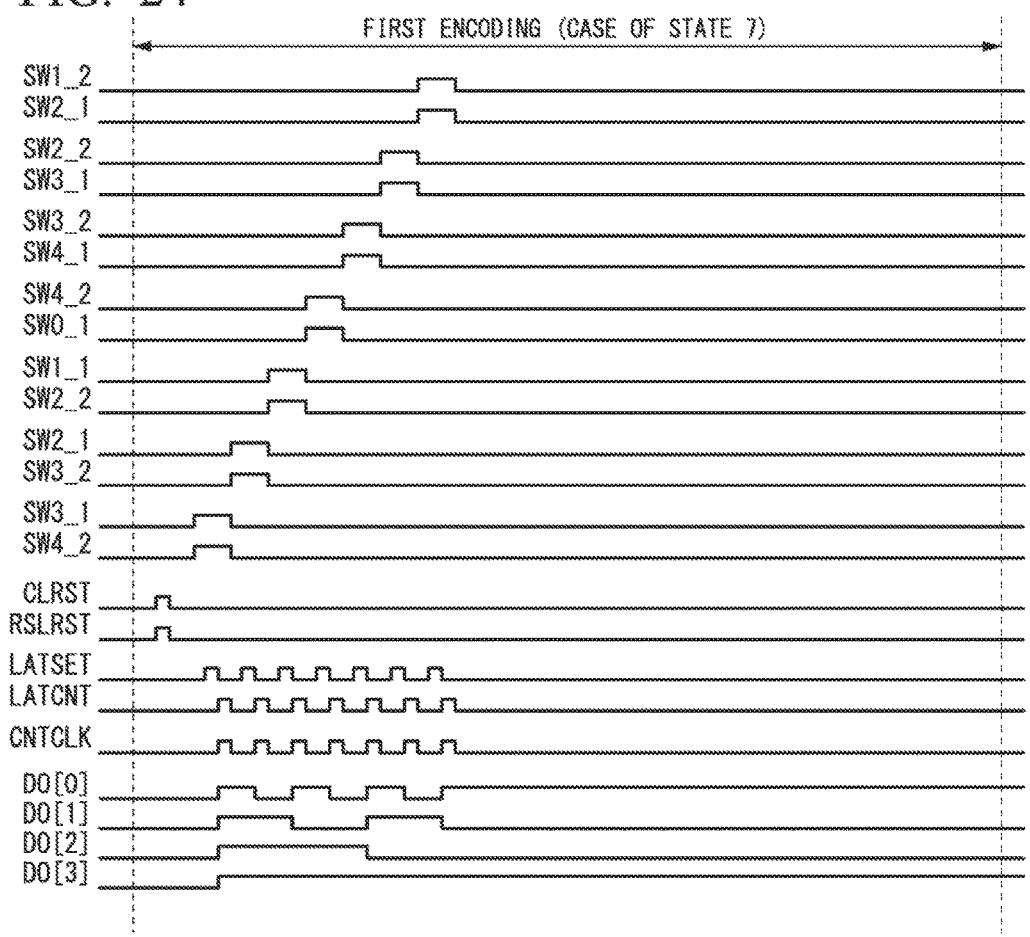
FIG. 24 is a timing chart showing an encoding procedure according to the fifth embodiment of the present invention.
Figure 25:
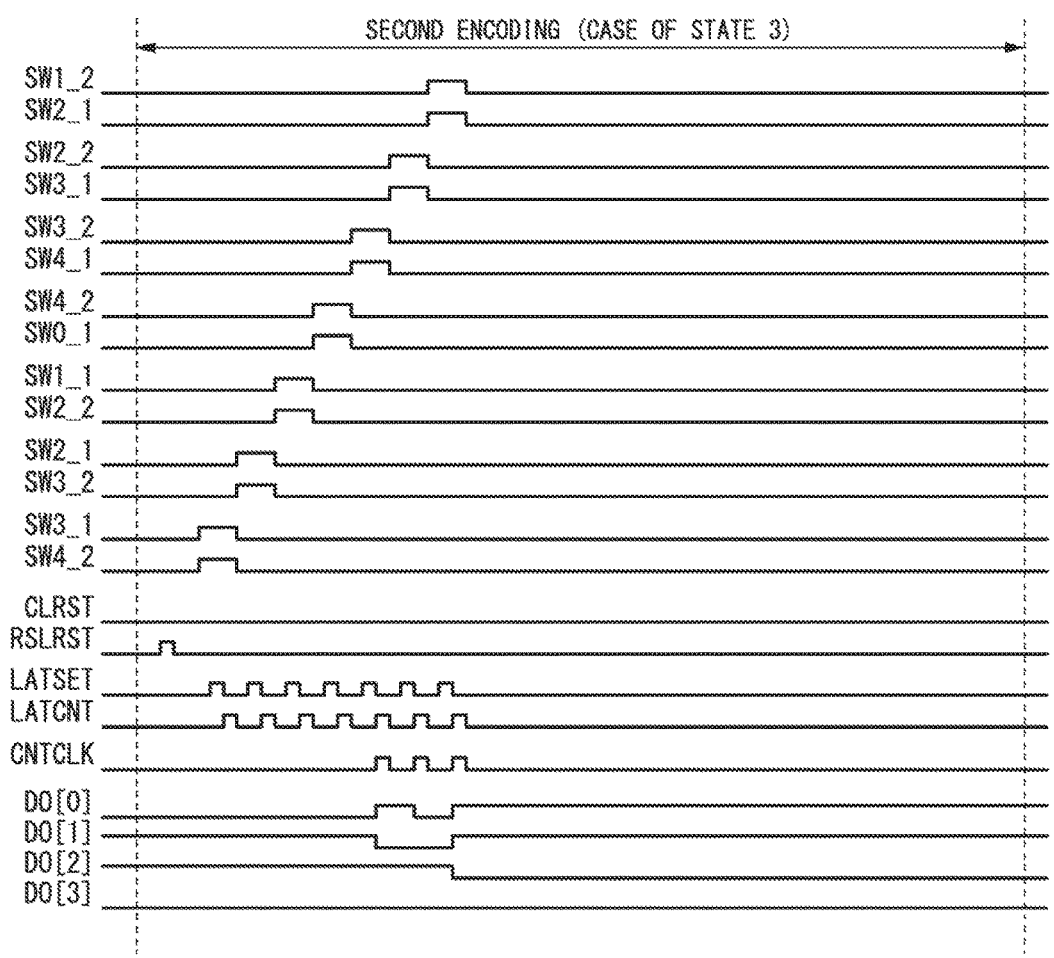
FIG. 25 is a timing chart showing an encoding procedure according to the fifth embodiment of the present invention.

FIGS. 24 and 25 show waveforms of encoding-related signals. In FIGS. 24 and 25, the horizontal direction indicates time and the vertical direction indicates voltage. An example in which first encoding which is the encoding of state 7 and second encoding which is the encoding of state 3 are performed continuously will be described. This example is applicable to the subtraction of the reset level and the signal level in the imaging device. In this example, a value of −4 is obtained by subtracting an encoded value of 7 corresponding to state 7 from an encoded value of 3 corresponding to state 3.

The outline of the operation will be described. A lower phase signal CK2 or a lower phase signal xCK* is output from any two of the latch circuits L_0 to L_4 by which the lower phase signal CK2 and the lower phase signals xCK2, xCK4, xCK6, and xCK8 are latched according to the control signals SW0_1 to SW4_1 and the control signals SW1_2 to SW4_2. * in the description of the fifth embodiment denotes an integer of 2, 4, 6, and 8. The lower phase signal CK2 or the lower phase signal xCK* output from the two latch circuits is input to the encoding unit 106e. The encoding unit 106e detects the thermometer code on the basis of the input lower phase signal CK2 or the lower phase signal xCK*. In this example, the thermometer code is a logic state corresponding to an edge position changing from the H state to the L state and an edge position changing from the L state to the H state.

If a result of an AND operation on the lower phase signal xCK* output from one latch circuit L_* and a signal obtained by inverting the lower phase signal CK2 or the lower phase signal xCK* output from another latch circuit L_0 or L_* indicates the H state, the thermometer code is detected. At the timing at which the thermometer code is detected, the generation of the lower count signal CNTCLK having a number of pulses according to the states of the lower phase signal CK2 and the lower phase signals xCK2, xCK4, xCK6, and xCK8 starts. At the same time, the counter circuit CN0 starts the counting of the lower count signal CNTCLK. Count values DO[0] to DO[2] of the counter circuit CN0 when the count operation is completed are encoding results.

Detailed operations in steps (1) to (7) will be described. At the timing at which the predetermined condition is satisfied, the logic state of the control signal CO from the comparing unit (not shown) changes. Thereby, the logic states of the lower phase signal CK2 and the lower phase signals xCK2, xCK4, xCK6, and xCK8 output from the clock generating unit 18e are latched by the latch unit 108e.

Subsequently, the first encoding shown in FIG. 24 starts. The RS latch RS0 is reset by the control signal RSLRST. At this time, the output signal of the RS latch RS0 is in the L state. Also, the counter circuit CN0 is reset by the control signal CLRST. At this time, the count value of the counter circuit CN0 is the initial value of the first encoding, i.e., 3'b[0]000. After the RS latch RS0 and the counter circuit CN0 are reset, the control signals SW0_1 to SW4_1 and the control signals SW1_2 to SW4_2 change to the H state in a predetermined order.

(Step (1))

The control signal SW4_2 and the control signal SW3_1 change to the H state. Thereby, the lower phase signal xCK8 (H state) latched by the latch circuit L_4 and a signal obtained by inverting the lower phase signal xCK6 (L state) latched by the latch circuit L_3 are input to the AND circuit AND0. At this time, the output signal of the AND circuit AND0 is in the H state. The control signal LATSET changes from the L state to the H state and then changes to the L state. Meanwhile, the detection signal DET changes from the L state to the H state and then changes to the L state. Thereby, the output signal of the RS latch RS0 changes to the H state. The control signal LATCNT changes from the L state to the H state and then changes to the L state. Thereby, the AND circuit AND2 outputs a lower count signal CNTCLK of one pulse. The counter circuit CN0 performs a count operation on the basis of the lower count signal CNTCLK. Thus, the count value of the counter circuit CN0 decreases.

(Steps (2) and (3))

As the same in step (1), the lower phase signal xCK* output from one latch circuit L_* and a signal obtained by inverting the lower phase signal xCK* output from another latch circuit L_* are input to the AND circuit AND0. In both step (2) and step (3), regardless of the output signal of the AND circuit AND0, the output signal of the RS latch RS0 is kept in the H state. The control signal LATCNT changes from the L state to the H state and then changes to the L state. Thereby, in each step, the AND circuit AND2 outputs a lower count signal CNTCLK of one pulse. The counter circuit CN0 performs a count operation on the basis of the lower count signal CNTCLK. Thus, the count value of the counter circuit CN0 decreases.

(Step (4))

The control signal SW0_1 and the control signal SW4_2 change to the H state. Thereby, a signal obtained by inverting the lower phase signal CK2 (H state) latched by the latch circuit L_0 and the lower phase signal xCK8 (H state) latched by the latch circuit L_4 are input to the AND circuit AND0. At this time, regardless of the output signal of the AND circuit AND0, the output signal of the RS latch RS0 is kept in the H state. The control signal LATCNT changes from the L state to the H state and then changes to the L state. Thereby, in each step, the AND circuit AND2 outputs a lower count signal CNTCLK of one pulse. The counter circuit CN0 performs a count operation on the basis of the lower count signal CNTCLK. Thus, the count value of the counter circuit CN0 decreases.

(Step (5))

The control signal SW4_1 and the control signal SW3_2 change to the H state. Thereby, a signal obtained by inverting the lower phase signal xCK8 (H state) latched by the latch circuit L_4 and the lower phase signal xCK6 (L state) latched by the latch circuit L_3 are input to the AND circuit AND0. At this time, regardless of the output signal of the AND circuit AND0, the output signal of the RS latch RS0 is kept in the H state. The control signal LATCNT changes from the L state to the H state and then changes to the L state. Thereby, in each step, the AND circuit AND2 outputs a lower count signal CNTCLK of one pulse. The counter circuit CN0 performs a count operation on the basis of the lower count signal CNTCLK. Thus, the count value of the counter circuit CN0 decreases.

(Steps (6) and (7))

As the same in step (5), a signal obtained by inverting the lower phase signal xCK* output from one latch circuit L_* and the lower phase signal xCK* output from another latch circuit L_* are input to an AND circuit AND0. In both of steps (6) and (7), regardless of the output signal of the AND circuit AND0, the output signal of the RS latch RS0 is kept in the H state. The control signal LATCNT changes from the L state to the H state and then changes to the L state. Thereby, in each step, the AND circuit AND2 outputs one pulse lower count signal CNTCLK. The counter circuit CN0 performs a count operation on the basis of the lower count signal CNTCLK. Thus, the count value of the counter circuit CN0 decreases.

When the processing of step (7) is completed, the count value of the counter circuit CN0 is 3'b[1]001. This count value corresponds to −7. Upon completion of the processing of step (7), the first encoding shown in FIG. 24 is completed.

After the processing of step (7) is completed, the count value of the counter circuit CN0 is inverted. At this time, the count value of the counter circuit CN0 is 3'b[0]110. This count value corresponds to 6.

Subsequently, the second encoding shown in FIG. 25 starts. The RS latch RS0 is reset by the control signal RSLRST. The counter circuit CN0 is not reset by the control signal CLRST. At this time, the count value of the counter circuit CN0 is the initial value of the second encoding, i.e., 3'b[0]110. After the RS latch RS0 is reset, the control signals SW0_1 to SW4_1 and the control signals SW1_2 to SW4_2 change to the H state in a predetermined order.

(Step (1))

The control signal SW4_2 and the control signal SW3_1 change to the H state. Thereby, the lower phase signal xCK8 (L state) held in the latch circuit L_4 and a signal obtained by inverting the lower phase signal xCK6 (H state) latched by the latch circuit L_3 are input to the AND circuit AND0. At this time, the output signal of the AND circuit AND0 is in the L state. The control signal LATSET changes from the L state to the H state and then changes to the L state. Meanwhile, the detection signal DET is kept in the L state. Thus, the output signal of the RS latch RS0 is kept in the L state. As a result, the lower count signal CNTCLK is in the L state. At this time, the count value of the counter circuit CN0 is the initial value of the second encoding.

(Steps (2) and (3))

As the same in step (1), the lower phase signal xCK* output from one latch circuit L_* and a signal obtained by inverting the lower phase signal xCK* output from another latch circuit L_* are input to the AND circuit AND0. In both of steps (2) and (3), the output signal of the AND circuit AND0 is in the L state. The control signal LATSET changes from the L state to the H state and then changes to the L state. Meanwhile, the detection signal DET is kept in the L state. Thus, the output signal of the RS latch RS0 is kept in the L state. As a result, the lower count signal CNTCLK is in the L state. At this time, the count value of the counter circuit CN0 is the initial value of the second encoding.

(Step (4))

The control signal SW0_1 and the control signal SW4_2 change to the H state. Thereby, a signal obtained by inverting the lower phase signal CK2 (L state) latched by the latch circuit L_0 and the lower phase signal xCK8 (L state) held in the latch circuit L_4 are input to the AND circuit AND0. At this time, the output signal of the AND circuit AND0 is in the L state. The control signal LATSET changes from the L state to the H state and then changes to the L state. Meanwhile, the detection signal DET is kept in the L state. Thus, the output signal of the RS latch RS0 is kept in the L state. As a result, the lower count signal CNTCLK is in the L state. At this time, the count value of the counter circuit CN0 is the initial value of the second encoding.

(Step (5))

The control signal SW4_1 and the control signal SW3_2 change to the H state. Thereby, a signal obtained by inverting the lower phase signal xCK8 (L state) latched by the latch circuit L_4 and the lower phase signal xCK6 (H state) latched by the latch circuit L_3 are input to the AND circuit AND0. At this time, the output signal of the AND circuit AND0 is in the H state. The control signal LATSET changes from the L state to the H state and then changes to the L state. Meanwhile, the detection signal DET changes from the L state to the H state and then changes to the L state. Thereby, the output signal of the RS latch RS0 changes to the H state. The control signal LATCNT changes from the L state to the H state and then changes to the L state. Thereby, the AND circuit AND2 outputs a lower count signal CNTCLK of one pulse. The counter circuit CN0 performs a count operation on the basis of the lower count signal CNTCLK. Thus, the count value of the counter circuit CN0 decreases.

(Steps (6) and (7))

As the same in step (5), a signal obtained by inverting the lower phase signal xCK* output from one latch circuit L_* and the lower phase signal xCK*output from another latch circuit L_* are input to the AND circuit AND0. In both of steps (6) and (7), regardless of the output signal of the AND circuit AND0, the output signal of the RS latch RS0 is kept in the H state. The control signal LATCNT changes from the L state to the H state and then changes to the L state. Thereby, in each step, the AND circuit AND2 outputs a lower count signal CNTCLK of one pulse. The counter circuit CN0 performs a count operation on the basis of the lower count signal CNTCLK. Thus, the count value of the counter circuit CN0 decreases.

When the processing of step (7) is completed, the count value of the counter circuit CN0 is 3'b[0]011. This count value corresponds to 3. When the processing of step (7) is completed, the second encoding shown in FIG. 25 is completed.

After the processing of step (7) is completed, the count value of the counter circuit CN0 is inverted. At this time, the count value of the counter circuit CN0 is 3'b[1]100. This count value corresponds to −4. That is, the value of −4 is obtained by subtracting an encoded value of 7 corresponding to state 7 from an encoded value of 3 corresponding to state 3.

In the fifth embodiment, the number of lower phase signals latched by the latch unit 108e is reduced. As a result, the circuit scale of the latch unit 108e can be reduced. For example, the circuit scale of the latch unit 108e is about half that of the latch unit 1108b shown in FIG. 39.

In the fifth embodiment, the encoding circuit 10e has the same advantages as the conventional encoding circuit. That is, even when the number of clocks generated by the clock generating unit 18e is large, the circuit scale of the encoding circuit 10e is small and the configuration of the encoding circuit 10e is simple.

(Sixth Embodiment)

Figure 26:
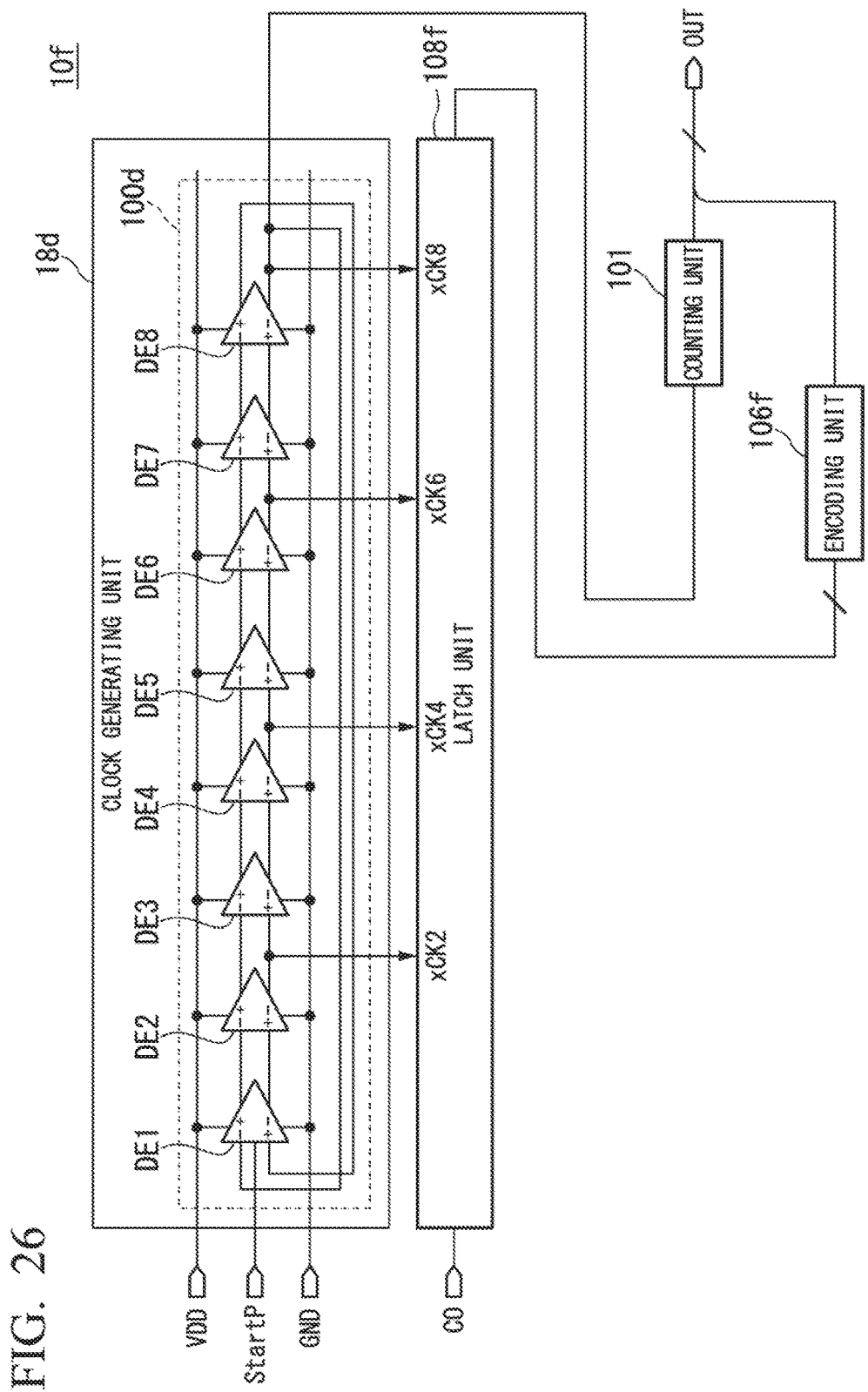
FIG. 26 is a block diagram showing a configuration of an encoding circuit according to a sixth embodiment of the present invention.

FIG. 26 shows a configuration of an encoding circuit 10f according to the sixth embodiment of the present invention. As shown in FIG. 26, the encoding circuit 10f includes a clock generating unit 18d, a latch unit 108f, a counting unit 101, and an encoding unit 106f.

Differences of the configuration shown in FIG. 26 from the configuration shown in FIG. 16 will be described. The latch unit 108f latches a plurality of lower phase signals (lower phase signals xCK2, xCK4, xCK6, and xCK8) output from the clock generating unit 18d at the timing at which a control signal CO is input. The configuration of the latch unit 108f is different from that of the latch unit 108d shown in FIG. 16.

The encoding unit 106f encodes the states of the plurality of lower phase signals (the lower phase signals xCK2, xCK4, xCK6, and xCK8) latched by the latch unit 108f. Thereby, the encoding unit 106f obtains a binary number according to the states of the plurality of lower phase signals latched by the latch unit 108f.

The encoding unit 106f encodes states of a plurality of lower phase signals by performing a first operation, a second operation, and a third operation. A signal group in the sixth embodiment is constituted of all the plurality of lower phase signals latched by the latch unit 108f. The first operation in the sixth embodiment is substantially the same as the first operation in the fourth embodiment. The second operation in the sixth embodiment is substantially the same as the second operation in the fourth embodiment.

In the third operation in the sixth embodiment, the encoding unit 106f detects that the logic states of the first lower phase signal (first signal) and the second lower phase signal (second signal) are different. The first lower phase signal is the lower phase signal xCK8 included in the signal group. The second lower phase signal is a signal (lower phase signal CK6) obtained by inverting the lower phase signal xCK6 different from the first lower phase signal. Also, the second lower phase signal is a signal generated from the lower phase signal xCK6 latched by the latch unit 108f. The third operation is performed between the first operation and the second operation.

The configuration shown in FIG. 26 is substantially the same as that shown in FIG. 16 except for the above points.

Figure 27:
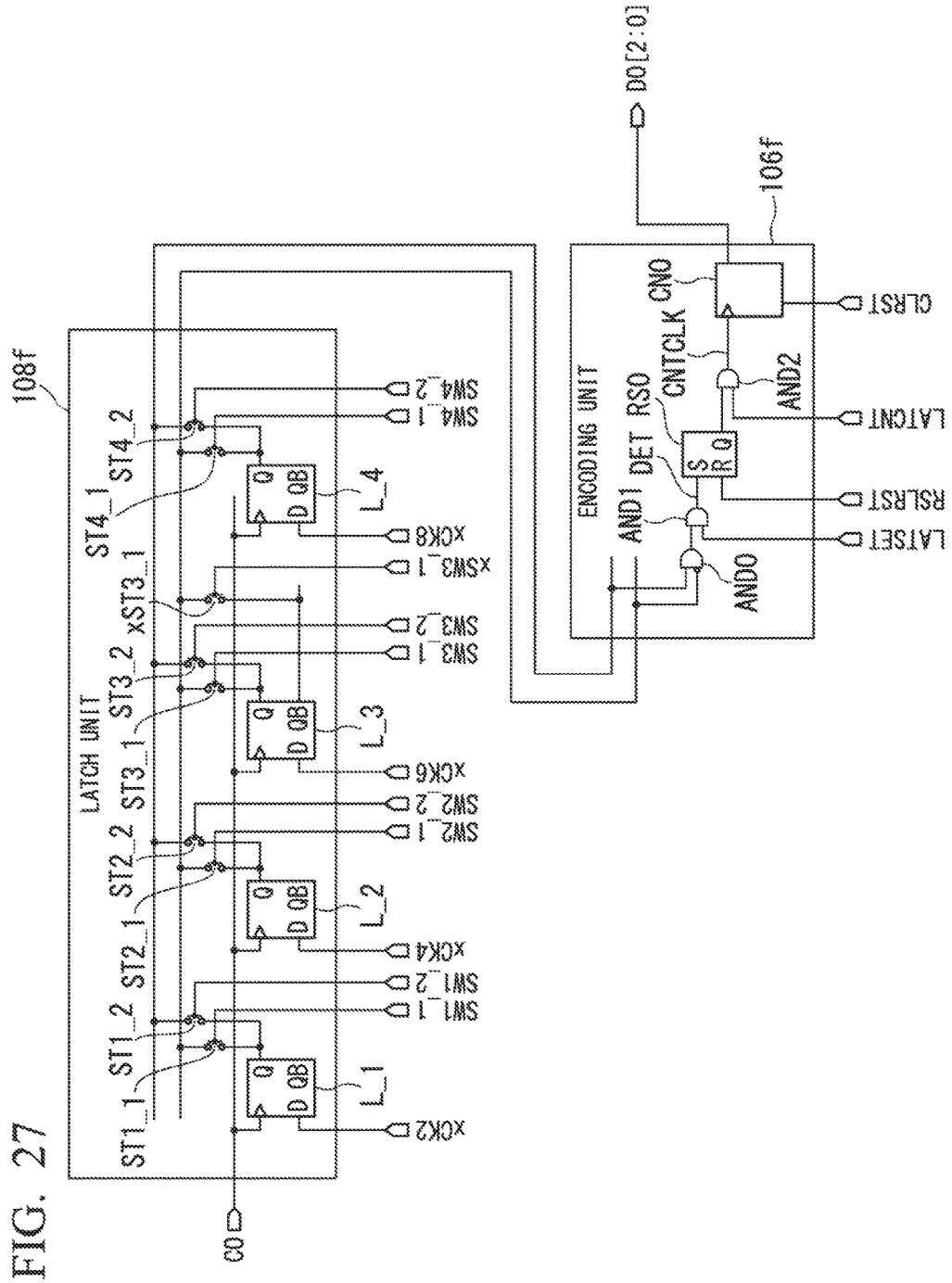
FIG. 27 is a block diagram showing configurations of a latch unit and an encoding unit according to the sixth embodiment of the present invention.

FIG. 27 shows the configurations of the latch unit 108f and the encoding unit 106f. Differences of the configuration shown in FIG. 27 from the configuration shown in FIG. 17 will be described.

The latch unit 108f includes a plurality of latch circuits L_1 to L_4, a plurality of switches ST1_1 to ST4_1, a plurality of switches ST1_2 to ST4_2, and a switch xST3_1. The latch circuits L_1 to L_4 latch the states of a plurality of lower phase signals (lower phase signals xCK2, xCK4, xCK6, and xCK8) at the timing at which the control signal CO from the comparing unit (not shown) is inverted. Control signals SW1_1 to SW4_1 and control signals SW1_2 to SW4_2 are signals which control the switches ST1_1 to ST 4_1 and the switches ST1_2 to ST 4_2 for outputting any one of the plurality of lower phase signals latched by the latch circuits L_1 to L_4 from the output terminals Q of the latch circuits L_1 to L_4 to the encoding unit 106f. In the latch unit 108f the switch xST3_1 is added to the configuration of the latch unit 108d shown in FIG. 17. A signal obtained by inverting the lower phase signal xCK6 output from the inverting output terminal QB of the latch circuit L_3 via the switch xST3_1 is input to the first input terminal of the AND circuit AND0.

The configuration of the encoding unit 106*f* is the same as that of the encoding unit 106*d* shown in FIG. 17. The lower phase signal input to the encoding unit 106*f* is different from the lower phase signal input to the encoding unit 106*d* shown in FIG. 17. Thus, the operation of the encoding unit 106*f* is different from the operation of the encoding unit 106*d* shown in FIG. 17.

The configuration shown in FIG. 27 is substantially the same as that shown in FIG. 17 except for the above points.

Figure 28:
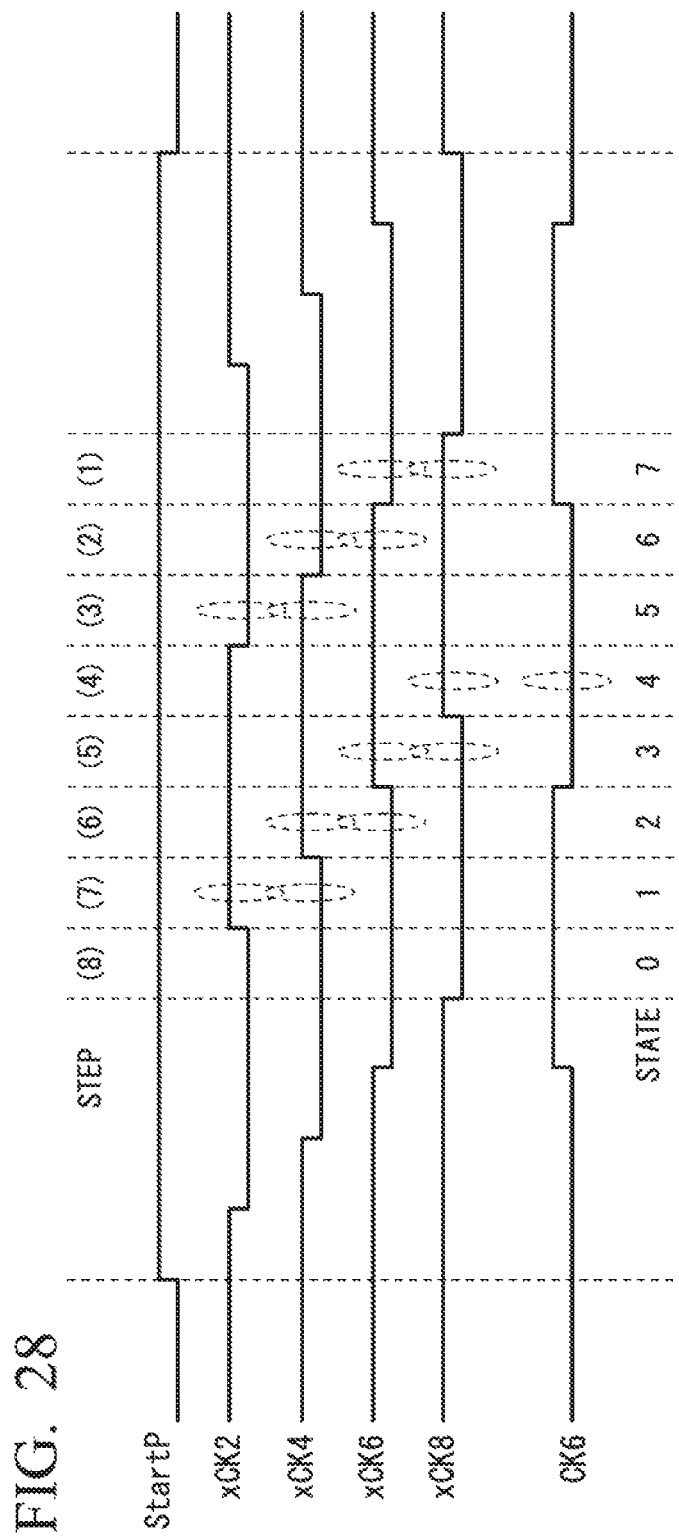
FIG. 28 is a timing chart showing an operation of the encoding circuit according to the sixth embodiment of the present invention.

The procedure of encoding by the encoding circuit 10*f* will be described. FIG. 28 shows the waveforms of the start pulse StartP, the lower phase signal CK6, and the lower phase signals xCK2, xCK4, xCK6, and xCK8 in the encoding circuit 10*f*. In FIG. 28, the horizontal direction indicates time and the vertical direction indicates voltage.

In FIG. 28, the lower phase signals xCK2, xCK4, xCK6, and xCK8 are arranged to constitute a group of signals falling (changing from the H state to the L state) sequentially. Specifically, the lower phase signals are arranged in the order of the lower phase signals xCK2, xCK4, xCK6, and xCK8. In this signal group, the plurality of lower phase signals are arranged in an order according to an order of connection of the plurality of fully-differential delay circuits DE2, DE4, DE6, and DE8 on the basis of the lower phase signal xCK8 which is the count clock of the counting unit 101. In the order of connection of the plurality of fully-differential delay circuits DE2, DE4, DE6, and DE8, the lower phase signals output from the preceding fully-differential delay circuits are arranged at preceding positions in the signal group.

Specifically, the lower phase signal xCK2 from the fully-differential delay circuit DE2 connected behind two fully-differential delay circuits from the fully-differential delay circuit DE8 that outputs the lower phase signal xCK8 is arranged at the head. Further, the lower phase signals output from the fully-differential delay circuits are arranged so that the order of the plurality of lower phase signals is the same as the order of connection of the fully-differential delay circuits DE2, DE4, DE6, and DE8. In addition to the plurality of lower phase signals constituting the signal group, the lower phase signal CK6 obtained by inverting the lower phase signal xCK6 output by the fully-differential delay circuit DE6 is arranged. The plurality of lower phase signals may be arranged to constitute a group of signals rising (changing from the L state to the H state) sequentially at predetermined time intervals. The lower phase signal CK2 or CK4 obtained by inverting the lower phase signal xCK2 or xCK4 having the falling edge between the falling edge of the lower phase signal CK2 and the falling edge of the lower phase signal xCK8 may be used instead of the lower phase signal CK6.

In the signal group (signal string) in which the plurality of lower phase signals latched by the latch unit 108*f* are arranged in the above-described order and the lower phase signal CK6, the logic states of two continuous lower phase signals are sequentially detected. If it is detected that the logic states of the two continuous lower phase signals are predetermined states (thermometer codes), the states of a plurality of lower phase signals are determined according to a position at which the states are detected.

For example, the logic states of two continuous lower phase signals are sequentially detected from the bottom to the top of the signal group shown in FIG. 28 and the lower phase signal CK6. In the case of states 5 to 7, in the signal group, the logic state changes from the H state to the L state between two continuous lower phase signals. In the case of state 4, the logic state changes from the L state to the H state between the lower phase signal CK6 obtained by inverting the lower phase signal xCK6 included in the signal group and the lower phase signal xCK8 included in the signal group. In the case of states 1 to 3, in the signal group, the logic state changes from the L state to the H state between two continuous lower phase signals. In the case of state 0, in the signal group, the logic state of each of the lower phase signals is the L state. In the sixth embodiment, when states 1 to 7 are not detected, it is determined that the state of each of the plurality of lower phase signals is state 0.

Specifically, encoding is performed by performing the following processing of steps (1) to (7) in time series.

(Step (1)) . . . Determination related to state 7

The logic states of the lower phase signal xCK8 and the lower phase signal xCK6 are compared. If there is a thermometer code "10" at this position, the state of each of a plurality of lower phase signals is determined to be state 7. Step (1) corresponds to the first operation.

(Step (2)) . . . Determination related to state 6

The logic states of the lower phase signal xCK6 and the lower phase signal xCK4 are compared. If there is a thermometer code "10" at this position, the state of each of a plurality of lower phase signals is determined to be state 6. Step (2) corresponds to the first operation.

(Step (3)) . . . Determination related to state 5

The logic states of the lower phase signal xCK4 and the lower phase signal xCK2 are compared. If there is a thermometer code "10" at this position, the state of each of a plurality of lower phase signals is determined to be state 5. Step (3) corresponds to the first operation.

(Step (4)) . . . Determination related to state 4

The logic states of the lower phase signal CK6 and the lower phase signal xCK8 are compared. If there is a thermometer code "01" at this position, the state of each of a plurality of lower phase signals is determined to be state 4. Step (4) corresponds to the third operation.

(Step (5)) . . . Determination related to state 3

The logic states of the lower phase signal xCK8 and the lower phase signal xCK6 are compared. If there is a thermometer code "01" at this position, the state of each of a plurality of lower phase signals is determined to be state 3. Step (5) corresponds to the second operation.

(Step (6)) . . . Determination related to state 2

The logic states of the lower phase signal xCK6 and the lower phase signal xCK4 are compared. If there is a thermometer code "01" at this position, the state of each of a plurality of lower phase signals is determined to be state 2. Step (6) corresponds to the second operation.

(Step (7)) . . . Determination related to state 1

The logic states of the lower phase signal xCK4 and the lower phase signal xCK2 are compared. If there is a thermometer code "01" at this position, the state of each of a plurality of lower phase signals is determined to be state 1. Step (7) corresponds to the second operation.

Steps (1) to (3) and steps (5) to (7) in the sixth embodiment are the same as those in the fourth embodiment. Step (4) in the sixth embodiment is different from step (4) in the fourth embodiment. In steps (1) to (7), if it is determined that the state of each of the plurality of lower phase signals is not any one of states 1 to 7, the state of each of the plurality of lower phase signals is state 0. Thus, no particular determination related to state 0 is necessary. When the encoding unit 106*f* detects the thermometer code, the control signals SW1_1 to SW4_1, the control signals SW1_2 to SW4_2, and the control signal xSW3_1 are controlled so that the above-described procedure is implemented.

Figure 29:
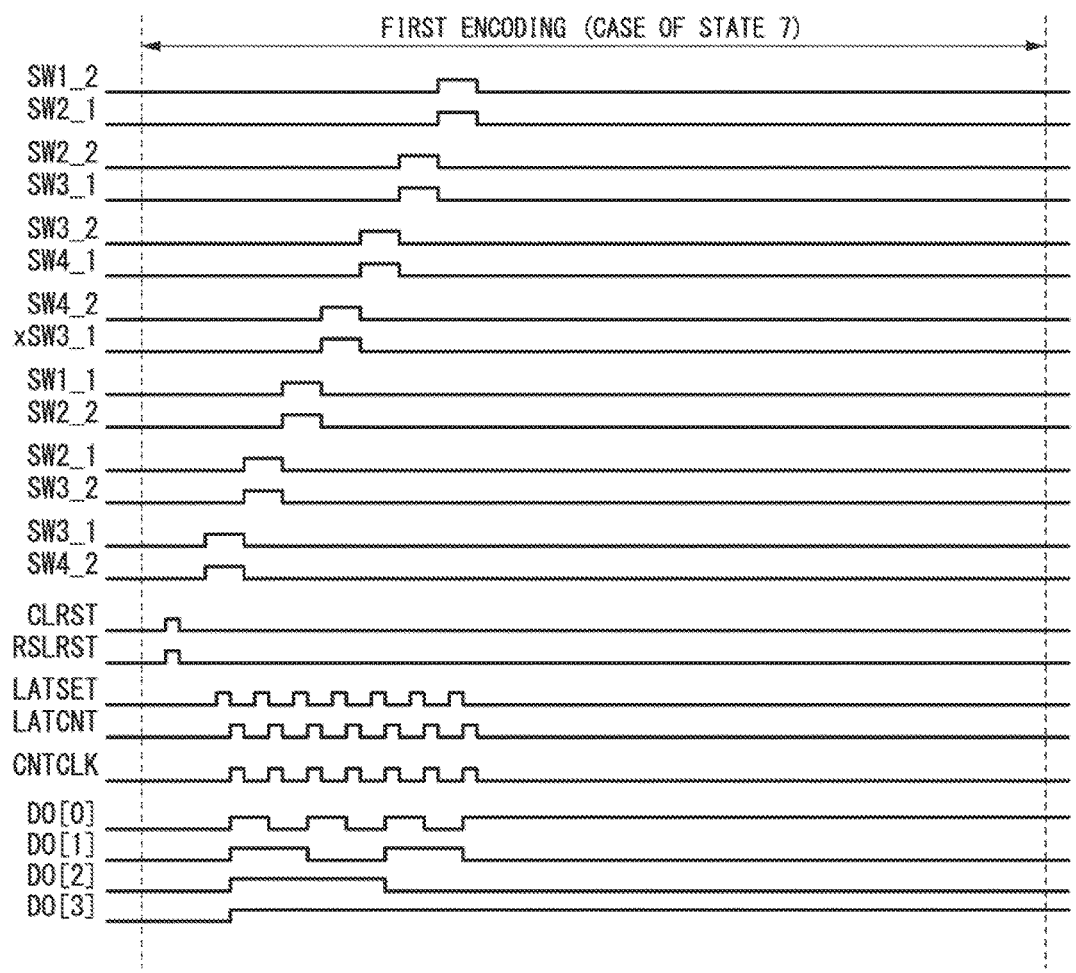
FIG. 29 is a timing chart showing an encoding procedure according to the sixth embodiment of the present invention.
Figure 30:
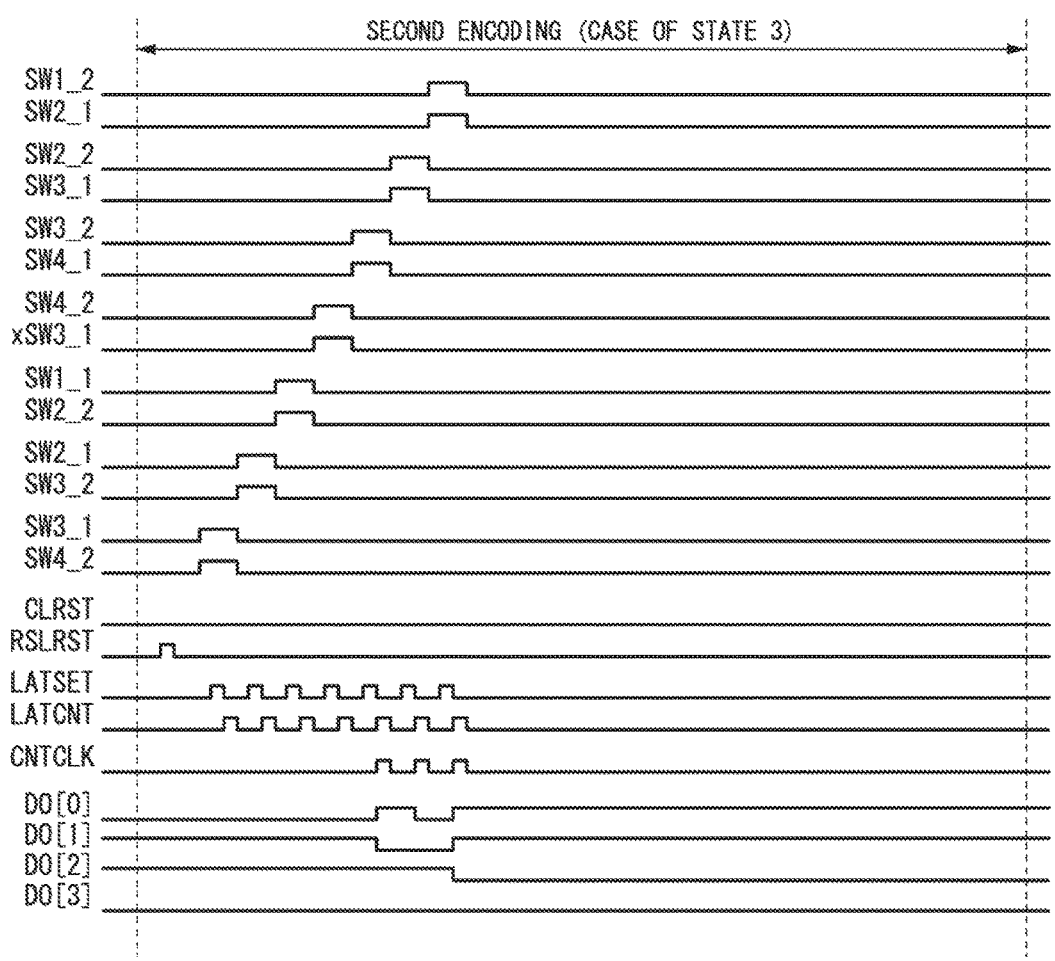
FIG. 30 is a timing chart showing an encoding procedure according to the sixth embodiment of the present invention.

FIGS. 29 and 30 show waveforms of encoding-related signals. In FIGS. 29 and 30, the horizontal direction indicates time and the vertical direction indicates voltage. An example in which first encoding which is the encoding of state 7 and second encoding which is the encoding of state 3 are performed continuously will be described. This example is applicable to the subtraction of the reset level and the signal level in the imaging device. In this example, a value of −4 is obtained by subtracting an encoded value of 7 corresponding to state 7 from an encoded value of 3 corresponding to state 3.

The outline of the operation will be described. A lower phase signal xCK* is output from any two of the latch circuits L_1 to L_4 by which the lower phase signals xCK2, xCK4, xCK6, and xCK8 are latched according to the control signals SW1_1 to SW4_1 and the control signals SW1_2 to SW4_2. * in the description of the sixth embodiment denotes an integer of 2, 4, 6, and 8. Also, the lower phase signal CK6 obtained by inverting the lower phase signal xCK6 is output from the latch circuit L_3 latching the lower phase signal xCK6 according to the control signal xSW3_1. The lower phase signal CK6 or the lower phase signal xCK* output from the two latch circuits is input to the encoding unit 106f. The encoding unit 106f detects the thermometer code on the basis of the input lower phase signal CK6 or the lower phase signal xCK*. In this example, the thermometer code is a logic state corresponding to an edge position changing from the H state to the L state and an edge position changing from the L state to the H state.

If a result of an AND operation on the lower phase signal xCK* output from one latch circuit L_* and a signal obtained by inverting the lower phase signal CK6 or the lower phase signal xCK* output from another latch circuit L_* indicates the H state, the thermometer code is detected. At the timing at which the thermometer code is detected, the generation of the lower count signal CNTCLK having a number of pulses according to the states of the lower phase signal CK6 and the lower phase signals xCK2, xCK4, xCK6, and xCK8 starts. At the same time, the counter circuit CN0 starts the counting of the lower count signal CNTCLK. Count values DO[0] to DO[2] of the counter circuit CN0 when the count operation is completed are encoding results.

Detailed operations in steps (1) to (7) will be described. At the timing at which the predetermined condition is satisfied, the logic state of the control signal CO from the comparing unit (not shown) changes. Thereby, the logic states of the lower phase signals xCK2, xCK4, xCK6, and xCK8 output from the clock generating unit 18d are latched by the latch unit 108f.

Subsequently, the first encoding shown in FIG. 29 starts. The RS latch RS0 is reset by the control signal RSLRST. At this time, the output signal of the RS latch RS0 is in the L state. Also, the counter circuit CN0 is reset by the control signal CLRST. At this time, the count value of the counter circuit CN0 is the initial value of the second encoding, i.e., 3′b[0]000. After the RS latch RS0 and the counter circuit CN0 are reset, the control signals SW0_1 to SW4_1, the control signals SW1_2 to SW4_2, and the control signal xSW3_1 change to the H state in a predetermined order.

(Step (1))

The control signal SW4_2 and the control signal SW3_1 change to the H state. Thereby, the lower phase signal xCK8 (H state) latched by the latch circuit L_4 and a signal obtained by inverting the lower phase signal xCK6 (L state) latched by the latch circuit L_3 are input to the AND circuit AND0. At this time, the output signal of the AND circuit AND0 is in the H state. The control signal LATSET changes from the L state to the H state and then changes to the L state. Meanwhile, the detection signal DET changes from the L state to the H state and then changes to the L state. Thereby, the output signal of the RS latch RS0 changes to the H state. The control signal LATCNT changes from the L state to the H state and then changes to the L state. Thereby, the AND circuit AND2 outputs a lower count signal CNTCLK of one pulse. The counter circuit CN0 performs a count operation on the basis of the lower count signal CNTCLK. Thus, the count value of the counter circuit CN0 decreases.

(Steps (2) and (3))

As the same in step (1), the lower phase signal xCK* output from one latch circuit L_* and a signal obtained by inverting the lower phase signal xCK* output from another latch circuit L_* are input to the AND circuit AND0. In both of steps (2) and (3), regardless of the output signal of the AND circuit AND0, the output signal of the RS latch RS0 is kept in the H state. The control signal LATCNT changes from the L state to the H state and then changes to the L state. Thereby, in each step, the AND circuit AND2 outputs a lower count signal CNTCLK of one pulse. The counter circuit CN0 performs a count operation on the basis of the lower count signal CNTCLK. Thus, the count value of the counter circuit CN0 decreases.

(Step (4))

The control signal xSW3_1 and the control signal SW4_2 change to the H state. Thereby, a signal obtained by inverting the lower phase signal CK6 (H state) corresponding to the lower phase signal xCK6 (L state) latched by the latch circuit L_3 and the lower phase signal xCK8 (H state) latched by the latch circuit L_4 are input to the AND circuit AND0. At this time, the lower phase signal CK6 is output from the inverting output terminal QB of the latch circuit L_3. At this time, regardless of the output signal of the AND circuit AND0, the output signal of the RS latch RS0 is kept in the H state. The control signal LATCNT changes from the L state to the H state and then changes to the L state. Thereby, in each step, the AND circuit AND2 outputs a lower count signal CNTCLK of one pulse. The counter circuit CN0 performs a count operation on the basis of the lower count signal CNTCLK. Thus, the count value of the counter circuit CN0 decreases.

(Step (5))

The control signal SW4_1 and the control signal SW3_2 change to the H state. Thereby, a signal obtained by inverting the lower phase signal xCK8 (H state) latched by the latch circuit L_4 and the lower phase signal xCK6 (L state) latched by the latch circuit L_3 are input to the AND circuit AND0. At this time, regardless of the output signal of the AND circuit AND0, the output signal of the RS latch RS0 is kept in the H state. The control signal LATCNT changes from the L state to the H state and then changes to the L state. Thereby, in each step, the AND circuit AND2 outputs a lower count signal CNTCLK of one pulse. The counter circuit CN0 performs a count operation on the basis of the lower count signal CNTCLK. Thus, the count value of the counter circuit CN0 decreases.

(Steps (6) and (7))

As the same in step (5), a signal obtained by inverting the lower phase signal xCK* output from one latch circuit L_* and the lower phase signal xCK* output from another latch circuit L_* are input to an AND circuit AND0. In both of steps (6) and (7), regardless of the output signal of the AND circuit AND0, the output signal of the RS latch RS0 is kept in the H state. The control signal LATCNT changes from the L state to the H state and then changes to the L state. Thereby, in each step, the AND circuit AND2 outputs a lower count signal CNTCLK of one pulse. The counter circuit CN0 performs a count operation on the basis of the lower count signal CNTCLK. Thus, the count value of the counter circuit CN0 decreases.

When the processing of step (7) is completed, the count value of the counter circuit CN0 is 3'b[1]001. This count value corresponds to −7. Upon completion of the processing of step (7), the first encoding shown in FIG. 29 is completed.

After the processing of step (7) is completed, the count value of the counter circuit CN0 is inverted. At this time, the count value of the counter circuit CN0 is 3'b[0]110. This count value corresponds to 6.

Subsequently, the second encoding shown in FIG. 30 starts. The RS latch RS0 is reset by the control signal RSLRST. The counter circuit CN0 is not reset by the control signal CLRST. At this time, the count value of the counter circuit CN0 is the initial value of the second encoding, i.e., 3'$b$[0] 110. After the RS latch RS0 is reset, the control signals SW1_1 to SW4_1, the control signals SW1_2 to SW4_2, and the control signal xSW3_1 change to the H state in a predetermined order.

(Step (1))

The control signal SW4_2 and the control signal SW3_1 change to the H state. Thereby, the lower phase signal xCK8 (L state) latched by the latch circuit L_4 and a signal obtained by inverting the lower phase signal xCK6 (H state) latched by the latch circuit L_3 are input to the AND circuit AND0. At this time, the output signal of the AND circuit AND0 is in the L state. The control signal LATSET changes from the L state to the H state and then changes to the L state. Meanwhile, the detection signal DET is kept in the L state. Thus, the output signal of the RS latch RS0 is kept in the L state. As a result, the lower count signal CNTCLK is in the L state. At this time, the count value of the counter circuit CN0 is the initial value of the second encoding.

(Steps (2) and (3))

As the same in step (1), the lower phase signal xCK* output from one latch circuit L_* and a signal obtained by inverting the lower phase signal xCK* output from another latch circuit L_* are input to an AND circuit AND0. In both of steps (2) and (3), the output signal of the AND circuit AND0 is kept in the L state. The control signal LATSET changes from the L state to the H state and then changes to the L state. Meanwhile, the detection signal DET is kept in the L state. Thus, the output signal of the RS latch RS0 is kept in the L state. As a result, the lower count signal CNTCLK is in the L state. At this time, the count value of the counter circuit CN0 is the initial value of the second encoding.

(Step (4))

The control signal xSW3_1 and the control signal SW4_2 change to the H state. Thereby, a signal obtained by inverting the lower phase signal CK6 (L state) corresponding to the lower phase signal xCK6 (H state) latched by the latch circuit L_3 and the lower phase signal xCK8 (L state) latched by the latch circuit L_4 are input to the AND circuit AND0. At this time, the lower phase signal CK6 is output from the inverting output terminal QB of the latch circuit L_3. At this time, the output signal of the AND circuit AND0 is in the L state. The control signal LATSET changes from the L state to the H state and then changes to the L state. Meanwhile, the detection signal DET is kept in the L state. Thus, the output signal of the RS latch RS0 is kept in the L state. As a result, the lower count signal CNTCLK is in the L state. At this time, the count value of the counter circuit CN0 is the initial value of the second encoding.

(Step (5))

The control signal SW4_1 and the control signal SW3_2 change to the H state. Thereby, the signal obtained by inverting the lower phase signal xCK8 (L state) latched by the latch circuit L_4 and the lower phase signal xCK6 (H state) latched by the latch circuit L_3 are input to the AND circuit AND0. At this time, the output signal of the AND circuit AND0 is in the H state. The control signal LATSET changes from the L state to the H state and then changes to the L state. Meanwhile, the detection signal DET changes from the L state to the H state and then changes to the L state. Thereby, the output signal of the RS latch RS0 changes to the H state. The control signal LATCNT changes from the L state to the H state and then changes to the L state. Thereby, the AND circuit AND2 outputs a lower count signal CNTCLK of one pulse. The counter circuit CN0 performs a count operation on the basis of the lower count signal CNTCLK. Thus, the count value of the counter circuit CN0 decreases.

(Steps (6) and (7))

As the same in step (5), a signal obtained by inverting the lower phase signal xCK* output from one latch circuit L_* and the lower phase signal xCK* output from another latch circuit L_* are input to the AND circuit AND0. In both of steps (6) and (7), regardless of the output signal of the AND circuit AND0, the output signal of the RS latch RS0 is kept in the H state. The control signal LATCNT changes from the L state to the H state and then changes to the L state. Thereby, in each step, the AND circuit AND2 outputs a lower count signal CNTCLK of one pulse. The counter circuit CN0 performs a count operation on the basis of the lower count signal CNTCLK. Thus, the count value of the counter circuit CN0 decreases.

When the processing of step (7) is completed, the count value of the counter circuit CN0 is 3'b[0]011. This count value corresponds to 3. When the processing of step (7) is completed, the second encoding shown in FIG. 30 is completed.

After the processing of step (7) is completed, the count value of the counter circuit CN0 is inverted. At this time, the count value of the counter circuit CN0 is 3'b[1]100. This count value corresponds to −4. That is, the value of −4 is obtained by subtracting an encoded value of 7 corresponding to state 7 from an encoded value of 3 corresponding to state 3.

In the sixth embodiment, the number of lower phase signals latched by the latch unit 108*f* is reduced. As a result, the circuit scale of the latch unit 108*f* can be reduced. For example, the circuit scale of the latch unit 108*f* is about half that of the latch unit 1108*b* shown in FIG. 39.

In the sixth embodiment, the encoding circuit 10*f* has the same advantages as the conventional encoding circuit. That is, even when the number of clocks generated by the clock generating unit 18*d* is large, the circuit scale of the encoding circuit 10*f* is small and the configuration of the encoding circuit 10*f* is simple.

(Seventh Embodiment)

Figure 31:
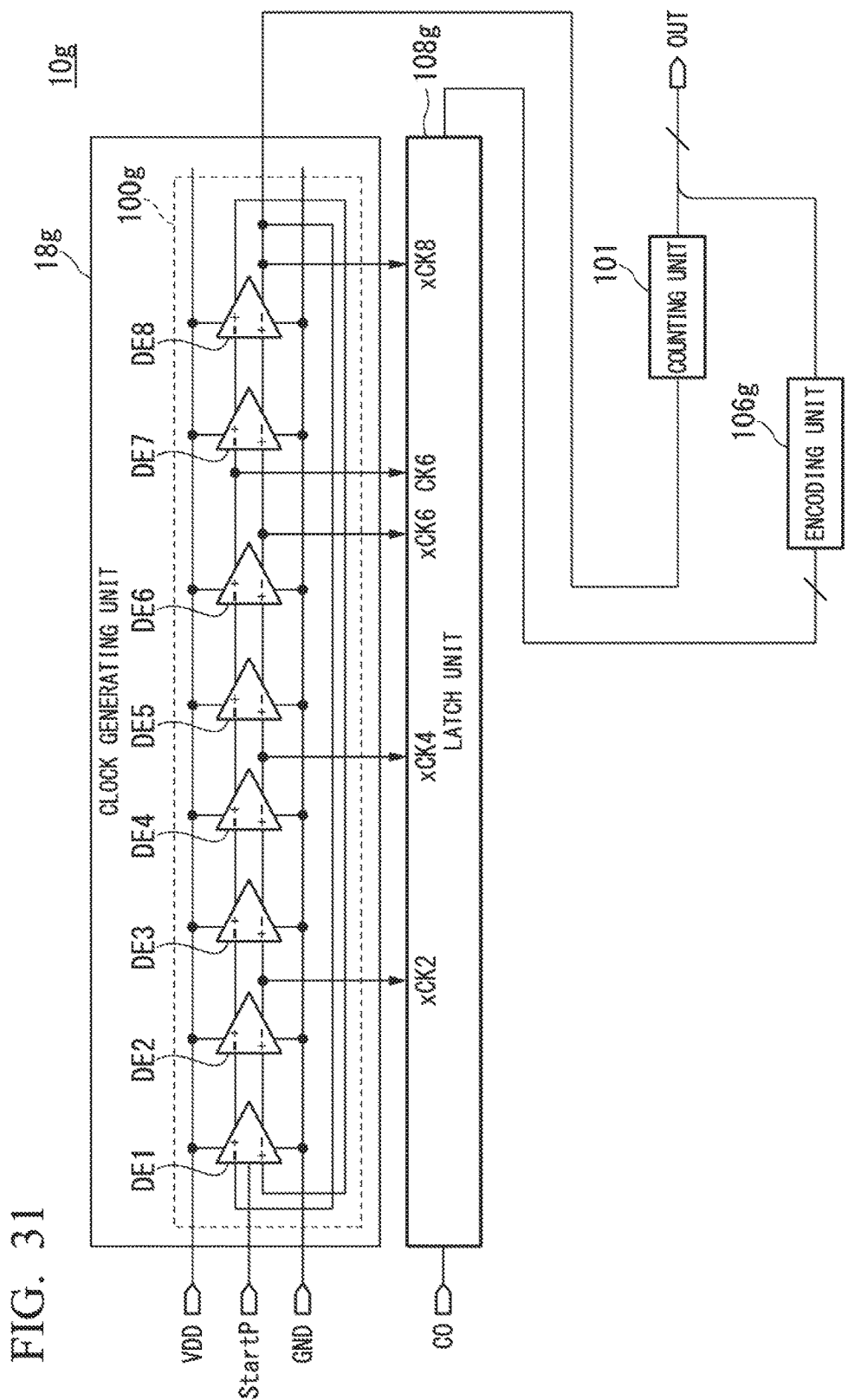
FIG. 31 is a block diagram showing a configuration of an encoding circuit according to a seventh embodiment of the present invention.

FIG. 31 shows a configuration of an encoding circuit 10*g* of the seventh embodiment of the present invention. As shown in FIG. 31, the encoding circuit 10*g* includes a clock generating unit 18*g*, a latch unit 108*g*, a counting unit 101, and an encoding unit 106*g*.

Differences of the configuration shown in FIG. 31 from the configuration shown in FIG. 21 will be described. The clock generating unit 18*g* includes a delay circuit 100*g* in which a plurality of fully-differential delay circuits DE1 to DE8 (delay units) are connected in a ring shape. The clock generating unit 18g outputs a plurality of lower phase signals (a lower phase signal CK6 and lower phase signals xCK2, xCK4, xCK6, and xCK8) according to the output signals of the plurality of fully-differential delay circuits DE1 to DE8.

The lower phase signal (delayed signal) generated by the clock generating unit 18g is the same as the lower phase signal generated by the clock generating unit 18a shown in FIG. 1. That is, the clock generating unit 18g generates the lower phase signals CK1 to CK8 and the lower phase signals xCK1 to xCK8. The clock generating unit 18g outputs only some of the plurality of generated lower phase signals (the lower phase signals CK1 to CK8 and the lower phase signals xCK1 to xCK8) for latching by the latch unit 108g. A process in which the clock generating unit 18g outputs the lower phase signal CK6 is different from the fourth embodiment.

In the seventh embodiment, the delay circuit 100g includes fully-differential delay circuits DE1, DE3, DE5, and DE7 which are a plurality of first delay units, fully-differential delay circuits DE2, DE4, and DE8 which are a plurality of second delay units, and a fully-differential delay circuit DE6 which is a third delay unit. The first delay units and the second delay units are arranged in pairs in the connection of the plurality of fully-differential delay circuits DE7, DE8, and DE1 to DE5. Each first delay unit is connected between two of the second delay units. Each second delay unit is connected between two of the first delay units. That is, the first delay units and the second delay units are alternately arranged in the connection of the plurality of fully-differential delay circuits DE7, DE8, and DE1 to DE5. The third delay unit is a delay unit different from the fully-differential delay circuit DE8 that outputs the lower phase signal xCK8 which is the reference signal (a count clock of the counting unit 101).

The clock generating unit 18g outputs the lower phase signals xCK2, xCK4, and xCK8 which are the plurality of second output signals generated by the plurality of second delay units. Also, the clock generating unit 18g outputs the lower phase signal CK6 which is the first output signal generated by the third delay unit and the lower phase signal xCK6 which is the second output signal generated by the third delay unit.

The latch unit 108g latches the plurality of lower phase signals (the lower phase signal CK6 and the lower phase signals xCK2, xCK4, xCK6, and xCK8) output from the clock generating unit 18g at the timing at which a control signal CO is input.

The encoding unit 106g encodes the states of the plurality of lower phase signals (the lower phase signal CK6 and the lower phase signals xCK2, xCK4, xCK6, and xCK8) latched by the latch unit 108g. Thereby, the encoding unit 106g obtains a binary number according to the states of the plurality of lower phase signals latched by the latch unit 108g. The configuration of the encoding unit 106g is different from the configuration of the encoding unit 106e shown in FIG. 21.

The encoding unit 106g encodes states of a plurality of lower phase signals by performing a first operation, a second operation, and a third operation. The signal group in the seventh embodiment is constituted of some of a plurality of lower phase signals latched by the latch unit 108g. Specifically, the signal group is constituted of lower phase signals other than the lower phase signal CK6 among the plurality of lower phase signals latched by the latch unit 108g. The first operation in the seventh embodiment is substantially the same as the first operation in the fourth embodiment. The second operation in the seventh embodiment is substantially the same as the second operation in the fourth embodiment.

In the third operation in the seventh embodiment, the encoding unit 106g detects that the logic states of the first lower phase signal (first signal) and the second lower phase signal (second signal) are different. The first lower phase signal is the lower phase signal xCK8 included in the signal group. The second lower phase signal is a lower phase signal CK6 not included in the signal group. Also, the second lower phase signal is a signal obtained by inverting the lower phase signal xCK6 different from the first lower phase signal. Also, the second lower phase signal is a signal latched by the latch unit 108g. The third operation is performed between the first operation and the second operation. Also, the third operation is performed after the second operation.

The configuration shown in FIG. 31 is substantially the same as that shown in FIG. 21 except for the above points.

Figure 32:
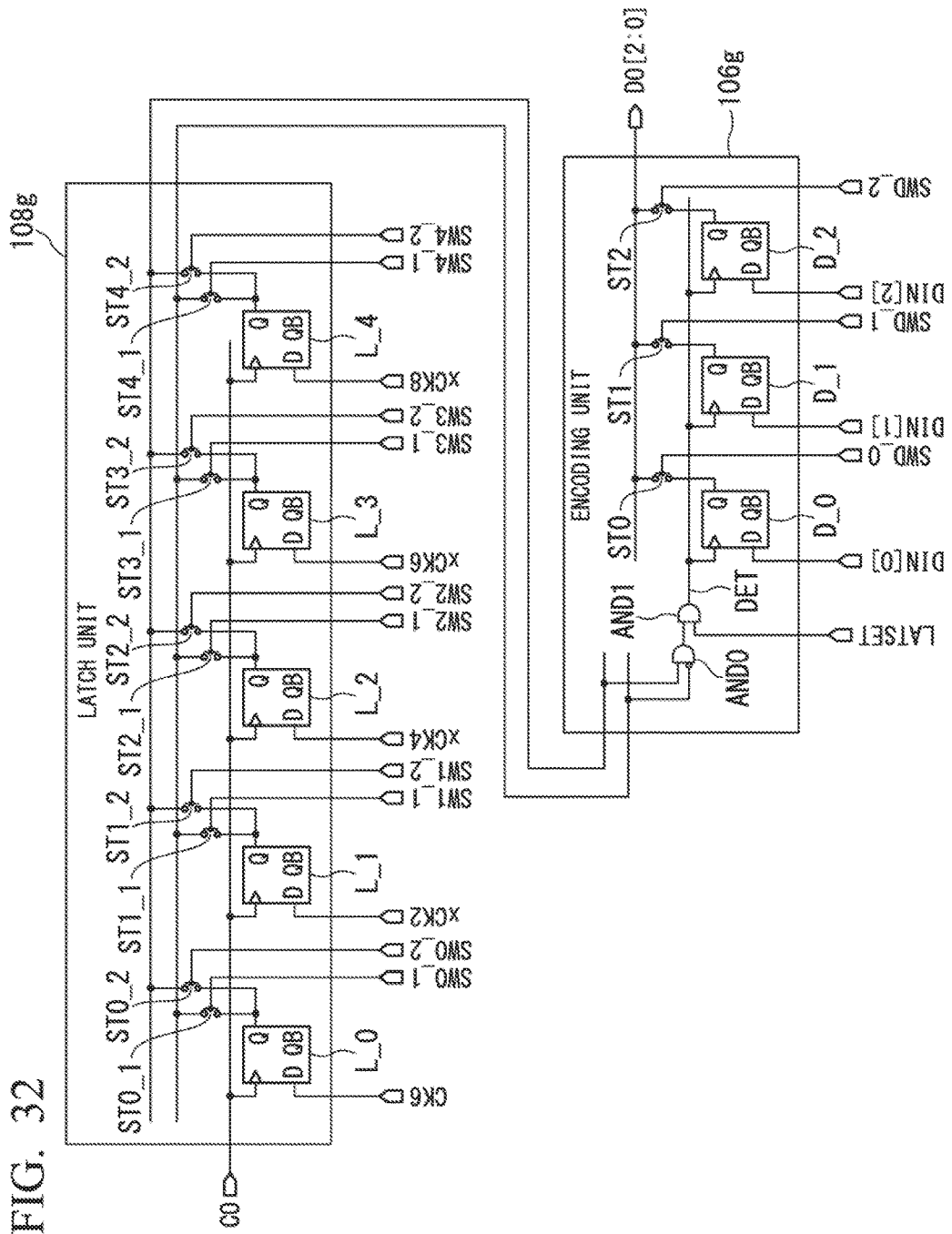
FIG. 32 is a block diagram showing configurations of a latch unit and an encoding unit according to the seventh embodiment of the present invention.

FIG. 32 shows the configurations of the latch unit 108g and the encoding unit 106g. Differences of the configuration shown in FIG. 32 from the configuration shown in FIG. 22 will be described.

The latch unit 108g includes a plurality of latch circuits L_0 to L_4, a plurality of switches ST0_1 to ST4_1, and a plurality of switches ST0_2 to ST4_2. The latch circuits L_0 to L_4 latch the states of a plurality of lower phase signals (the lower phase signal CK6 and the lower phase signals xCK2, xCK4, xCK6, and xCK8) at the timing at which the control signal CO from the comparing unit (not shown) is inverted. Control signals SW0_1 to SW4_1 and control signals SW0_2 to SW4_2 are signals for controlling the switches ST0_1 to ST4_1 and the switches ST0_2 to ST4_2 for outputting any one of the plurality of lower phase signals latched by the latch circuits L_0 to L_4 from the output terminals Q of the latch circuits L_0 to L_4 to the encoding unit 106g. In the latch unit 108g, the switch ST0_2 is added to the configuration of the latch unit 108e shown in FIG. 22. The lower phase signal CK6 output from the output terminal Q of the latch circuit L_0 is input to the second input terminal of the AND circuit AND0 via the switch ST0_2.

The encoding unit 106g includes AND circuits AND0 and AND1, encoding latch circuits D_0 to D_2, and switches ST0 to ST2. The lower phase signal output from any one of the latch circuits L_0 to L_4 and a signal obtained by inverting the lower phase signal output from any other one of the latch circuits L_0 to L_4 are input to the AND circuit AND0. The AND circuit AND0 performs an AND operation on the two input signals. The signal output from the AND circuit AND0 and the control signal LATSET are input to the AND circuit AND1. The AND circuit AND1 performs an AND operation on the two input signals. A detection signal DET indicating the result of the AND operation is output from the AND circuit AND1.

The latch circuits D_0 to D_2 latch encoded signals DIN[0] to DIN[2] at the timing according to the detection signal DET. The encoded signals DIN[0] to DIN[2] sequentially change according to the combination of the two signals input to the AND circuit AND0. The encoded signals DIN[0] to DIN[2] when a predetermined logic state is detected are latched as encoded values DO[0] to DO[2]. The encoded values DO[0] to DO[2] are output as 3-bit output signals DO[2:0]. The control signals SWD_0 to SWD_2 are signals for controlling the switches ST0 to ST2 for outputting the encoded values DO[0] to DO[2] from the latch circuits D_0 to D_2.

The configuration shown in FIG. 32 is substantially the same as that shown in FIG. 22 except for the above points.

Figure 33:
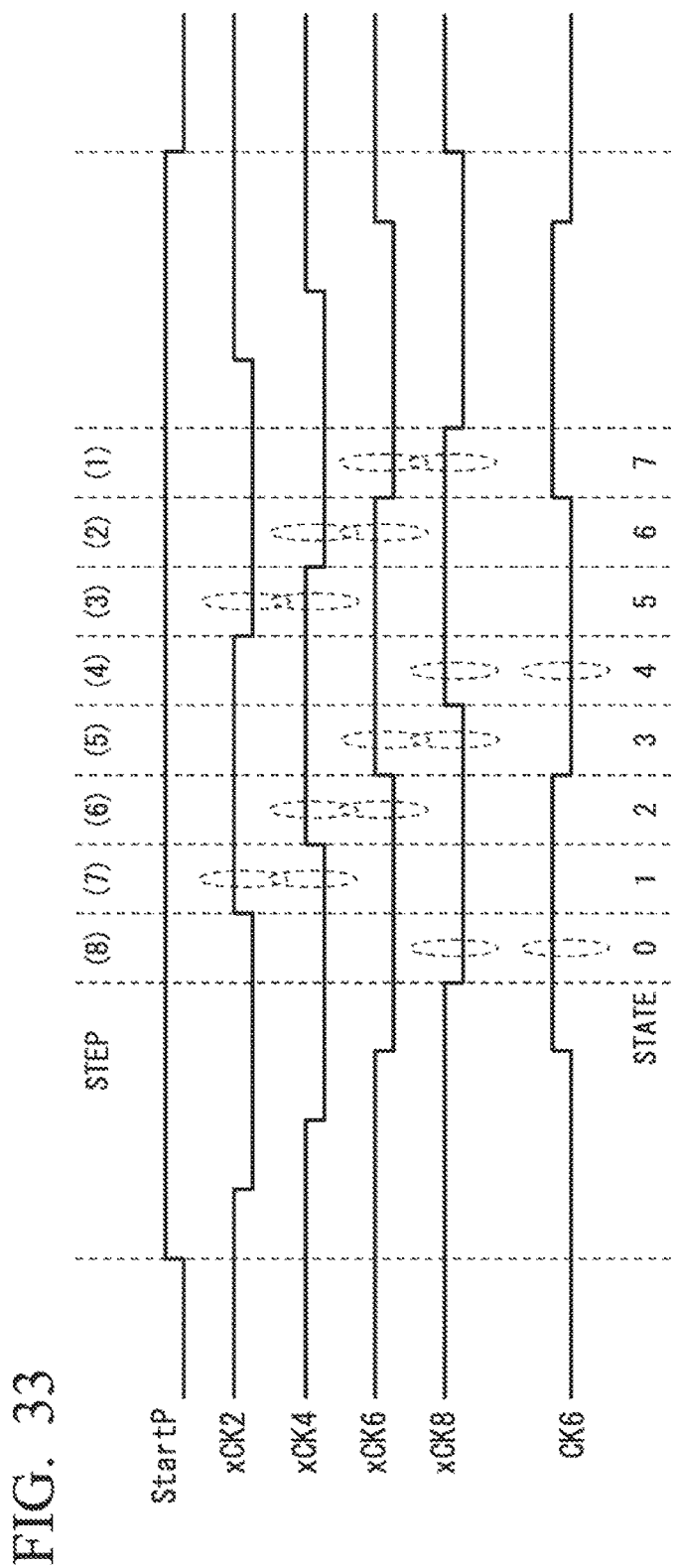
FIG. 33 is a timing chart showing an operation of the encoding circuit according to the seventh embodiment of the present invention.

A procedure of encoding by the encoding circuit 10g will be described. FIG. 33 shows the waveforms of the start pulse StartP, the lower phase signal CK6, and the lower phase signals xCK2, xCK4, xCK6, and xCK8 in the encoding circuit 10g. In FIG. 33, the horizontal direction indicates time and the vertical direction indicates voltage.

In FIG. 33, the lower phase signals xCK2, xCK4, xCK6, and xCK8 are arranged to constitute a group of signals falling (changing from the H state to the L state) sequentially. Specifically, the lower phase signals are arranged in the order of the lower phase signals xCK2, xCK4, xCK6, and xCK8. In this signal group, the plurality of lower phase signals are sequentially arranged in an order according to the order of connection of the plurality of fully-differential delay circuits DE2, DE4, DE6, and DE8 on the basis of the lower phase signal xCK8 which is the count clock of the counting unit 101. In the order of connection of the plurality of fully-differential delay circuits DE2, DE4. DE6, and DE8, the lower phase signals output from the preceding fully-differential delay circuits are arranged at preceding positions in the signal group.

Specifically, the lower phase signal xCK2 from the fully-differential delay circuit DE2 connected behind two fully-differential delay circuits from the fully-differential delay circuit DE8 that outputs the lower phase signal xCK8 is arranged at the head. Further, the lower phase signals output from the fully-differential delay circuits are arranged so that the order of the plurality of lower phase signals is the same as the order of connection of the fully-differential delay circuits DE2, DE4, DE6, and DE8. In addition to the plurality of lower phase signals constituting the signal group, the lower phase signal CK6 by the fully-differential delay circuit DE6 is arranged. The plurality of lower phase signals may be arranged to constitute a group of signals rising (changing from the L state to the H state) sequentially at predetermined time intervals. The lower phase signal CK2 or CK4 obtained by inverting the lower phase signal xCK2 or xCK4 having the falling edge between the falling edge of the lower phase signal CK2 and the falling edge of the lower phase signal xCK8 may be used instead of the lower phase signal CK6.

In the signal group (signal string) in which the plurality of lower phase signals latched by the latch unit 108g are arranged in the above-described order and the lower phase signal CK6, the logic states of two continuous lower phase signals are sequentially detected. If it is detected that the logic states of the two continuous lower phase signals are predetermined states (thermometer codes), the states of a plurality of lower phase signals are determined according to a position at which the states are detected.

For example, the logic states of two continuous lower phase signals are sequentially detected from the bottom to the top of the signal group shown in FIG. 33 and the lower phase signal CK6. In the case of states 5 to 7, in the signal group, the logic state changes from the H state to the L state between two continuous lower phase signals. In the case of state 4, the logic state changes from the L state to the H state between the lower phase signal CK6 not included in the signal group and the lower phase signal xCK8 included in the signal group. In the case of states 1 to 3, in the signal group, the logic state changes from the L state to the H state between two continuous lower phase signals. In state 0, the logic state changes from the H state to the L state between the lower phase signal CK6 not included in the signal group and the lower phase signal xCK8 included in the signal group.

Specifically, encoding is performed by performing the following processing of steps (1) to (8) in time series.

(Step (1)) . . . Determination related to state 7

The logic states of the lower phase signal xCK8 and the lower phase signal xCK6 are compared. If there is a thermometer code "10" at this position, the state of each of a plurality of lower phase signals is determined to be state 7. Step (1) corresponds to the first operation.

(Step (2)) . . . Determination related to state 6

The logic states of the lower phase signal xCK6 and the lower phase signal xCK4 are compared. If there is a thermometer code "10" at this position, the state of each of a plurality of lower phase signals is determined to be state 6. Step (2) corresponds to the first operation.

(Step (3)) . . . Determination related to state 5

The logic states of the lower phase signal xCK4 and the lower phase signal xCK2 are compared. If there is a thermometer code "10" at this position, the state of each of a plurality of lower phase signals is determined to be state 5. Step (3) corresponds to the first operation.

(Step (4)) . . . Determination related to state 4

The logic states of the lower phase signal CK6 and the lower phase signal xCK8 are compared. If there is a thermometer code "01" at this position, the state of each of a plurality of lower phase signals is determined to be state 4. Step (4) corresponds to the third operation.

(Step (5)) . . . Determination related to state 3

The logic states of the lower phase signal xCK8 and the lower phase signal xCK6 are compared. If there is a thermometer code "01" at this position, the state of each of a plurality of lower phase signals is determined to be state 3. Step (5) corresponds to the second operation.

(Step (6)) . . . Determination related to state 2

The logic states of the lower phase signal xCK6 and the lower phase signal xCK4 are compared. If there is a thermometer code "01" at this position, the state of each of a plurality of lower phase signals is determined to be state 2. Step (6) corresponds to the second operation.

(Step (7)) . . . Determination related to state 1

The logic states of the lower phase signal xCK4 and the lower phase signal xCK2 are compared. If there is a thermometer code "01" at this position, the state of each of a plurality of lower phase signals is determined to be state 1. Step (7) corresponds to the second operation.

(Step (8)) . . . Determination related to state 0

The logic states of the lower phase signal CK6 and the lower phase signal xCK2 are compared. If there is a thermometer code "10" at this position, the state of each of a plurality of lower phase signals is determined to be state 0. Step (8) corresponds to the third operation.

Steps (1) to (3) and steps (5) to (7) in the seventh embodiment are the same as the corresponding steps in the fourth embodiment. Step (4) in the seventh embodiment is different from step (4) in the fourth embodiment. When the encoding unit 106g detects the thermometer code, the control signals SW0_1 to SW4_1 and the control signals SW0_2 to SW4_2 are controlled so that the above procedure is implemented.

Figure 34:
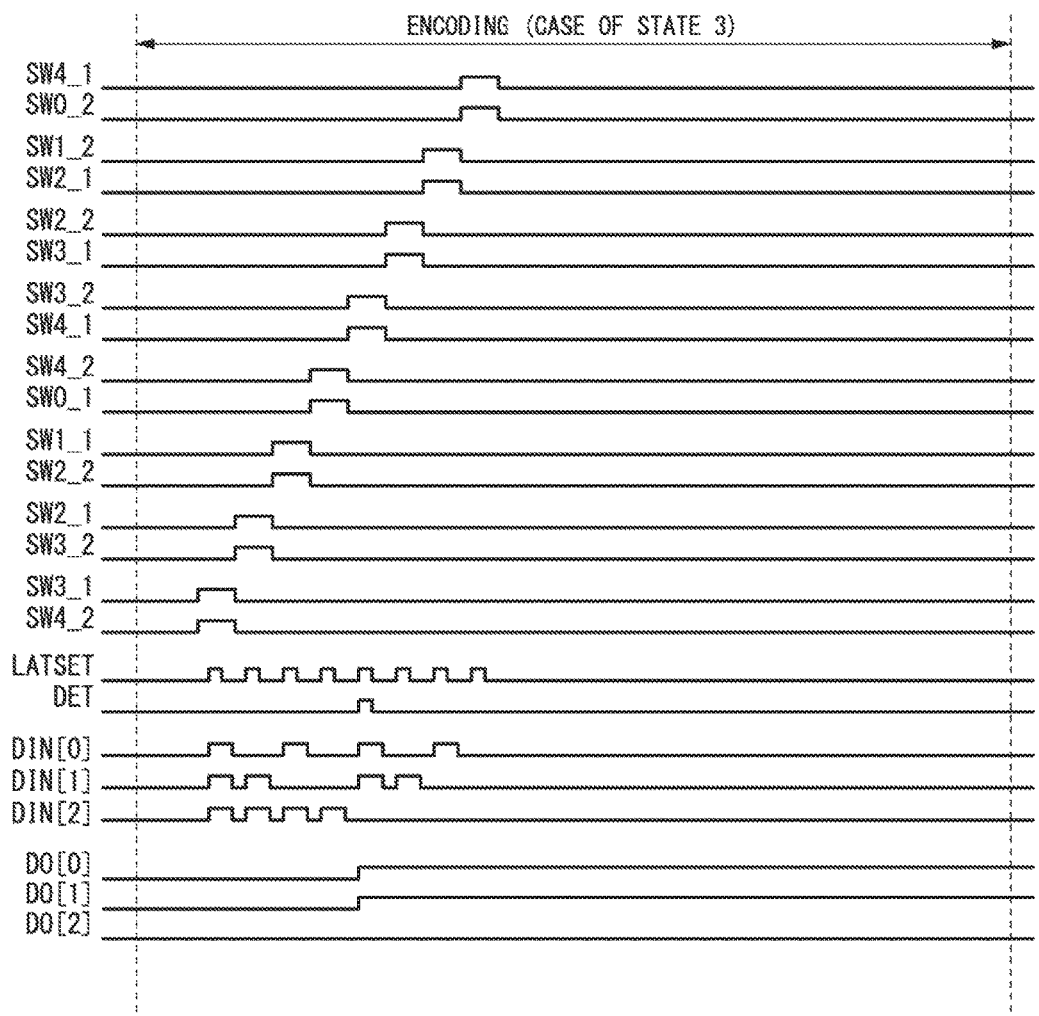
FIG. 34 is a timing chart showing an encoding procedure according to the seventh embodiment of the present invention.

FIG. 34 shows waveforms of encoding-related signals. In FIG. 34, the horizontal direction indicates time and the vertical direction indicates voltage. An example in which encoding of state 3 is performed will be described.

The outline of the operation will be described. A lower phase signal CK6 or a lower phase signal xCK* is output from any two of the latch circuits L_0 to L_4 by which the lower phase signal CK6 and the lower phase signals xCK2, xCK4, xCK6, and xCK8 are latched according to the control signals SW0_1 to SW4_1 and the control signals SW0_2 to SW4_2. * in the description of the seventh embodiment denotes an integer of 2, 4, 6, and 8. The lower phase signal CK6 or the lower phase signal xCK* output from the two latch circuits is input to the encoding unit 106g. The encoding unit 106g detects the thermometer code on the basis of the input lower phase signal CK6 or the lower phase signal xCK*. In this example, the thermometer code is a logic state corresponding to an edge position changing from the H state to the L state and an edge position changing from the L state to the H state.

If a result of an AND operation on the lower phase signal CK6 or the lower phase signal xCK* output from one latch circuit L_* and a signal obtained by inverting the lower phase signal CK6 or the lower phase signal xCK* output from another latch circuit L_* indicates the H state, the thermometer code is detected. Encoded signals DIN[0] to DIN[3] input to the encoding unit 106g when the thermometer code is detected are encoding results.

Detailed operations in steps (1) to (8) will be described. At the timing at which the predetermined condition is satisfied, the logic state of the control signal CO from the comparing unit (not shown) changes. Thereby, the logic states of the lower phase signal CK6 and the lower phase signals xCK2, xCK4, xCK6, and xCK8 output from the clock generating unit 18g are latched by the latch unit 108g.

Subsequently, the encoding shown in FIG. 34 starts. After the encoding starts, the control signals SW0_1 to SW4_1 and the control signals SW0_2 to SW4_2 change to the H state in a predetermined order.

(Step (1))

The control signal SW4_2 and the control signal SW3_1 change to the H state. Thereby, the lower phase signal xCK8 (L state) latched by the latch circuit L_4 and a signal obtained by inverting the lower phase signal xCK6 (H state) latched by the latch circuit L_3 are input to the AND circuit AND0. At this time, the output signal of the AND circuit AND0 is in the H state. The control signal LATSET changes from the L state to the H state and then changes to the L state. Meanwhile, the detection signal DET is kept in the L state. At this time, the encoded value latched by the latch circuits D_0 to D_2 is an initial value, i.e., 3'b000.

(Steps (2) and (3))

As the same in step (1), the lower phase signal xCK* output from one latch circuit L_* and a signal obtained by inverting the lower phase signal xCK* output from another latch circuit L_* are input to the AND circuit AND0. In both of steps (2) and (3), the output signal of the AND circuit AND0 is in the L state. The control signal LATSET changes from the L state to the H state and then changes to the L state. Meanwhile, the detection signal DET is kept in the L state. At this time, the encoded value latched by the latch circuits D_0 to D_2 is an initial value, i.e., 3'b000.

(Step (4))

The control signal SW0_1 and the control signal SW4_2 change to the H state. Thereby, the signal obtained by inverting the lower phase signal CK6 (L state) latched by the latch circuit L_0 and the lower phase signal xCK8 (L state) latched by the latch circuit L_4 are input to the AND circuit AND0. At this time, the output signal of the AND circuit AND0 is in the L state. The control signal LATSET changes from the L state to the H state and then changes to the L state. Meanwhile, the detection signal DET is kept in the L state. At this time, the encoded value latched by the latch circuits D_0 to D_2 is an initial value, i.e., 3'b000.

(Step (5))

The control signal SW4_1 and the control signal SW3_2 change to the H state. Thereby, a signal obtained by inverting the lower phase signal xCK8 (L state) latched by the latch circuit L_4 and the lower phase signal xCK6 (H state) latched by the latch circuit L_3 are input to the AND circuit AND0. At this time, the output signal of the AND circuit AND0 is in the H state. The control signal LATSET changes from the L state to the H state and then changes to the L state. Meanwhile, the detection signal DET changes from the L state to the H state and then changes to the L state. Thereby, the latch circuits D_0 to D_2 latch encoded signals DIN[0] to DIN[2]. At this time, the encoded value latched by the latch circuits D_0 to D_2 is 3'b011.

(Steps (6) and (7))

As the same in step (5), a signal obtained by inverting the lower phase signal xCK* output from one latch circuit L_* and the lower phase signal xCK* output from another latch circuit L_* are input to an AND circuit AND0. In both of steps (6) and (7), the output signal of the AND circuit AND0 is in the L state. The control signal LATSET changes from the L state to the H state and then changes to the L state. Meanwhile, the detection signal DET is kept in the L state. At this time, the encoded value latched by the latch circuits D_0 to D_2 is 3'b011.

(Step (8))

The control signal SW0_2 and the control signal SW4_1 change to the H state. Thereby, the lower phase signal CK6 (L state) latched by the latch circuit L_0 and a signal obtained by inverting the lower phase signal xCK8 (L state) latched by the latch circuit L_4 are input to the AND circuit AND0. At this time, the output signal of the AND circuit AND0 is in the L state. The control signal LATSET changes from the L state to the H state and then changes to the L state. Meanwhile, the detection signal DET is kept in the L state. At this time, the encoded value latched by the latch circuits D_0 to D_2 is 3'b011.

When the processing of step (8) is completed, the encoded value latched by the latch circuits D_0 to D_2 is 3'b011. This encoded value corresponds to 3. Upon completion of the processing of step (8), the encoding shown in FIG. 34 is completed.

In each of the first to sixth embodiments, the encoding unit 106g in the seventh embodiment may be used.

In the seventh embodiment, the number of lower phase signals latched by the latch unit 108g is reduced. As a result, the circuit scale of the latch unit 108g can be reduced. For example, the circuit scale of the latch unit 108g is about half that of the latch unit 1108b shown in FIG. 39.

In the seventh embodiment, the encoding circuit 10g has the same advantages as the conventional encoding circuit. That is, even when the number of clocks generated by the clock generating unit 18g is large, the circuit scale of the encoding circuit 10g is small and the configuration of the encoding circuit 10g is simple.

(Eighth Embodiment)

Figure 35:
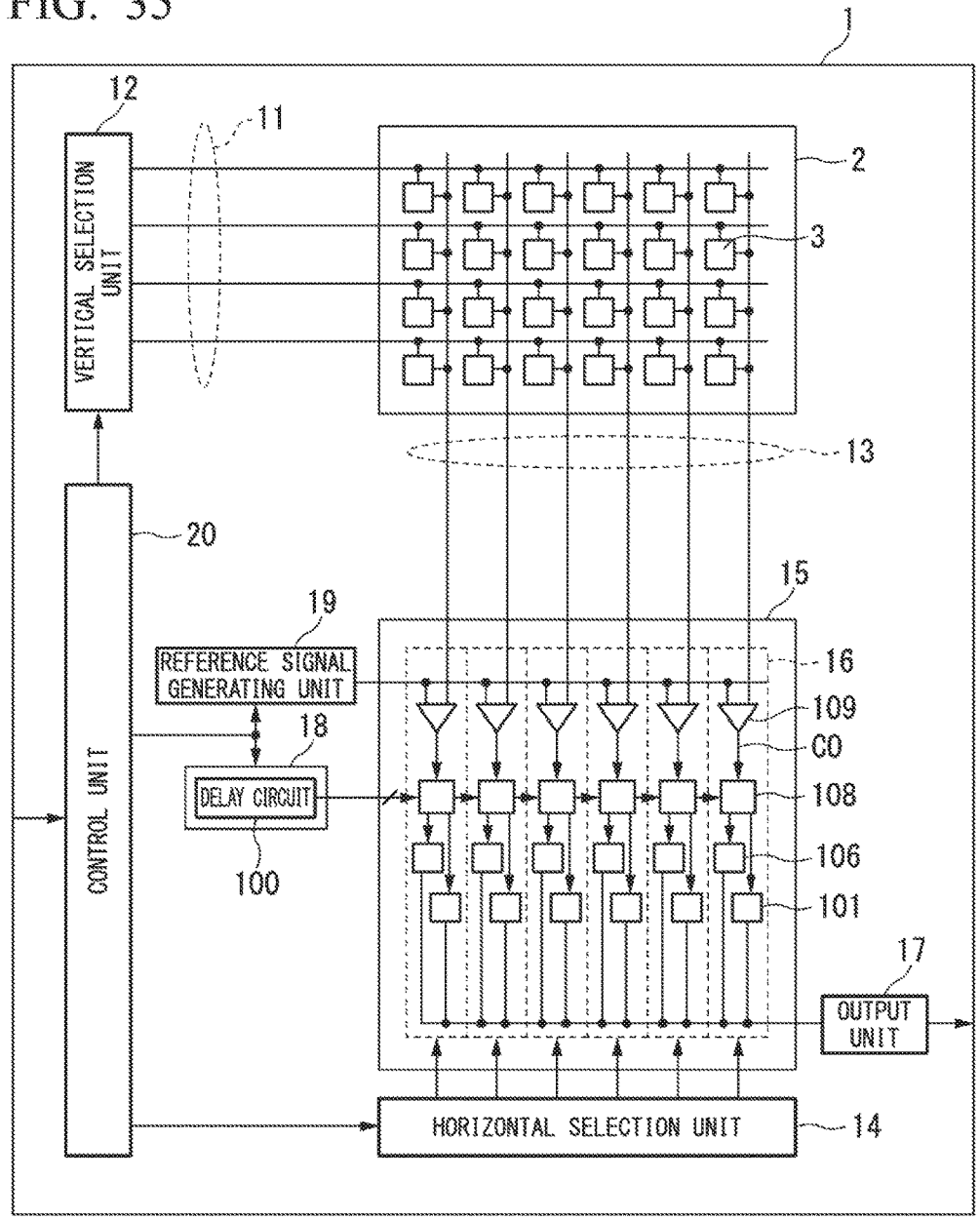
FIG. 35 is a block diagram showing a configuration of an imaging device according to an eighth embodiment of the present invention.

FIG. 35 shows a configuration of an imaging device 1 according to the eighth embodiment of the present invention. As shown in FIG. 35, the imaging device 1 includes an imaging unit 2, a vertical selection unit 12, a horizontal selection unit 14, a column processing unit 15, an output unit 17, a clock generating unit 18, a reference signal generating unit 19, and a control unit 20.

The imaging unit 2 has a plurality of unit pixels 3 arranged in a matrix. The unit pixel 3 generates a pixel signal according to an amount of incident electromagnetic waves. The unit pixel 3 outputs a pixel signal to the vertical signal line 13 provided for each column of an array of the plurality of unit pixels 3. The vertical selection unit 12 selects each row of the array of the plurality of unit pixels 3. The clock generating unit 18 generates a plurality of lower phase signals having phases different from each other. The reference signal generating unit 19 generates a reference signal (ramp wave) which increases or decreases with the passage of time. The column processing unit 15 performs AD conversion on the pixel signal output from the unit pixel 3. The horizontal selection unit 14 reads digital data obtained by the AD conversion to the horizontal signal line. The output unit 17 outputs the digital data read by the horizontal selection unit 14 to the circuit of the subsequent stage. The control unit 20 controls each unit.

In FIG. 35, for simplicity, the imaging unit 2 having 4 rows×6 columns of unit pixels 3 is shown. The number of rows and the number of columns of the array of the unit pixels 3 may be arbitrary natural numbers of 2 or more. In reality, several tens to several tens of thousands of unit pixels 3 are arranged in each row and each column of the imaging unit 2. The unit pixel 3 includes a photoelectric conversion element such as a photodiode/photogate/phototransistor and a transistor circuit.

Each unit will be described in more detail below. In the imaging unit 2, the unit pixels 3 are two-dimensionally arranged in 4 rows and 6 columns. Also, the row control line 11 is wired for each row of the array of the plurality of unit pixels 3. One end of each row control line 11 is connected to an output corresponding to one row in the vertical selection unit 12. The vertical selection unit 12 has a shift register, a decoder, or the like. Upon driving of the unit pixel 3 of the imaging unit 2, the vertical selection unit 12 controls the row addressing and row scanning of the imaging unit 2 via the row control line 11. The vertical signal line 13 is arranged for each column of the array of the plurality of unit pixels 3.

The column processing unit 15 has a plurality of column AD conversion units 16. For example, the plurality of column AD conversion units 16 are arranged for each column of the array of the plurality of unit pixels 3, i.e., for each vertical signal line 13. The column AD conversion unit 16 converts an analog pixel signal read from each unit pixel 3 of the imaging unit 2 via the vertical signal line 13 for each column of a plurality of unit pixels 3 into digital data. In this example, one column AD conversion unit 16 is arranged for each column of the array of the plurality of unit pixels 3. This is an example, and the correspondence relationship between the array of the plurality of unit pixels 3 and the column AD conversion units 16 is not limited to this relationship. For example, one column AD conversion unit 16 is arranged for a plurality of columns of an array of a plurality of unit pixels 3 and the one column AD conversion unit 16 can also be used in time division among a plurality of columns. The column AD conversion unit 16, the clock generating unit 18, and the reference signal generating unit 19 constitute an analog-to-digital conversion means (an AD conversion circuit) which converts analog pixel signals read from the unit pixels 3 of the selected row into digital pixel data.

The clock generating unit 18 includes a delay circuit 100. The delay circuit 100 is, for example, the delay circuit 100a or the like shown in FIG. 1.

For example, the reference signal generating unit 19 includes an integration circuit. Under the control of the control unit 20, the reference signal generating unit 19 generates a reference signal whose level gradually changes according to the passage of time, i.e., a so-called ramp wave.

The reference signal generating unit 19 supplies the reference signal to the column AD conversion unit 16 of the column processing unit 15 via the reference signal line. The reference signal generating unit 19 is not limited to a circuit using the integration circuit. A digital-to-analog conversion (DAC) circuit may be used for the reference signal generating unit 19. If a ramp wave is digitally generated using the DAC circuit, it is desirable that the ramp wave have finer steps or the ramp wave have the same characteristics.

The horizontal selection unit 14 includes a shift register, a decoder, or the like. The horizontal selection unit 14 controls the column addressing and column scanning of the column AD conversion unit 16 of the column processing unit 15. According to control by the horizontal selection unit 14, digital data obtained through AD conversion performed by the column AD conversion unit 16 is sequentially read to the output unit 17 via the horizontal signal line.

The control unit 20 has a functional block of a TG (=timing generator) and a functional block for communicating with this TG. The TG supplies pulses signals for indicating predetermined timings or clocks necessary for operations of the units such as the vertical selection unit 12, the clock generating unit 18, the reference signal generating unit 19, the horizontal selection unit 14, the column processing unit 15, and the output unit 17.

The output unit 17 outputs binary digital data. The output unit 17 has a buffering function. The output unit 17 may incorporate signal processing functions such as black level adjustment, column variation correction, color processing, and the like. Further, the output unit 17 may convert n-bit parallel digital data into serial data and output the serial data.

Next, the configuration of the column AD conversion unit 16 will be described. The column AD conversion unit 16 compares an analog pixel signal read from the unit pixel 3 with a reference signal from the reference signal generating unit 19, so that a pulse signal having a magnitude (pulse width) in the time axis direction corresponding to the magnitude of the pixel signal is generated. The column AD conversion unit 16 performs AD conversion by generating digital data corresponding to a period of the pulse width of the pulse signal.

The configuration of the column AD conversion unit 16 will be described in detail. The column AD conversion unit 16 is arranged for each column of the array of a plurality of unit pixels 3. In FIG. 35, six column AD conversion units 16 are arranged. The column AD conversion units 16 of the columns are identical. As shown in FIG. 35, the column AD conversion unit 16 includes a counting unit 101, an encoding unit 106, a latch unit 108, and a comparing unit 109. The comparing unit 109, the latch unit 108, the encoding unit 106, and the counting unit 101 are arranged for each column of the array of the plurality of unit pixels 3. The comparing unit 109, the latch unit 108, the encoding unit 106, and the counting unit 101 may be arranged for every other two or more columns of the array of the plurality of unit pixels 3. The clock generating unit 18, the counting unit 101, the encoding unit 106, and the latch unit 108 correspond to the encoding circuit of any one of the first to seventh embodiments.

The comparing unit 109 compares a signal voltage according to an analog pixel signal output from the unit pixel 3 of the imaging unit 2 via the vertical signal line 13 with a ramp voltage of a reference signal supplied from the reference signal generating unit 19. Thereby, the comparing unit 109 converts a magnitude of the pixel signal into information of the time axis direction (a pulse width of the pulse signal). A control signal CO output from the comparing unit 109 is, for example, a High level (H level) when the ramp voltage is higher than the signal voltage and is a Low level (L level) when the ramp voltage is lower than or equal to the signal voltage. That is, the comparing unit 109 performs a comparison process of comparing the analog signal to be subjected to AD conversion with the reference signal. The comparing unit 109 ends the comparison process at the timing at which the reference signal satisfies a predetermined condition for the analog signal and outputs the control signal CO at the timing.

The latch unit 108 latches plurality of lower phase signals output from the clock generating unit 18 at the timing at which the control signal CO is input. The latch unit 108 is, for example, the latch unit 108a shown in FIG. 1.

The encoding unit 106 encodes the states of the plurality of lower phase signals latched by the latch unit 108. Thereby, the encoding unit 106 obtains a binary number according to the states of the plurality of lower phase signals latched by the latch unit 108. The encoding unit 106 is the encoding unit 106a shown in FIG. 1 or the like.

The counting unit 101 performs a count operation on the basis of any one of the plurality of lower phase signals. Thereby, higher bit data (higher data) constituting the digital data is obtained. For example, the counting unit 101 is a counter circuit having a latch function for latching a count value. The column AD conversion unit 16 may not have the counting unit 101.

Next, the operation of this example will be described. Here, description of the specific operation of the unit pixel 3 will be omitted. As is well known, the reset level and the signal level are output in the unit pixel 3.

The AD conversion is performed as follows. For example, voltages of a reference signal falling with a predetermined inclination and a pixel signal are compared. A length of a period from the timing at which this comparison starts to the timing at which the voltage of the reference signal (ramp voltage) matches the voltage of the pixel signal is measured. This measurement is according to the count value of the counting unit 101 and the logic states of the plurality of lower phase signals latched by the latch unit 108. Thereby, digital data corresponding to the magnitude of the pixel signal is obtained.

In the present example, the above-described AD conversion is performed on each of the reset level and the signal level read from the unit pixel 3. Specifically, the reset level including the noise of the pixel signal is read from the unit pixel 3 of the selected row and AD conversion is performed in the first read operation. Subsequently, the signal level according to the electromagnetic wave incident on the unit pixel 3 is read and AD conversion is performed in the second read operation. In subtraction (a CDS process) between the reset level and the signal level, digital data corresponding to a signal component is obtained. The signal level may be read and subjected to AD conversion in the first read operation and the reset level may be read and subjected to AD conversion in the subsequent second read operation. Also, it is unnecessary to limit the present invention thereto.

(First Read)

After the pixel signal (reset level) output from the unit pixel 3 of an arbitrary row in the array of the plurality of unit pixels 3 to the vertical signal line 13 is stabilized, the control unit 20 supplies the reference signal generating unit 19 with control data for signal generation. Thereby, the reference signal generating unit 19 outputs a reference signal having a waveform generally variant with time in a ramp shape. The reference signal is applied to a first input terminal of the comparing unit 109. The pixel signal is applied to a second input terminal of the comparing unit 109. The comparing unit 109 compares the reference signal with the pixel signal. Also, the counting unit 101 performs a count operation using a lower phase signal xCK8 from the clock generating unit 18 as a count clock.

The comparing unit 109 inverts the control signal CO when the voltages of the pixel signal and the reference signal supplied from the reference signal generating unit 19 substantially coincide. At this time, the latch unit 108 latches the logic states of the plurality of lower phase signals from the clock generating unit 18. At the same time, the counting unit 101 latches the count value. Thereby, digital data according to the reset level can be obtained. When a predetermined period has elapsed, the control unit 20 stops the supply of the control data to the reference signal generating unit 19 and the output of the phase signal from the clock generating unit 18. Thereby, the reference signal generating unit 19 stops the generation of the reference signal.

(Second Read)

After the pixel signal (signal level) output from the unit pixel 3 in an arbitrary row in the array of the plurality of unit pixels 3 to the vertical signal line 13 is stabilized, the control unit 20 supplies the reference signal generating unit 19 with control data for signal generation. Thereby, the reference signal generating unit 19 outputs a reference signal having a waveform generally variant with time in a ramp shape. The reference signal is applied to the first input terminal of the comparing unit 109. The pixel signal is applied to the second input terminal of the comparing unit 109. The comparing unit 109 compares the reference signal with the pixel signal. Also, the counting unit 101 performs a count operation using a lower phase signal xCK8 from the clock generating unit 18 as a count clock.

The comparing unit 109 inverts the control signal CO when the voltages of the pixel signal and the reference signal supplied from the reference signal generating unit 19 substantially coincide. At this time, the latch unit 108 latches the logic states of the plurality of lower phase signals from the clock generating unit 18. At the same time, the counting unit 101 latches the count value. Thereby, digital data corresponding to the signal level can be obtained. When the predetermined period has elapsed, the control unit 20 stops the supply of the control data to the reference signal generating unit 19 and the output of the phase signal from the clock generating unit 18. Thereby, the reference signal generating unit 19 stops the generation of the reference signal.

The digital data according to the reset level and the digital data according to the signal level are transferred to the output unit 17 via the horizontal signal line by the horizontal selection unit 14. The output unit 17 performs subtraction (a CDS process) according to the digital data, thereby obtaining digital data of a signal component. The output unit 17 may be embedded in the column processing unit 15.

In the imaging device 1, the vertical selection unit 12, the horizontal selection unit 14, the output unit 17, and the control unit 20 are not characteristic components of the tdc SS type AD conversion circuit. Thus, the AD conversion circuit and the imaging device of the present invention may not have components corresponding to the vertical selection unit 12, the horizontal selection unit 14, the output unit 17, and the control unit 20.

According to the eighth embodiment, AD conversion circuits (the column AD conversion unit 16, the clock generating unit 18, and the reference signal generating unit 19) to which the configurations of the first to seventh embodiments can be applied are configured. Therefore, the circuit scale of the AD conversion circuit can be reduced.

According to the eighth embodiment, the imaging device 1 to which the configurations of the first to seventh embodiments can be applied is configured. Therefore, the circuit scale of the imaging device 1 can be reduced. As a result, the imaging device 1 is downsized. Also, the image quality of the image obtained by the imaging device 1 is improved.

(Ninth Embodiment)

Figure 36:
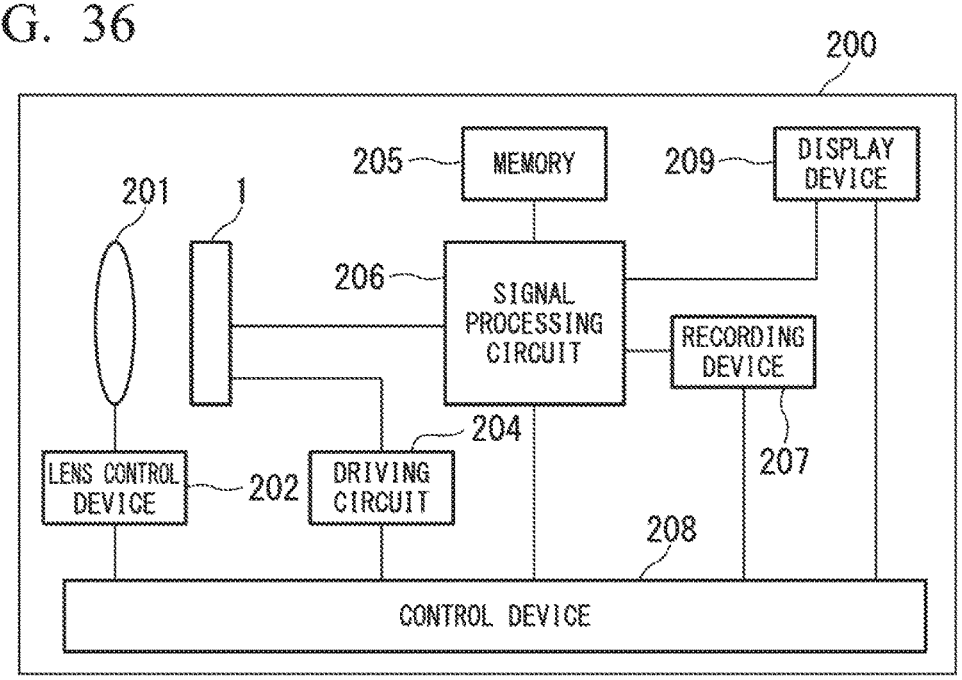
FIG. 36 is a block diagram showing a configuration of a digital camera according to a ninth embodiment of the present invention.

FIG. 36 shows a configuration of a digital camera 200 which is an example of an imaging system to which the imaging device 1 of the eighth embodiment is applied. The imaging system may be any electronic device having an imaging function. For example, the imaging system may be a digital video camera or an endoscope. As shown in FIG. 36, the digital camera 200 includes an imaging device 1, a lens unit 201, a lens control device 202, a driving circuit 204, a memory 205, a signal processing circuit 206, a recording device 207, a control device 208, and a display device 209.

The lens unit 201 includes a zoom lens and a focus lens. The lens unit 201 forms a subject image according to light from a subject on a light receiving surface of the imaging device 1. The lens control device 202 controls zoom, focus, an aperture, and the like of the lens unit 201. An image of light acquired via the lens unit 201 is formed on the light receiving surface of the imaging device 1. The imaging device 1 converts a subject image formed on the light receiving surface into digital data, i.e., image data, and outputs the image data.

The driving circuit 204 drives the imaging device 1 and controls its operation. The memory 205 temporarily stores image data. The signal processing circuit 206 performs a predetermined process on the image data output from the imaging device 1. The process performed by the signal processing circuit 206 includes various corrections of image data, compression of image data, and the like.

The recording device 207 has a semiconductor memory and the like for recording or reading image data. The recording device 207 can be attached to and detached from the digital camera 200. The display device 209 performs display of a moving image (live view image), display of a still image, display of the state of the digital camera 200, and the like.

The control device 208 controls the entire digital camera 200. The operation of the control device 208 is defined in a program stored in a read only memory (ROM) embedded in the digital camera 200. The control device 208 reads this program and performs various types of control according to content defined by the program.

In the digital camera 200, the configuration other than the imaging device 1 is not related to the tdc SS type AD conversion circuit. Thus, the imaging system of the present invention may not have components corresponding to the configuration other than the imaging device 1.

According to the ninth embodiment, an imaging system (the digital camera 200) having the imaging device 1 of the eighth embodiment is configured. Therefore, the circuit scale of the imaging system can be reduced. As a result, the size of the imaging system is reduced. Also, the image quality of the image obtained by the imaging system is improved.

While embodiments of the present invention have been described above in detail with reference to the drawings, specific configurations are not limited to the above embodiments and design changes and the like are also included without departing from the scope and spirit of the present invention.

The embodiments of the invention have been described above with reference to the drawings, but specific structures of the invention are not limited to the embodiments and may include various modifications without departing from the scope of the invention. The invention is not limited to the above-mentioned embodiments and is limited only by the accompanying claims.

What is claimed is:

1. An encoding circuit comprising:
a clock generating unit having a delay circuit in which n (n is a power of 2 which is greater than or equal to 2) delay units are connected together, each of the n delay units generating an output signal by delaying an input signal, and the clock generating unit being configured to output a plurality of delayed signals according to a plurality of the output signals generated by the n delay units;
a latch unit configured to latch the plurality of delayed signals at a timing at which a control signal is input; and
an encoding unit configured to encode state of each of the plurality of delayed signals latched by the latch unit,
wherein the encoding unit encodes the state of each of the plurality of delayed signals by performing:
a first operation of detecting a position at which logic states of two or more delayed signals included in a signal group change from High to Low, the signal group being configured by at least two of the plurality of delayed signals latched by the latch unit and all the delayed signals included in the signal group being arranged in an order according to an order of connection of the plurality of delay units,
a second operation of detecting a position at which logic states of two or more delayed signals included in the signal group change from Low to High, and
a third operation of detecting that logic states of two or more signals including at least one delayed signal included in the signal group are predetermined states, the third operation being different from the first operation and the second operation
wherein the delay circuit is configured by alternately arranging a plurality of first delay units and a plurality of second delay units, both the plurality of first delay units and the plurality of second delay units being fully-differential delay circuits, and
wherein the latch unit is configured to latch a first output signal output from a first output terminal of each of the plurality of first delay units and a second output signal output from a second output terminal of each of the plurality of second delay units, the first output terminal and the second output terminal having opposite polarity.

2. The encoding circuit according to claim 1,
wherein the third operation is an operation of determining whether logic states of a first signal and a second signal are different,
wherein the first signal is included in the signal group,
wherein the second signal is not included in the signal group, and
wherein the second signal is a signal obtained by inverting a delayed signal different form the first signal.

3. The encoding circuit according to claim 1, wherein the third operation is an operation of determining whether logic states of two continuous delayed signals included in the signal group are the same.

4. The encoding circuit according to claim 1, wherein the delay unit is an inverting delay unit configured to generate an output signal by inverting and delaying an input signal.

5. An analog-to-digital (AD) conversion circuit comprising:
- the encoding circuit according to claim 1;
- a reference signal generating unit configured to generate a reference signal that increases or decreases with passage of time;
- a comparing unit configured to perform a comparison process of comparing an analog signal to be subjected to AD conversion with the reference signal, complete the comparison process at a timing at which the reference signal satisfies a predetermined condition with respect to the analog signal, and output the control signal at the timing; and
- a counting unit configured to perform a count operation on the basis of any one of the plurality of delayed signals.

6. An imaging device comprising:
- the AD conversion circuit according to claim 5; and
- an imaging unit having a plurality of pixels arranged in a matrix, wherein the plurality of pixels output pixel signals,
- wherein the analog signal is a signal according to the pixel signal, and
- wherein the comparing unit, the latch unit, the encoding unit, and the counting unit are arranged for every column of an array of the plurality of pixels, or arranged for every other two or more columns of the array of the plurality of pixels.

* * * * *